(12) United States Patent
Tsuge

(10) Patent No.: US 6,392,281 B1
(45) Date of Patent: May 21, 2002

(54) FERROMAGNETIC TUNNEL JUNCTION DEVICE AND METHOD OF FORMING THE SAME

(75) Inventor: Hisanao Tsuge, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/536,698

(22) Filed: Mar. 28, 2000

Related U.S. Application Data

(62) Division of application No. 09/129,120, filed on Aug. 4, 1998, now Pat. No. 6,215,696.

(30) Foreign Application Priority Data

Aug. 4, 1997 (JP) .............................. 9-209292

(51) Int. Cl.$^7$ ........................... H01L 29/82; G11B 5/39
(52) U.S. Cl. ................... 257/421; 360/324.2
(58) Field of Search .................. 257/295, 421; 365/171, 173; 438/3, 622; 360/324.2

(56) References Cited

U.S. PATENT DOCUMENTS 5,390,061 A * 2/1995 Nakatani et al. ......... 360/324.2

FOREIGN PATENT DOCUMENTS

| JP | 6-21529 | | 1/1994 |
| JP | 9-106514 | * | 4/1997 |
| JP | 9-161232 | | 6/1997 |

OTHER PUBLICATIONS

J.S. Moodera et al., "Ferromagnetic–insulator–ferromagnetic tunneling: Spin–dependent tunneling and large magnetoresistance in trilayer junctions (invited)", pp. 4724–4729, Journal of Applied Physics, vol. 79, Part 2A, Apr. 15, 1996.

* cited by examiner

Primary Examiner—Howard Weiss
Assistant Examiner—Marcos D. Pizarro-Crespo
(74) Attorney, Agent, or Firm—Young & Thompson

(57) ABSTRACT

The invention provides a method of forming a tunnel barrier layer comprising at least a single oxide layered region in an intermediate layer sandwiched between first and second ferromagnetic layers. The method comprises the following steps. An electrically conductive layer is formed on the first ferromagnetic layer. The electrically conductive layer is subjected to an exactly pure oxygen gas prepared by having introduced oxygen into a vacuum, so as to cause a natural oxidation of the electrically conductive layer, thereby to form an oxide layer forming a tunnel barrier. The second ferromagnetic layer is formed on the oxide layer.

27 Claims, 74 Drawing Sheets

FERROMAGNETIC TUNNEL JUNCTION DEVICE AND METHOD OF FORMING THE SAME

CROSS-REFERENCE TO RELATED APPLICATIONS

This application is a division of application Ser. No. 09/129,120, filed Aug. 4, 1998, now U.S. Pat. No. 6,215,696 that issued Apr. 10, 2001.

BACKGROUND OF THE INVENTION

The present invention relates to a magnetoresistive device and more particularly to an improved ferromagnetic tunnel junction device and a method of forming the same.

The ferromagnetic tunnel junction device has a tunnel barrier layer which comprises a thin oxide layer of about a few nanometers in thickness which is sandwiched between two ferromagnetic layers. During application of a constant current between the two ferromagnetic layers, an external magnetic field is applied in a plane of the two ferromagnetic layers, whereby a magnetoresistance effect appears where a resistance is varied in accordance with a relative angle between magnetization directions of the two ferromagnetic layers. If the magnetization directions of the two ferromagnetic layers are parallel to each other, then the resistance value of the ferromagnetic tunnel junction device is minimum. If, however, the magnetization directions of the two ferromagnetic layers are anti-parallel to each other, then the resistance value of the ferromagnetic tunnel junction device is maximum. If a difference in coercive force is given to the two ferromagnetic layers, then it is possible to realize the parallel and anti-parallel state of the magnetization directions of the two ferromagnetic layers in accordance with the intensity of the externally applied magnetic field, for which reason it is possible to detect the magnetic field by detecting the variation in resistance of the ferromagnetic tunnel junction device.

In recent years, a ferromagnetic tunnel junction device could be obtained which exhibits about 20% rate of variation in magnetoresistance wherein a surface oxide film of Al is used as a tunnel barrier layer. For this reason, such the ferromagnetic tunnel junction device has become attractive for applications to the magnetic head and magnetic memory device. A giant magnetoresistive device is, for example, disclosed in Journal of Applied Physics, Vol. 79, pp. 4724–4729, 1996.

A method of forming the above conventional giant magnetoresistive device will be described with reference to FIGS. 1A through 1D.

With reference to FIG. 1A, by use of an evaporation mask, a first CoFe ferromagnetic layer 82 is selectively evaporated in a vacuum on a glass substrate 81.

With reference to FIG. 1B, the evaporation mask is replaced by a fresh evaporation mask before an Al layer 83 having a thickness in the range of 1.2 to 2.0 nanometers is selectively evaporated on the first CoFe ferromagnetic layer 82 and on the glass substrate 81 but only in an adjacent region to the first CoFe ferromagnetic layer 82.

With reference to FIG. 1C, a surface of the Al layer 83 is subjected to an oxygen glow discharge to oxidize the Al layer 83 into an alumina tunnel barrier layer 84.

With reference to FIG. 1D, a second Co ferromagnetic layer 85 is deposited over the alumina tunnel barrier layer 84 and the glass substrate 81, thereby to form a ferromagnetic tunnel junction device which exhibits a 18% maximum rate of variation in magnetoresistance.

The other ferromagnetic tunnel junction devices are disclosed, for example, in Japanese laid-open patent publications Nos. 5-63254, 6-244477, 8-70148, 8-70149 and 8-316548. Further, in Japan Applied Magnetic Vol. 21, pp. 493–496, 1997, it is disclosed that an Al layer is exposed to an atmosphere for oxidation to form an alumina tunnel barrier layer.

The conventional method of forming the ferromagnetic tunnel junction device has the following problems.

In order to apply the ferromagnetic tunnel junction device to the magnetic head or magnetic memory device, it is necessary to reduce an influence to sensitivity by thermal noises, for which reason a relatively low resistance is required even in a practical size. It is however difficult for the conventional method to realize those requirements.

Further, in order to apply the ferromagnetic tunnel junction device to the magnetic head responsible for the high density recording, a high signal output voltage is important. It is however, difficult for the prior art to obtain a sufficiently high current density without deterioration of any characteristic or property of the ferromagnetic tunnel junction device.

Furthermore, there are large variations in device characteristics and properties in a wafer or between lots. It is also difficult for the prior art to obtain a required high yield of manufacturing of the ferromagnetic tunnel junction device.

Those problems are considered due to the conventional method of forming the tunnel barrier layer. In the method of using the oxygen glow discharge, activated oxygen in states of ions and radicals is utilized for oxidation of the electrically conductive layer. For this reason, there is raised a problem with a difficulty in control of thickness of a thin oxide layer or control of a resistance of the device. A further problem is raised with a deterioration in junction quality due to contamination of the tunnel barrier layer by activated impurity gases.

In the meantime, the other method using the natural oxidation by exposing the conductive layer to the atmosphere has a problem with formation of pin holes in the tunnel barrier layer due to dusts in the atmosphere. Further, a problem is raised with a deterioration in junction quality due to contamination of the tunnel barrier layer by moisture, carbon dioxide, and nitrogen oxide.

In the above circumstances, it had been required to develop a novel method of forming a tunnel barrier layer sandwiched between first and second ferromagnetic layers free from the above problems.

SUMMARY OF THE INVENTION

Accordingly, it is an object of the present invention to provide a novel ferromagnetic tunnel junction device free from the above problems.

It is a further object of the present invention to provide a novel ferromagnetic tunnel junction device having a reduced resistance.

It is a still further object of the present invention to provide a novel ferromagnetic tunnel junction device exhibiting a high signal output voltage.

It is yet a further object of the present invention to provide a novel method of forming a ferromagnetic tunnel junction device free from the above problems.

It is a further more object of the present invention to provide a novel method of forming a ferromagnetic tunnel junction device having a reduced resistance.

It is still more object of the present invention to provide a novel method of forming a ferromagnetic tunnel junction device exhibiting a high signal output voltage.

It is moreover object of the present invention to provide a novel method of forming a ferromagnetic tunnel junction device to realize a high yield of manufacturing.

It is another object of the present invention to provide a novel method of forming a tunnel barrier layer sandwiched between first and second ferromagnetic layers in a ferromagnetic tunnel junction device free from the above problems.

It is still another object of the present invention to provide a novel method of forming a tunnel barrier layer sandwiched between first and second ferromagnetic layers in a ferromagnetic tunnel junction device having a reduced resistance.

It is yet another object of the present invention to provide a novel method of forming a tunnel barrier layer sandwiched between first and second ferromagnetic layers in a ferromagnetic tunnel junction device exhibiting a high signal output voltage.

It is further another object of the present invention to provide a novel method of forming a tunnel barrier layer sandwiched between first and second ferromagnetic layers in a ferromagnetic tunnel junction device to realize a high yield of manufacturing.

It is an additional object of the present invention to provide a novel high quality tunnel barrier layer sandwiched between first and second ferromagnetic layers in a ferromagnetic tunnel junction device free from the above problems.

It is a still additional object of the present invention to provide a novel high quality tunnel barrier layer sandwiched between first and second ferromagnetic layers in a ferromagnetic tunnel junction device having a reduced resistance.

It is yet an additional object of the present invention to provide a novel high quality tunnel barrier layer sandwiched between first and second ferromagnetic layers in a ferromagnetic tunnel junction device exhibiting a high signal output voltage.

It is a further additional object of the present invention to provide a novel high quality tunnel barrier layer sandwiched between first and second ferromagnetic layers in a ferromagnetic tunnel junction device to realize a high yield of manufacturing.

The first present invention provides an intermediate layer sandwiched between first and second ferromagnetic layers. The intermediate layer has at least a single oxide layered region forming at least a single tunnel barrier. The at least single oxide layered region has at least a first abrupt interface with the first ferromagnetic layer and a second abrupt interface with the second ferromagnetic layer, wherein each of the first and second interfaces has such an extremely high abruptness as a monoatomic layer level that a width of a boundary area between an oxygen atom containing region and an oxygen atom free region is substantially the same as a boundary between adjacent two monoatomic layers.

The second present invention provides a multi-layer structure in a ferromagnetic tunnel junction device. The multi-layer structure comprises: first and second ferromagnetic layers; and an intermediate layer sandwiched between the first and second ferromagnetic layers. The intermediate layer comprises an oxide layer which forms a single tunnel barrier. The oxide layer has a first abrupt interface with the first ferromagnetic layer and a second abrupt interface with the second ferromagnetic layer, wherein each of the first and second interfaces has such an extremely high abruptness as a monoatomic layer level that a width of a boundary area between an oxygen atom containing region and an oxygen atom free region is substantially the same as a boundary between adjacent two monoatomic layers.

The third present invention provides a multi-layer structure in a ferromagnetic tunnel junction device. The multi-layer structure comprises: first and second ferromagnetic layers; and an intermediate layer sandwiched between the first and second ferromagnetic layers. The intermediate layer comprises an electrically conductive intermediate layered region and first and second oxide layered regions sandwiching the electrically conductive intermediate layered region so that the first and second oxide layered regions form double tunnel barriers and the electrically conductive intermediate layered region forms a single potential well defined between the double tunnel barriers. The first oxide layered region has a first abrupt interface with the first ferromagnetic layer and the second oxide region having a second abrupt interface with the second ferromagnetic layer, wherein each of the first and second interfaces has such an extremely high abruptness as a monoatomic layer level that a width of a boundary area between an oxygen atom containing region and an oxygen atom free region is substantially the same as a boundary between adjacent two monoatomic layers.

The fourth present invention provides a method of forming a tunnel barrier layer comprising at least a single oxide layered region in an intermediate layer sandwiched between first and second ferromagnetic layers. The method comprises the following steps. An electrically conductive layer is formed on the first ferromagnetic layer. The electrically conductive layer is subjected to an exactly pure oxygen gas prepared by having introduced oxygen into a vacuum, so as to cause a natural oxidation of the electrically conductive layer, thereby to form an oxide layer forming a tunnel barrier. The second ferromagnetic layer is formed on the oxide layer.

The fifth present invention provides a method of forming a tunnel barrier layer comprising an intermediate oxide layer to be sandwiched between first and second ferromagnetic layers. The method comprises the following steps. An electrically conductive layer is formed on the first ferromagnetic layer, where the electrically conductive layer has a larger formation free-energy per a single oxygen atom than a formation free energy of the first ferromagnetic layer so that oxygen atoms are thermally more stable in the electrically conductive layer than in the first ferromagnetic layer. The electrically conductive layer is subjected to an exactly pure oxygen gas prepared by having introduced oxygen into a vacuum, so as to cause an over-natural oxidation of not an entire part of the electrically conductive layer but also an upper region of the first ferromagnetic layer so that the electrically conductive layer is made into an intermediate oxide layer and also that the upper region of the first ferromagnetic layer is made into an upper oxide region. A heat treatment is carried out to cause a thermal diffusion of oxygen atoms only from the upper oxide region of the first ferromagnetic layer into the intermediate oxide layer, thereby to make the upper oxide region into an upper reduction region, whereby the intermediate oxide layer has a first abrupt interface with the upper reduction region of the first ferromagnetic layer, wherein the first interface has such an extremely high abruptness as a monoatomic layer level that a width of a boundary area between an oxygen atom containing region and an oxygen atom free region is substantially the same as a boundary between adjacent two monoatomic layers.

The sixth present invention provides a method of forming at least a tunnel barrier layer comprising an oxide layer in an intermediate layer to be sandwiched between first and second ferromagnetic layers. The method comprises the following steps. An oxidation of an upper region of the first ferromagnetic layer is conducted to form an upper oxide region in the first ferromagnetic layer. An electrically conductive layer is formed on the upper oxide region of the first ferromagnetic layer, where the electrically conductive layer has a larger formation free-energy per a single oxygen atom than a formation free energy of the first ferromagnetic layer so that oxygen atoms are thermally more stable in the electrically conductive layer than in the first ferromagnetic layer. A heat treatment is carried out to cause a thermal diffusion of oxygen atoms only from the upper oxide region of the first ferromagnetic layer into at least a lower region of the electrically conductive layer, thereby to make the upper oxide region of the first ferromagnetic layer into an upper reduction region, and also thereby to form at least an oxide layer at least on the lower region of the electrically conductive layer, whereby the oxide layer has at least a first abrupt interface with the upper reduction region of the first ferromagnetic layer, wherein the first interface has such an extremely high abruptness as a monoatomic layer level that a width of a boundary area between an oxygen atom containing region and an oxygen atom free region is substantially the same as a boundary between adjacent two monoatomic layers.

The seventh present invention provides a method of forming at least a tunnel barrier layer comprising an oxide layer in an intermediate layer to be sandwiched between first and second ferromagnetic layers. The method comprises the following steps. An oxidation of an upper region of the first ferromagnetic layer is conducted to form an upper oxide region in the first ferromagnetic layer. An electrically conductive layer is formed on the upper oxide region of the first ferromagnetic layer, where the electrically conductive layer has a larger formation free-energy per a single oxygen atom than a formation free energy of the first ferromagnetic layer so that oxygen atoms are thermally more stable in the electrically conductive layer than in the first ferromagnetic layer in order to cause, at about a room temperature, a natural diffusion of oxygen atoms only from the upper oxide region of the first ferromagnetic layer into at least a lower region of the electrically conductive layer, thereby to make the upper oxide region of the first ferromagnetic layer into an upper reduction region, and also thereby to form at least an oxide layer at least on the lower region of the electrically conductive layer, whereby the oxide layer has at least a first abrupt interface with the upper reduction region of the first ferromagnetic layer, wherein the first interface has such an extremely high abruptness as a monoatomic layer level that a width of a boundary area between an oxygen atom containing region and an oxygen atom free region is substantially the same as a boundary between adjacent two monoatomic layers.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
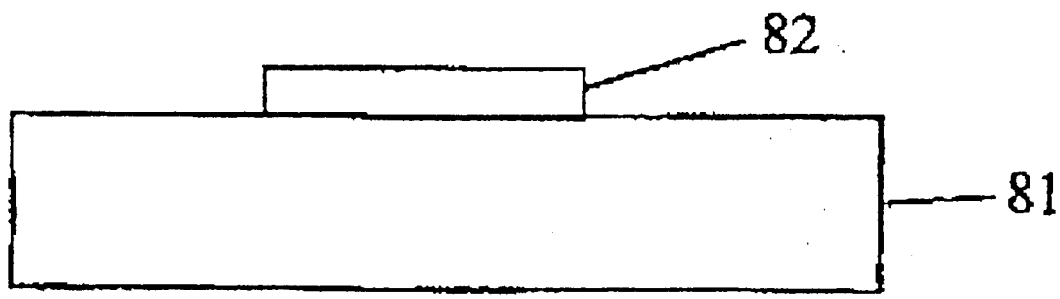
FIGS. 1A through 1D are fragmentary cross sectional elevation views illustrative of the conventional ferromagnetic tunnel junction devices in sequential steps involved in the conventional fabrication method described above.
Figure 1B:
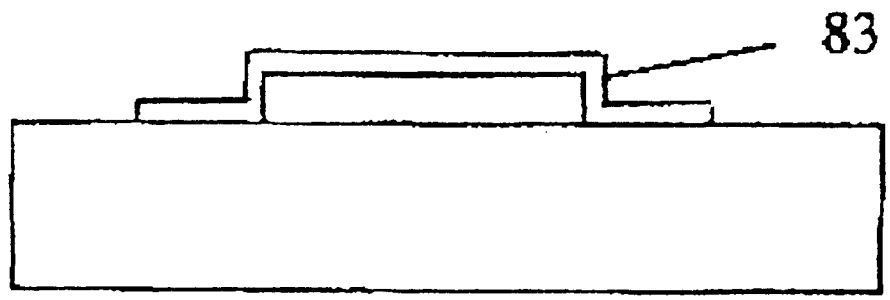
Figure 1C:
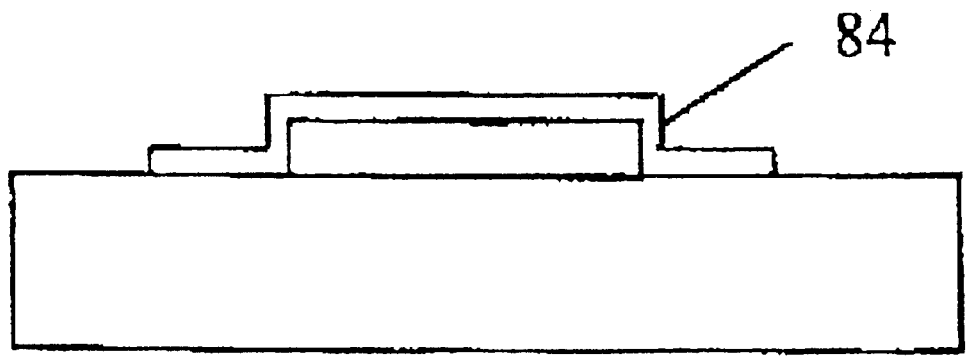
Figure 1D:
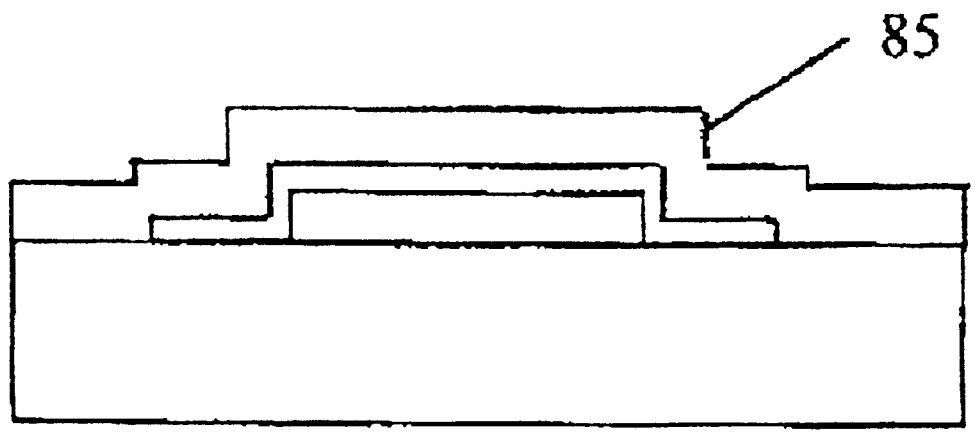

The first present invention provides an intermediate layer sandwiched between first and second ferromagnetic layers. The intermediate layer has at least a single oxide layered region forming at least a single tunnel barrier. The at least single oxide layered region has at least a first abrupt interface with the first ferromagnetic layer and a second abrupt interface with the second ferromagnetic layer, wherein each of the first and second interfaces has such an extremely high abruptness as a monoatomic layer level that a width of a boundary area between an oxygen atom containing region and an oxygen atom free region is substantially the same as a boundary between adjacent two monoatomic layers.

It is available that the intermediate layer is entirely occupied by a single oxide layered region which forms a single tunnel barrier having the same width as the intermediate layer.

It is also available that the intermediate layer comprises: an electrically conductive layered region; and first and second oxide layered regions sandwiching the electrically conductive layered region so that the first and second oxide layered regions have the first and second abrupt interfaces with the first and second ferromagnetic layers respectively, thereby to form double tunnel barriers and a single potential well defined between the double tunnel barriers. In this case, it is also available that the double tunnel barriers and the single potential well have such widths and heights as to allow electrons to exhibit resonant tunneling.

It is also available that the intermediate layer comprises: first and second oxide layered regions so that the first and second oxide layered regions have the first and second abrupt interfaces with the first and second ferromagnetic layers respectively; and alternating laminations of at least a third oxide layered region and at least two electrically conductive layered regions separated from each other by the at least third oxide layered region and sandwiched between the first and second oxide layered regions, thereby to form multiple tunnel barriers and multiple potential well defined between the double tunnel barriers. In this case, it is also available that the multiple tunnel barriers and the multiple potential well have such widths and heights as to allow electrons to exhibit resonant tunneling.

It is also available that the intermediate layer has a larger formation free-energy per a single oxygen atom than a formation free energy of each of the first and second ferromagnetic layers so that oxygen atoms are thermally more stable in the intermediate than in the first and second ferromagnetic layers. In this case, it is also available that the intermediate layer has a smaller surface free energy than a surface free energy of each of the first and second ferromagnetic layers. In this case, it is further available that the intermediate layer is free of any pin holes and has a good coverage. It is also available that a base material of the intermediate layer comprises a semiconductor. It is also available that a base material of the intermediate layer comprises a metal. It is also available that the intermediate layer includes at least one of Al, Mg and lanthanoids and the first and second ferromagnetic layers include at least one of Fe, Co, Ni and alloys thereof.

The second present invention provides a multi-layer structure in a ferromagnetic tunnel junction device. The multi-layer structure comprises: first and second ferromagnetic layers; and an intermediate layer sandwiched between the first and second ferromagnetic layers. The intermediate layer comprises an oxide layer which forms a single tunnel barrier. The oxide layer has a first abrupt interface with the first ferromagnetic layer and a second abrupt interface with the second ferromagnetic layer, wherein each of the first and second interfaces has such an extremely high abruptness as a monoatomic layer level that a width of a boundary area between an oxygen atom containing region and an oxygen atom free region is substantially the same as a boundary between adjacent two monoatomic layers.

It is available that the intermediate layer has a larger formation free-energy per a single oxygen atom than a formation free energy of each of the first and second ferromagnetic layers so that oxygen atoms are thermally more stable in the intermediate layer than in the first and second ferromagnetic layers. In this case, it is also available that the intermediate layer has a smaller surface free energy than a surface free energy of each of the first and second ferromagnetic layers. In this case, it is also available that the intermediate layer is free of any pin holes and has a good coverage. It is also available that the intermediate layer comprises a semiconductor oxide layer. It is also available that the intermediate layer comprises a metal oxide layer. It is also available that the intermediate layer includes at least one of Al, Mg and lanthanoids and the first and second ferromagnetic layers include at least one of Fe, Co, Ni and alloys thereof.

The third present invention provides a multi-layer structure in a ferromagnetic tunnel junction device. The multi-layer structure comprises: first and second ferromagnetic layers; and an intermediate layer sandwiched between the first and second ferromagnetic layers. The intermediate layer comprises an electrically conductive intermediate layered region and first and second oxide layered regions sandwiching the electrically conductive intermediate layered region so that the first and second oxide layered regions form double tunnel barriers and the electrically conductive intermediate layered region forms a single potential well defined between the double tunnel barriers. The first oxide layered region has a first abrupt interface with the first ferromagnetic layer and the second oxide region having a second abrupt interface with the second ferromagnetic layer, wherein each of the first and second interfaces has such an extremely high abruptness as a monoatomic layer level that a width of a boundary area between an oxygen atom containing region and an oxygen atom free region is substantially the same as a boundary between adjacent two monoatomic layers.

It is available that the intermediate layer has a larger formation free-energy per a single oxygen atom than a formation free energy of each of the first and second ferromagnetic layers so that oxygen atoms are thermally more stable in the intermediate layer than in the first and second ferromagnetic layers. In this case, it is also available that the intermediate layer has a smaller surface free energy than a surface free energy of each of the first and second ferromagnetic layers. In this case, it is also available that the intermediate layer is free of any pin holes and has a good coverage. It is also available that the intermediate layer comprises a semiconductor oxide layer. It is also available that the intermediate layer comprises a metal oxide layer. It is also available that the intermediate layer includes at least one of Al, Mg and lanthanoids and the first and second ferromagnetic layers include at least one of Fe, Co, Ni and alloys thereof.

It is also available to further comprise at least a third oxide layered region which isolates the electrically conductive intermediate layered region into at least two subordinate electrically conductive layered regions.

The fourth present invention provides a method of forming a tunnel barrier layer comprising at least a single oxide layered region in an intermediate layer sandwiched between first and second ferromagnetic layers. The method comprises the following steps. An electrically conductive layer is formed on the first ferromagnetic layer. The electrically conductive layer is subjected to an exactly pure oxygen gas prepared by having introduced oxygen into a vacuum, so as to cause a natural oxidation of the electrically conductive layer, thereby to form an oxide layer forming a tunnel barrier. The second ferromagnetic layer is formed on the oxide layer.

It is available that the natural oxidation is carried out so that the electrically conductive layer is entirely oxidized whereby the electrically conductive layer is entirely made into the oxide layer which has first and second interfaces with the first and second ferromagnetic layers respectively.

It is also available that the natural oxidation is carried out so that the electrically conductive layer is partially oxidized whereby the electrically conductive layer partially remains to have a first interface with the first ferromagnetic layer and the electrically conductive layer is partially made into the oxide layer which has a second interface with the second ferromagnetic layer.

It is also available that the electrically conductive layer has a larger formation free-energy per a single oxygen atom than a formation free energy of each of the first and second ferromagnetic layers so that oxygen atoms are thermally more stable in the electrically conductive layer than in the first and second ferromagnetic layers. In this case, it is also available that the electrically conductive layer has a smaller surface free energy than a surface free energy of each of the first and second ferromagnetic layers. It is also available that the intermediate layer is free of any pin holes and has a good coverage. It is also available that the intermediate layer comprises a semiconductor oxide layer. It is also available that the intermediate layer comprises a metal oxide layer. It is also available that the electrically conductive layer includes at least one of Al, Mg and lanthanoids and the first and second ferromagnetic layers include at least one of Fe, Co, Ni and alloys thereof.

The fifth present invention provides a method of forming a tunnel barrier layer comprising an intermediate oxide layer to be sandwiched between first and second ferromagnetic layers. The method comprises the following steps. An electrically conductive layer is formed on the first ferromagnetic layer, where the electrically conductive layer has a larger formation free-energy per a single oxygen atom than a formation free energy of the first ferromagnetic layer so that oxygen atoms are thermally more stable in the electrically conductive layer than in the first ferromagnetic layer. The electrically conductive layer is subjected to an exactly pure oxygen gas prepared by having introduced oxygen into a vacuum, so as to cause an over-natural oxidation of not an entire part of the electrically conductive layer but also an upper region of the first ferromagnetic layer so that the electrically conductive layer is made into an intermediate oxide layer and also that the upper region of the first ferromagnetic layer is made into an upper oxide region. A heat treatment is carried out to cause a thermal diffusion of oxygen atoms only from the upper oxide region of the first ferromagnetic layer into the intermediate oxide layer, thereby to make the upper oxide region into an upper reduction region, whereby the intermediate oxide layer has a first abrupt interface with the upper reduction region of the first ferromagnetic layer, wherein the first interface has such an extremely high abruptness as a monoatomic layer level that a width of a boundary area between an oxygen atom containing region and an oxygen atom free region is substantially the same as a boundary between adjacent two monoatomic layers.

It is available that the heat treatment is carried out at a temperature in the range of more than room temperature and not less than 300° C. In this case, It is also available that the heat treatment is carried out in an inert gas.

It is also available that the electrically conductive layer has a smaller surface free energy than a surface free energy of each of the first and second ferromagnetic layers. In this case, it is also available that the intermediate layer is free of any pin holes and has a good coverage. It is also available that the intermediate oxide layer comprises a semiconductor oxide layer. It is also available that the intermediate oxide layer comprises a metal oxide layer. It is also available that the electrically conductive layer includes at least one of Al, Mg and lanthanoids and the first and second ferromagnetic layers include at least one of Fe, Co, Ni and alloys thereof.

It is also available to further comprise a step of forming the second ferromagnetic layer on the intermediate oxide layer after the heat treatment has been carried out, wherein the formation free-energy per a single oxygen atom of the electrically conductive layer is also larger than a formation free energy of the second ferromagnetic layer so that oxygen atoms are thermally more stable in the electrically conductive layer than in the second ferromagnetic layer, whereby the intermediate oxide layer has not only the first abrupt interface but also a second abrupt interface with the second ferromagnetic layer, wherein the second interface has such an extremely high abruptness as a monoatomic layer level that a width of a boundary area between an oxygen atom containing region and an oxygen atom free region is substantially the same as a boundary between adjacent two monoatomic layers.

It is also available to further comprise a step of forming the second ferromagnetic layer on the intermediate oxide layer after the over-natural oxidation has been carried out, wherein the formation free-energy per a single oxygen atom of the electrically conductive layer is also larger than a formation free energy of the second ferromagnetic layer so that oxygen atoms are thermally more stable in the electrically conductive layer than in the second ferromagnetic layer before the heat treatment will be carried out to cause the thermal diffusion of oxygen atoms only from the upper oxide region of the first ferromagnetic layer into the intermediate oxide layer without any further thermal diffusion of oxygen atoms from the intermediate oxide layer to the second ferromagnetic layer, whereby the intermediate oxide layer has not only the first abrupt interface but also a second abrupt interface with the second ferromagnetic layer, wherein the second interface has such an extremely high abruptness as a monoatomic layer level that a width of a boundary area between an oxygen atom containing region and an oxygen atom free region is substantially the same as a boundary between adjacent two monoatomic layers.

The sixth present invention provides a method of forming at least a tunnel barrier layer comprising an oxide layer in an intermediate layer to be sandwiched between first and second ferromagnetic layers. The method comprises the following steps. An oxidation of an upper region of the first ferromagnetic layer is conducted to form an upper oxide region in the first ferromagnetic layer. An electrically conductive layer is formed on the upper oxide region of the first ferromagnetic layer, where the electrically conductive layer has a larger formation free-energy per a single oxygen atom than a formation free energy of the first ferromagnetic layer so that oxygen atoms are thermally more stable in the electrically conductive layer than in the first ferromagnetic layer. A heat treatment is carried out to cause a thermal diffusion of oxygen atoms only from the upper oxide region of the first ferromagnetic layer into at least a lower region of the electrically conductive layer, thereby to make the upper oxide region of the first ferromagnetic layer into an upper reduction region, and also thereby to form at least an oxide layer at least on the lower region of the electrically conductive layer, whereby the oxide layer has at least a first abrupt interface with the upper reduction region of the first ferromagnetic layer, wherein the first interface has such an extremely high abruptness as a monoatomic layer level that a width of a boundary area between an oxygen atom containing region and an oxygen atom free region is substantially the same as a boundary between adjacent two monoatomic layers.

It is available that the heat treatment is carried out at a temperature in the range of more than room temperature and not less than 300° C. In this case, it is also available that the heat treatment is carried out in an inert gas.

It is also available that the electrically conductive layer has a smaller surface free energy than a surface free energy of each of the first and second ferromagnetic layers. In this case, it is also available that the intermediate layer is free of any pin holes and has a good coverage. It is also available that the oxide layer comprises a semiconductor oxide layer. It is also available that the oxide layer comprises a metal oxide layer. It is also available that the electrically conductive layer includes at least one of Al, Mg and lanthanoids and the first and second ferromagnetic layers include at least one of Fe, Co, Ni and alloys thereof.

It is also available that the oxygen atoms are thermally diffused from the upper oxide region of the first ferromagnetic layer into an entire region of the electrically conductive layer, thereby to make the upper oxide region of the first ferromagnetic layer into an upper reduction region and also thereby to make the electrically conductive layer into an oxide layer which forms a single tunnel barrier, and the method further comprises the step of: forming the second ferromagnetic layer on the oxide layer after the thermal diffusion has been carried out, wherein the formation free-energy per a single oxygen atom of the electrically conductive layer is also larger than a formation free energy of the second ferromagnetic layer so that oxygen atoms are thermally more stable in the electrically conductive layer than in the second ferromagnetic layer, whereby the oxide layer has not only the first abrupt interface but also has a second abrupt interface with the second ferromagnetic layer, wherein the second interface has such an extremely high abruptness as a monoatomic layer level that a width of a boundary area between an oxygen atom containing region and an oxygen atom free region is substantially the same as a boundary between adjacent two monoatomic layers.

It is also available that the oxygen atoms are thermally diffused from the upper oxide region of the first ferromagnetic layer into only a lower region of the electrically conductive layer, thereby to make the upper oxide region of the first ferromagnetic layer into an upper reduction region and also thereby to make the lower region of the electrically conductive layer into a lower oxide layer, and the method further comprises the following steps. After the heat treatment has been carried out, a remaining part of the electrically conductive layer over the lower oxide layer is subjected to an exactly pure oxygen gas prepared by having introduced oxygen into a vacuum, so as to cause a natural oxidation of only an upper region of the remaining part of the electrically conductive layer so that the upper region of the electrically conductive layer is made into an upper oxide layer which is separated by an intermediate electrically conductive region from the lower oxide layer to form double tunnel barriers and a single potential well defined by the double tunnel barriers. The second ferromagnetic layer is formed on the upper oxide layer, wherein the formation free-energy per a single oxygen atom of the electrically conductive layer is also larger than a formation free energy of the second ferromagnetic layer so that oxygen atoms are thermally more stable in the electrically conductive layer than in the second ferromagnetic layer, whereby the lower oxide layer has the first abrupt interface with the upper reduction region of the first ferromagnetic layer and the upper oxide layer has a second abrupt interface with the second ferromagnetic layer, wherein each of the first and second interface has such an extremely high abruptness as a monoatomic layer level that a width of a boundary area between an oxygen atom containing region and an oxygen atom free region is substantially the same as a boundary between adjacent two monoatomic layers.

It is also available that the oxygen atoms are thermally diffused from the upper oxide region of the first ferromagnetic layer into only a lower region of the electrically conductive layer, thereby to make the upper oxide region of the first ferromagnetic layer into an upper reduction region and also thereby to make the lower region of the electrically conductive layer into a lower oxide layer, and the method further comprises the following steps. After the heat treatment has been carried out, a remaining part of the electrically conductive layer over the lower oxide layer is subjected to an exactly pure oxygen gas prepared by having introduced oxygen into a vacuum, so as to cause a natural oxidation of an entire region of the remaining part of the electrically conductive layer so that the intermediate layer is made into an intermediate oxide layer which forms a single tunnel barrier. The second ferromagnetic layer is formed on the intermediate oxide layer, wherein the formation free-energy per a single oxygen atom of the electrically conductive layer is also larger than a formation free energy of the second ferromagnetic layer so that oxygen atoms are thermally more stable in the electrically conductive layer than in the second ferromagnetic layer, whereby the intermediate oxide layer has not only the first abrupt interface with the upper reduction region of the first ferromagnetic layer but also has a second abrupt interface with the second ferromagnetic layer, wherein each of the first and second interface has such an extremely high abruptness as a monoatomic layer level that a width of a boundary area between an oxygen atom containing region and an oxygen atom free region is substantially the same as a boundary between adjacent two monoatomic layers.

It is also available that the oxygen atoms are thermally diffused from the upper oxide region of the first ferromagnetic layer into an entire region of the electrically conductive layer, thereby to make the upper oxide region of the first ferromagnetic layer into an upper reduction region and also thereby to make the electrically conductive layer into an oxide layer which forms a single tunnel barrier, and the method further comprises the following step of: forming the second ferromagnetic layer on the oxide layer before the thermal diffusion will be carried out, wherein the formation free-energy per a single oxygen atom of the electrically conductive layer is also larger than a formation free energy of the second ferromagnetic layer so that oxygen atoms are thermally more stable in the electrically conductive layer than in the second ferromagnetic layer, whereby the oxide layer has not only the first abrupt interface but also has a second abrupt interface with the second ferromagnetic layer, wherein the second interface has such an extremely high abruptness as a monoatomic layer level that a width of a boundary area between an oxygen atom containing region and an oxygen atom free region is substantially the same as a boundary between adjacent two monoatomic layers.

It is also available that the oxygen atoms are thermally diffused from the upper oxide region of the first ferromagnetic layer into only a lower region of the electrically conductive layer, thereby to make the upper oxide region of the first ferromagnetic layer into an upper reduction region and also thereby to make the lower region of the electrically conductive layer into a lower oxide layer, and the method further comprises the following steps. An upper region of the electrically conductive layer is subjected to an exactly pure oxygen gas prepared by having introduced oxygen into a vacuum, so as to cause a natural oxidation of only an upper region of the electrically conductive layer so that the upper region of the electrically conductive layer is made into an upper oxide layer. The second ferromagnetic layer is formed on the upper oxide layer, wherein the formation free-energy per a single oxygen atom of the electrically conductive layer is also larger than a formation free energy of the second ferromagnetic layer so that oxygen atoms are thermally more stable in the electrically conductive layer than in the second ferromagnetic layer, before the heat treatment will be carried out to cause the thermal diffusion of oxygen atoms only from the upper oxide region of the first ferromagnetic layer into a lower region of a remaining part of the electrically conductive layer, thereby to make the upper oxide region of the first ferromagnetic layer into an upper reduction region, and also thereby to make the lower region of the remaining part of the electrically conductive layer into a lower oxide film which is separated by an intermediate electrically conductive region from the upper oxide layer to form double tunnel barriers and a single potential well defined by the double tunnel barriers, whereby the lower oxide layer has the first abrupt interface with the upper reduction region of the first ferromagnetic layer and the upper oxide layer has a second abrupt interface with the second ferromagnetic layer, wherein each of the first and second interface has such an extremely high abruptness as a monoatomic layer level that a width of a boundary area between an oxygen atom containing region and an oxygen atom free region is substantially the same as a boundary between adjacent two monoatomic layers.

It is also available that the oxygen atoms are thermally diffused from the upper oxide region of the first ferromagnetic layer into only a lower region of the electrically conductive layer, thereby to make the upper oxide region of the first ferromagnetic layer into an upper reduction region and also thereby to make the lower region of the electrically conductive layer into a lower oxide layer, and the method further comprises the following steps. An upper region of the electrically conductive layer is subjected to an exactly pure oxygen gas prepared by having introduced oxygen into a vacuum, so as to cause a natural oxidation of only an upper region of the electrically conductive layer so that the upper region of the electrically conductive layer is made into an upper oxide layer. The second ferromagnetic layer is formed on the upper oxide layer, wherein the formation free-energy per a single oxygen atom of the electrically conductive layer is also larger than a formation free energy of the second ferromagnetic layer so that oxygen atoms are thermally more stable in the electrically conductive layer than in the second ferromagnetic layer, before the heat treatment will be carried out to cause the thermal diffusion of oxygen atoms only from the upper oxide region of the first ferromagnetic layer into an entire of a remaining part of the electrically conductive layer, thereby to make the upper oxide region of the first ferromagnetic layer into an upper reduction region, and also thereby to make the intermediate layer into an intermediate oxide film which forms a single tunnel barrier, whereby the intermediate oxide layer has not only the first abrupt interface with the upper reduction region of the first ferromagnetic layer but also has a second abrupt interface with the second ferromagnetic layer, wherein each of the first and second interface has such an extremely high abruptness as a monoatomic layer level that a width of a boundary area between an oxygen atom containing region and an oxygen atom free region is substantially the same as a boundary between adjacent two monoatomic layers.

It is also available that the oxygen atoms are thermally diffused from the upper oxide region of the first ferromagnetic layer into only a lower region of the electrically conductive layer, thereby to make the upper oxide region of the first ferromagnetic layer into an upper reduction region and also thereby to make the lower region of the electrically conductive layer into a lower oxide layer, and the method further comprises the following steps. An upper region of the electrically conductive layer is subjected to an exactly pure oxygen gas prepared by having introduced oxygen into a vacuum, so as to cause a natural oxidation of only an upper region of the electrically conductive layer so that the upper region of the electrically conductive layer is made into an upper oxide layer, before the heat treatment will be carried out to cause the thermal diffusion of oxygen atoms only from the upper oxide region of the first ferromagnetic layer into a lower region of a remaining part of the electrically conductive layer, thereby to make the upper oxide region of the first ferromagnetic layer into an upper reduction region, and also thereby to make the lower region of the remaining part of the electrically conductive layer into a lower oxide film which is separated by an intermediate electrically conductive region from the upper oxide layer to form double tunnel barriers and a single potential well defined by the double tunnel barriers. The second ferromagnetic layer is formed on the upper oxide layer, wherein the formation free-energy per a single oxygen atom of the electrically conductive layer is also larger than a formation free energy of the second ferromagnetic layer so that oxygen atoms are thermally more stable in the electrically conductive layer than in the second ferromagnetic layer, whereby the lower oxide layer has the first abrupt interface with the upper reduction region of the first ferromagnetic layer and the upper oxide layer has a second abrupt interface with the second ferromagnetic layer, wherein each of the first and second interface has such an extremely high abruptness as a monoatomic layer level that a width of a boundary area between an oxygen atom containing region and an oxygen atom free region is substantially the same as a boundary between adjacent two monoatomic layers.

It is also available that the oxygen atoms are thermally diffused from the upper oxide region of the first ferromagnetic layer into only a lower region of the electrically conductive layer, thereby to make the upper oxide region of the first ferromagnetic layer into an upper reduction region and also thereby to make the lower region of the electrically conductive layer into a lower oxide layer, and the method further comprises the following steps. An upper region of the electrically conductive layer is subjected to an exactly pure oxygen gas prepared by having introduced oxygen into a vacuum, so as to cause a natural oxidation of only an upper region of the electrically conductive layer so that the upper region of the electrically conductive layer is made into an upper oxide layer, before the heat treatment will be carried out to cause the thermal diffusion of oxygen atoms only from the upper oxide region of the first ferromagnetic layer into an entire of a remaining part of the electrically conductive layer, thereby to make the upper oxide region of the first ferromagnetic layer into an upper reduction region, and also thereby to make the intermediate layer into an intermediate oxide film which forms a single tunnel barrier. The second ferromagnetic layer is formed on the intermediate oxide layer, wherein the formation free-energy per a single oxygen atom of the electrically conductive layer is also larger than a formation free energy of the second ferromagnetic layer so that oxygen atoms are thermally more stable in the electrically conductive layer than in the second ferromagnetic layer, whereby the intermediate oxide layer has not only the first abrupt interface with the upper reduction region of the first ferromagnetic layer but also has a second abrupt interface with the second ferromagnetic layer, wherein each of the first and second interface has such an extremely high abruptness as a monoatomic layer level that a width of a boundary area between an oxygen atom containing region and an oxygen atom free region is substantially the same as a boundary between adjacent two monoatomic layers.

It is also available that the oxidation of the upper region of the first ferromagnetic layer is conducted by subjecting the upper region to an exactly pure oxygen gas prepared by having introduced oxygen into a vacuum.

It is also available that the oxidation of the upper region of the first ferromagnetic layer is conducted by subjecting the upper region to an oxygen containing gas.

The seventh present invention provides a method of forming at least a tunnel barrier layer comprising an oxide layer in an intermediate layer to be sandwiched between first and second ferromagnetic layers. The method comprises the following steps. An oxidation of an upper region of the first ferromagnetic layer is conducted to form an upper oxide region in the first ferromagnetic layer. An electrically conductive layer is formed on the upper oxide region of the first ferromagnetic layer, where the electrically conductive layer has a larger formation free-energy per a single oxygen atom than a formation free energy of the first ferromagnetic layer so that oxygen atoms are thermally more stable in the electrically conductive layer than in the first ferromagnetic layer in order to cause, at about a room temperature, a natural diffusion of oxygen atoms only from the upper oxide region of the first ferromagnetic layer into at least a lower region of the electrically conductive layer, thereby to make the upper oxide region of the first ferromagnetic layer into an upper reduction region, and also thereby to form at least an oxide layer at least on the lower region of the electrically conductive layer, whereby the oxide layer has at least a first abrupt interface with the upper reduction region of the first ferromagnetic layer, wherein the first interface has such an extremely high abruptness as a monoatomic layer level that a width of a boundary area between an oxygen atom containing region and an oxygen atom free region is substantially the same as a boundary between adjacent two monoatomic layers.

It is also available that the electrically conductive layer has a smaller surface free energy than a surface free energy of each of the first and second ferromagnetic layers. In this case, it is also available that the intermediate layer is free of any pin holes and has a good coverage. It is also available that the oxide layer comprises a semiconductor oxide layer. It is also available that the oxide layer comprises a metal oxide layer. It is also available that the electrically conductive layer includes at least one of Al, Mg and lanthanoids and the first and second ferromagnetic layers include at least one of Fe, Co, Ni and alloys thereof.

It is also available that the oxygen atoms are naturally diffused from the upper oxide region of the first ferromagnetic layer into an entire region of the electrically conductive layer, thereby to make the upper oxide region of the first ferromagnetic layer into an upper reduction region and also thereby to make the electrically conductive layer into an oxide layer which forms a single tunnel barrier, and the method further comprises the following step. After the oxide layer has been formed, the second ferromagnetic layer is formed on the oxide layer, wherein the formation free-energy per a single oxygen atom of the electrically conductive layer is also larger than a formation free energy of the second ferromagnetic layer so that oxygen atoms are thermally more stable in the electrically conductive layer than in the second ferromagnetic layer, whereby the oxide layer has not only the first abrupt interface but also has a second abrupt interface with the second ferromagnetic layer, wherein the second interface has such an extremely high abruptness as a monoatomic layer level that a width of a boundary area between an oxygen atom containing region and an oxygen atom free region is substantially the same as a boundary between adjacent two monoatomic layers.

It is also available that the oxygen atoms are naturally diffused from the upper oxide region of the first ferromagnetic layer into only a lower region of the electrically conductive layer, thereby to make the upper oxide region of the first ferromagnetic layer into an upper reduction region and also thereby to make the lower region of the electrically conductive layer into a lower oxide layer, and the method further comprises the following steps. After the lower oxide layer has been formed, a remaining part of the electrically conductive layer over the lower oxide layer is subjected to an exactly pure oxygen gas prepared by having introduced oxygen into a vacuum, so as to cause a natural oxidation of only an upper region of the remaining part of the electrically conductive layer so that the upper region of the electrically conductive layer is made into an upper oxide layer which is separated by an intermediate electrically conductive region from the lower oxide layer to form double tunnel barriers and a single potential well defined by the double tunnel barriers. The second ferromagnetic layer is formed on the upper oxide layer, wherein the formation free-energy per a single oxygen atom of the electrically conductive layer is also larger than a formation free energy of the second ferromagnetic layer so that oxygen atoms are thermally more stable in the electrically conductive layer than in the second ferromagnetic layer, whereby the lower oxide layer has the first abrupt interface with the upper reduction region of the first ferromagnetic layer and the upper oxide layer has a second abrupt interface with the second ferromagnetic layer, wherein each of the first and second interface has such an extremely high abruptness as a monoatomic layer level that a width of a boundary area between an oxygen atom containing region and an oxygen atom free region is substantially the same as a boundary between adjacent two monoatomic layers.

It is also available that the oxygen atoms are naturally diffused from the upper oxide region of the first ferromagnetic layer into only a lower region of the electrically conductive layer, thereby to make the upper oxide region of the first ferromagnetic layer into an upper reduction region and also thereby to make the lower region of the electrically conductive layer into a lower oxide layer, and the method further comprises the following steps. After the lower oxide layer has been formed, a remaining part of the electrically conductive layer over the lower oxide layer is subjected to an exactly pure oxygen gas prepared by having introduced oxygen into a vacuum, so as to cause a natural oxidation of an entire region of the remaining part of the electrically conductive layer so that the intermediate layer is made into an intermediate oxide layer which forms a single tunnel barrier. The second ferromagnetic layer is formed on the intermediate oxide layer, wherein the formation free-energy per a single oxygen atom of the electrically conductive layer is also larger than a formation free energy of the second ferromagnetic layer so that oxygen atoms are thermally more stable in the electrically conductive layer than in the second ferromagnetic layer, whereby the intermediate oxide layer has not only the first abrupt interface with the upper reduction region of the first ferromagnetic layer but also has a second abrupt interface with the second ferromagnetic layer, wherein each of the first and second interface has such an extremely high abruptness as a monoatomic layer level that a width of a boundary area between an oxygen atom containing region and an oxygen atom free region is substantially the same as a boundary between adjacent two monoatomic layers.

It is also available that the oxygen atoms are naturally diffused from the upper oxide region of the first ferromagnetic layer into only a lower region of the electrically conductive layer, thereby to make the upper oxide region of the first ferromagnetic layer into an upper reduction region and also thereby to make the lower region of the electrically conductive layer into a lower oxide layer, and the method further comprises the following steps. Immediately after the electrically conductive layer has been formed, an upper region of the electrically conductive layer is subjected to an exactly pure oxygen gas prepared by having introduced oxygen into a vacuum, so as to cause almost currently both a natural oxidation of an upper region of the electrically conductive layer and the natural diffusion of oxygen atoms from the upper oxide region of the first ferromagnetic layer into a lower region of the electrically conductive layer, so that the upper and lower regions of the electrically conductive layer are respectively made into upper and lower oxide films which are separated from each other by an intermediate electrically conductive region thereby to form double tunnel barriers and a single potential well defined by the double tunnel barriers. The second ferromagnetic layer is formed on the upper oxide layer, wherein the formation free-energy per a single oxygen atom of the electrically conductive layer is also larger than a formation free energy of the second ferromagnetic layer so that oxygen atoms are thermally more stable in the electrically conductive layer than in the second ferromagnetic layer, whereby the lower oxide layer has the first abrupt interface with the upper reduction region of the first ferromagnetic layer and the upper oxide layer has a second abrupt interface with the second ferromagnetic layer, wherein each of the first and second interface has such an extremely high abruptness as a monoatomic layer level that a width of a boundary area between an oxygen atom containing region and an oxygen atom free region is substantially the same as a boundary between adjacent two monoatomic layers.

It is also available that the oxygen atoms are naturally diffused from the upper oxide region of the first ferromagnetic layer into only a lower region of the electrically conductive layer, thereby to make the upper oxide region of the first ferromagnetic layer into an upper reduction region and also thereby to make the lower region of the electrically conductive layer into a lower oxide layer, and the method further comprises the following steps. Immediately after the electrically conductive layer has been formed, an upper region of the electrically conductive layer is subjected to an exactly pure oxygen gas prepared by having introduced oxygen into a vacuum, so as to cause almost currently both a natural oxidation of an upper region of the electrically conductive layer and the natural diffusion of oxygen atoms from the upper oxide region of the first ferromagnetic layer into a lower region of the electrically conductive layer, so that the electrically conductive layer is made into an intermediate oxide film which forms a single tunnel barrier. The second ferromagnetic layer is formed on the intermediate oxide layer, wherein the formation free-energy per a single oxygen atom of the electrically conductive layer is also larger than a formation free energy of the second ferromagnetic layer so that oxygen atoms are thermally more stable in the electrically conductive layer than in the second ferromagnetic layer, whereby the intermediate oxide layer has not only the first abrupt interface with the upper reduction region of the first ferromagnetic layer but also has a second abrupt interface with the second ferromagnetic layer, wherein each of the first and second interface has such an extremely high abruptness as a monoatomic layer level that a width of a boundary area between an oxygen atom containing region and an oxygen atom free region is substantially the same as a boundary between adjacent two monoatomic layers.

It is also available that the oxidation of the upper region of the first ferromagnetic layer is conducted by subjecting the upper region to an exactly pure oxygen gas prepared by having introduced oxygen into a vacuum.

It is also available that the oxidation of the upper region of the first ferromagnetic layer is conducted by subjecting the upper region to an oxygen containing gas.

The above third to seventh present inventions will further be described in more detail with reference to the drawings.
First Method The first novel method in accordance with the present invention will be described with reference to FIGS. 2A through 2C which are fragmentary cross sectional elevation views in sequential steps involved in a first novel method of forming a tunnel barrier layer sandwiched between two ferromagnetic layers in a ferromagnetic tunnel junction device in accordance with the present invention.

Figure 2A:
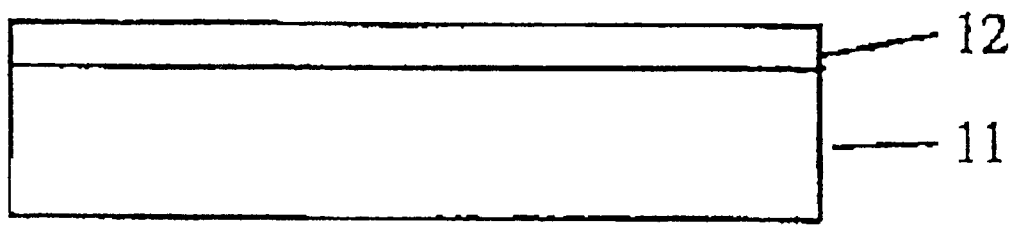
FIGS. 2A through 2C are fragmentary cross sectional elevation views in sequential steps involved in a first novel method of forming a tunnel barrier layer sandwiched between two ferromagnetic layers in a ferromagnetic tunnel junction device in accordance with the present invention.

With reference to FIG. 2A, a first ferromagnetic layer 11 is grown in a vacuum and subsequently an electrically conductive layer 12 is then grown on a surface of the first ferromagnetic layer 11 in the vacuum.

Figure 2B:
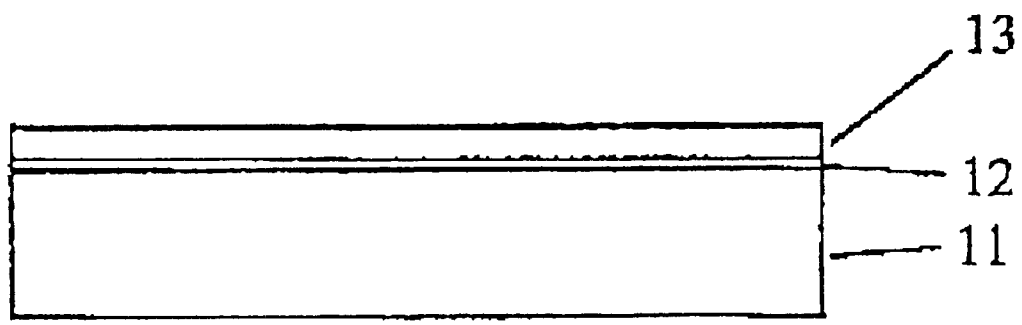

With reference to FIG. 2B, only a pure oxygen is introduced into the vacuum so that a surface of the electrically conductive layer 12 is subjected to the pure oxygen gas for causing a natural oxidation of the electrically conductive layer 12, whereby the electrically conductive layer 12 is naturally oxidized, except for a lower region thereof which is adjacent to the top surface of the first ferromagnetic layer 11. As a result of the natural oxidation, the electrically conductive layer 12 remains only in the lower region over the first ferromagnetic layer 11. An oxide layer 13 is formed on the remaining electrically conductive layer 12. The oxide layer 13 serves as a tunnel barrier.

Figure 2C:
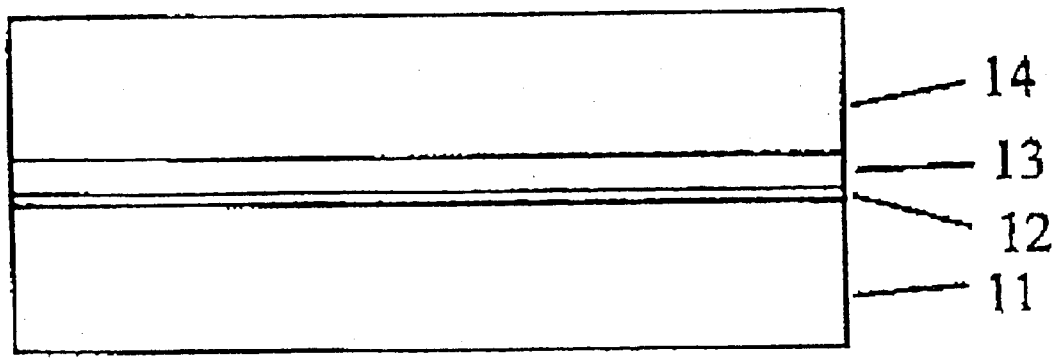

With reference to FIG. 2C, the pure oxygen gas is discharged before a second ferromagnetic layer 14 is grown on the oxide layer 13 serving as a tunnel barrier.

An electrically conductive material for the electrically conductive layer 12 should preferably have a smaller surface free energy than that of a ferromagnetic material for the first and second ferromagnetic layers 11 and 14 for allowing the electrically conductive layer 12 to possess a good coverage characteristic to the first ferromagnetic layer 11. For this reason, Fe, Co, Ni and alloys thereof are available for the first and second ferromagnetic layers 11 and 14, whilst Al is available for the electrically conductive layer 12. Since the electrically conductive layer 12 has a smaller surface free energy than that of the ferromagnetic material for the first ferromagnetic layer 11 and possesses a good coverage, then the electrically conductive layer 12 is free of any pin. holes, whereby the electrically conductive layer 12 is free from a problem with formation of an electrical short circuit between the first and second ferromagnetic layers 11 and 14 through any pin hole.

In addition, the electrically conductive material Al of the electrically conductive layer 12 has a larger formation free-energy per a single oxygen atom than that of the ferromagnetic material for the first and second ferromagnetic layers 11 and 14. An interface between the oxide layer 13 and the second ferromagnetic layer 14 is thermally stable, for which reason no oxygen atoms are diffused from the oxide layer 13 to the second ferromagnetic layer 14.

As a modification to the above, Mg and lanthanoids are also available for the electrically conductive material for the electrically conductive layer 12.
Second Method The second novel method in accordance with the present invention will be described with reference to FIGS. 3A through 3C which are fragmentary cross sectional elevation views in sequential steps involved in a second novel method of forming a tunnel barrier layer sandwiched between two ferromagnetic layers in a ferromagnetic tunnel junction device in accordance with the present invention.

Figure 3A:
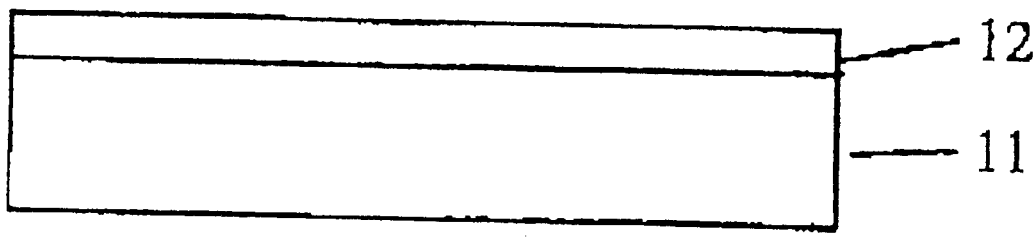
FIGS. 3A through 3C are fragmentary cross sectional elevation views in sequential steps involved in a second novel method of forming a tunnel barrier layer sandwiched between two ferromagnetic layers in a ferromagnetic tunnel junction device in accordance with the present invention.

With reference to FIG. 3A, a first ferromagnetic layer 11 is grown in a vacuum and subsequently an electrically conductive layer 12 is then grown on a surface of the first ferromagnetic layer 11 in the vacuum.

Figure 3B:
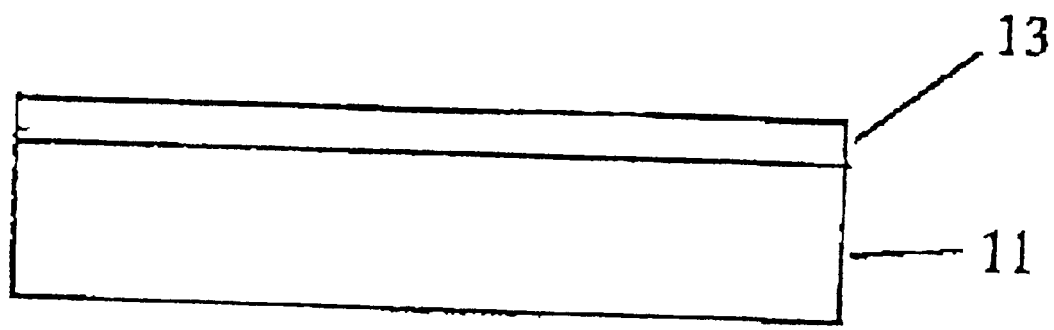

With reference to FIG. 3B, only a pure oxygen is introduced into the vacuum so that a surface of the electrically conductive layer 12 is subjected to the pure oxygen gas for causing a natural oxidation of the electrically conductive layer 12, whereby the electrically conductive layer 12 is naturally oxidized entirely. The natural oxidation is conducted under a precise control so that the electrically conductive layer 12 is entirely made into an oxide layer 13 on the first ferromagnetic layer 11, whereby the lower region of the electrically conductive layer 12 is also oxidized without, however, any over-natural oxidation to the upper region of the first ferromagnetic layer 11. The oxide layer 13 serves as a tunnel barrier.

Figure 3C:
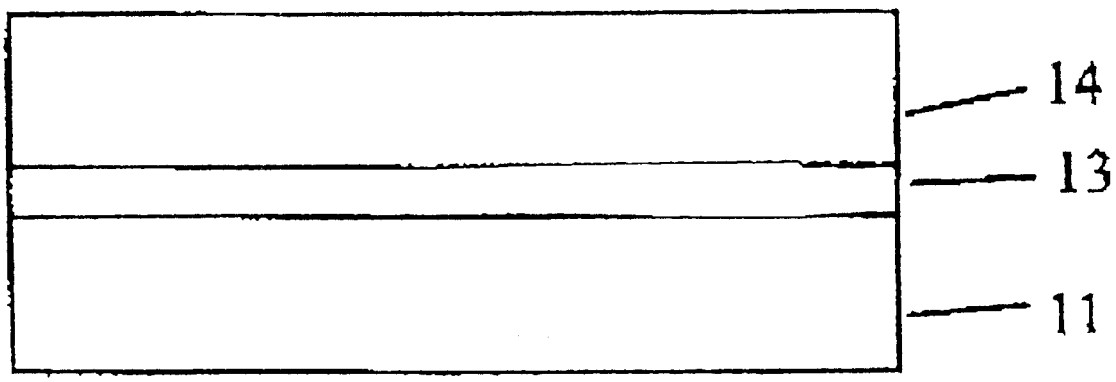

With reference to FIG. 3C, the pure oxygen gas is discharged before a second ferromagnetic layer 14 is grown on the oxide layer 13 serving as a tunnel barrier so that the first and second ferromagnetic layers 11 and 14 sandwich the tunnel barrier.

An electrically conductive material for the electrically conductive layer 12 should preferably have a smaller surface free energy than that of a ferromagnetic material for the first and second ferromagnetic layers 11 and 14 for allowing the electrically conductive layer 12 to possess a good coverage characteristic to the first ferromagnetic layer 11. For this reason, Fe, Co, Ni and alloys thereof are available for the first and second ferromagnetic layers 11 and 14, whilst Al is available for the electrically conductive layer 12. Since the electrically conductive layer 12 has a smaller surface free energy than that of the ferromagnetic material for the first ferromagnetic layer 11 and possesses a good coverage, then the electrically conductive layer 12 is free of any pin holes, whereby the electrically conductive layer 12 is free from a problem with formation of an electrical short circuit between the first and second ferromagnetic layers 11 and 14 through any pin hole.

In addition, the electrically conductive material Al of the electrically conductive layer 12 has a larger formation free-energy per a single oxygen atom than that of the ferromagnetic material for the first and second ferromagnetic layers 11 and 14. An interface between the oxide layer 13 and the second ferromagnetic layer 14 is thermally stable, for which reason no oxygen atoms are diffused from the oxide layer 13 to the second ferromagnetic layer 14.

As a modification to the above, Mg and lanthanoids are also available for the electrically conductive material for the electrically conductive layer 12.

Third Method

The third novel method in accordance with the present invention will be described with reference to FIGS. 4A through 4D which are fragmentary cross sectional elevation views in sequential steps involved in a third novel method of forming a tunnel barrier layer sandwiched between two ferromagnetic layers in a ferromagnetic tunnel junction device in accordance with the present invention.

Figure 4A:
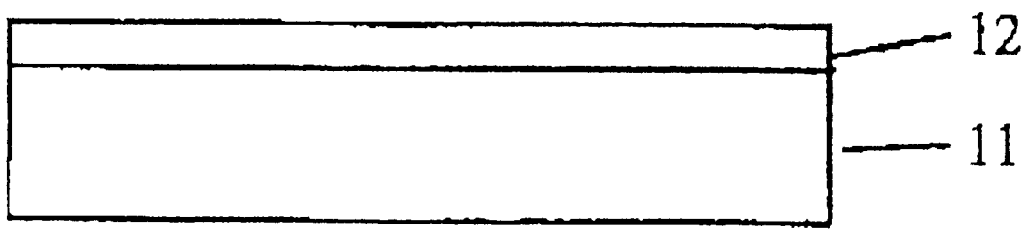
FIGS. 4A through 4D are fragmentary cross sectional elevation views in sequential steps involved in a third novel method of forming a tunnel barrier layer sandwiched between two ferromagnetic layers in a ferromagnetic tunnel junction device in accordance with the present invention.

With reference to FIG. 4A, a first ferromagnetic layer 11 is grown in a vacuum and subsequently an electrically conductive layer 12 is then grown on a surface of the first ferromagnetic layer 11 in the vacuum.

Figure 4B:
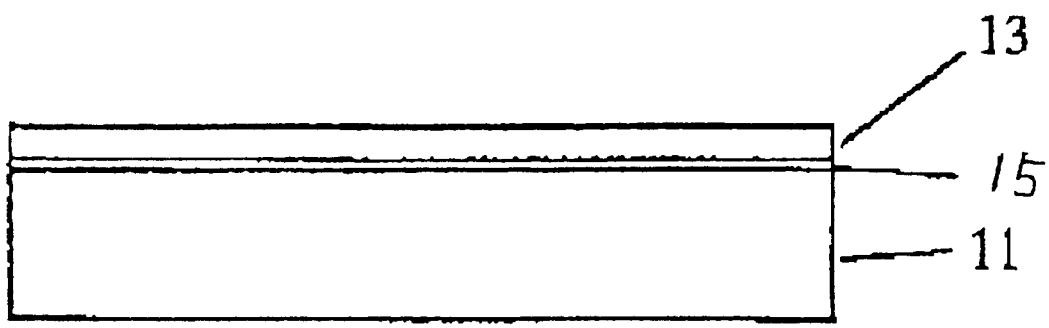

With reference to FIG. 4B, only a pure oxygen is introduced into the vacuum so that a surface of the electrically conductive layer 12 is subjected to the pure oxygen gas for causing an over-natural oxidation of the electrically conductive layer 12, whereby not only the electrically conductive layer 12 but also an upper region of the first ferromagnetic layer 11 are naturally oxidized. The over-natural oxidation is so conducted that both an entire part of the electrically conductive layer 12 is made into an oxide layer 13 as well as an upper region of the first ferromagnetic layer 11 is made into an oxide upper region 15 of the first ferromagnetic layer 11. An electrically conductive material of the electrically conductive layer 12 is selected to have a larger formation free-energy per a single oxygen atom than that of the ferromagnetic material for the first ferromagnetic layer 11. Oxygen atoms are more thermally stable in the electrically conductive layer 12 than in the first ferromagnetic layer 11.

Figure 4C:
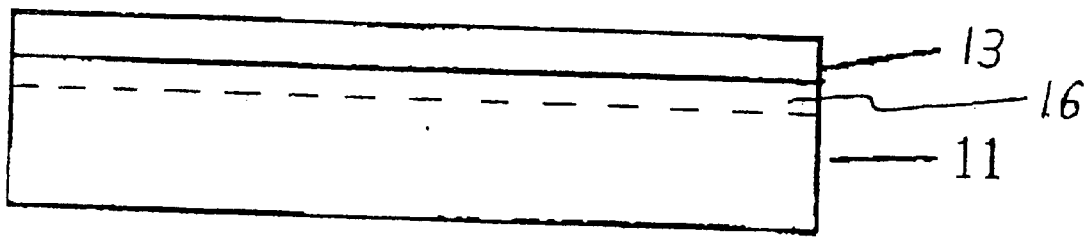

With reference to FIG. 4C, the pure oxygen gas is discharged before a heat treatment is carried out to the laminations of the first ferromagnetic layer 11, the oxide layer 13 and the oxide upper region 15 of the first ferromagnetic layer 11. As described above, the electrically conductive material of the electrically conductive layer 12 is selected to have a larger formation free-energy per a single oxygen atom than that of the ferromagnetic material for the first ferromagnetic layer 11, for which reason oxygen atoms are more thermally stable in the electrically conductive layer 12 than in the first ferromagnetic layer 11. Therefore, the heat treatment is so carried out as to cause a thermal diffusion of oxygen from the oxide upper region 15 of the first ferromagnetic layer 11 into the oxide layer 13 prepared by having natural-oxidized the electrically conductive layer 12. As a result of the thermal diffusion of oxygen atoms, the oxide upper region 15 of the first ferromagnetic layer 11 is exactly reduced to form a reduction upper region 16 of the first ferromagnetic layer 11. Substantially all of the oxygen atoms in the oxide upper region 15 of the first ferromagnetic layer 11 are diffused into the oxide layer 13, whilst no oxygen atoms are, however, diffused from the oxide layer 13 to the reduction upper region 16 of the first ferromagnetic layer 11. Therefore, substantially no oxygen atoms remain in the reduction upper region 16 of the first ferromagnetic layer 11. The reduction upper region 16 exhibits the same ferromagnetic function and the same property as the first ferromagnetic layer 11, for which reason the reduction upper region 16 of the first ferromagnetic layer 11 is considered to be a part of the first ferromagnetic layer 11.

As a result of the thermal diffusion of oxygen, a first abrupt interface is formed between the reduction upper region 16 of the first ferromagnetic layer 11 and the oxide layer 13 serving as a tunnel barrier, wherein the first abrupt interface has such an extremely high abruptness as a monoatomic layer level like that a width of a boundary area between an oxygen atom containing region as the oxide layer 13 and an oxygen atom free region as the reduction upper region 16 of the first ferromagnetic layer 11 is substantially the same as a boundary between adjacent two monoatomic layers which are respectively present in the oxide layer 13 and the reduction upper region 16.

Figure 4D:
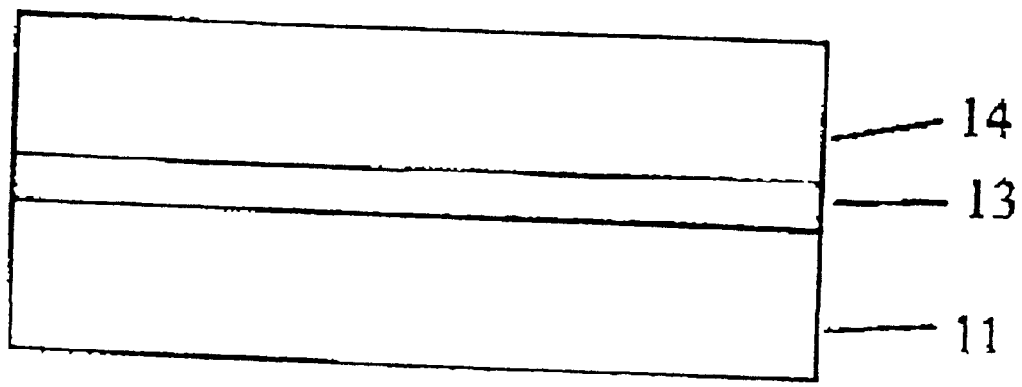

With reference to FIG. 4D, a second ferromagnetic layer 14 is grown on the oxide layer 13 so that the first and second ferromagnetic layers 11 and 14 sandwich the oxide layer 13 serving as a tunnel barrier. A ferromagnetic material for the second ferromagnetic layer 14 is selected to have a smaller formation free-energy per a single oxygen atom than that of the electrically conductive material of the electrically conductive layer 12, for which reason oxygen atoms are more thermally stable in the oxide layer 13 than in the second ferromagnetic layer 14. Therefore, no oxygen atoms are diffused from the oxide layer 13 to the second ferromagnetic layer 14. Therefore, substantially no oxygen atoms remain in the second ferromagnetic layer 14. As a result of the formation of the second ferromagnetic layer 14, a second abrupt interface is also formed between the second ferromagnetic layer 14 and the oxide layer 13 serving as a tunnel barrier, wherein the second abrupt interface has such an extremely high abruptness as a monoatomic layer level like that a width of a boundary area between an oxygen atom containing region as the oxide layer 13 and an oxygen atom free region as the second ferromagnetic layer 14 is substantially the same as a boundary between adjacent two monoatomic layers which are respectively present in the oxide layer 13 and the second ferromagnetic layer 14.

Namely, the oxide layer 13 forms a single tunnel barrier and has the first and second extremely high abrupt interfaces with the first and second ferromagnetic layers 11 and 14, wherein each of the first and second abrupt interfaces has such an extremely high abruptness as a monoatomic layer level like that a width of a boundary area between an oxygen atom containing region as the oxide layer 13 and an oxygen atom free region as the first or second ferromagnetic layer 11 or 14 is substantially the same as a boundary between adjacent two monoatomic layers which are respectively present in the oxide layer 13 and the first or second ferromagnetic layer 11 or 14.

An electrically conductive material for the electrically conductive layer 12 should preferably have a smaller surface free energy than that of a ferromagnetic material for the first and second ferromagnetic layers 11 and 14 for allowing the electrically conductive layer 12 to possess a good coverage characteristic to the first ferromagnetic layer 11. For this reason, Fe, Co, Ni and alloys thereof are available for the first and second ferromagnetic layers 11 and 14, whilst Al is available for the electrically conductive layer 12. Since the electrically conductive layer 12 has a smaller surface free energy than that of the ferromagnetic material for the first ferromagnetic layer 11 and possesses a good coverage, then the electrically conductive layer 12 is free of any pin holes, whereby the electrically conductive layer 12 is free from a problem with formation of an electrical short circuit between the first and second ferromagnetic layers 11 and 14 through any pin hole.

In addition, the electrically conductive material Al of the electrically conductive layer 12 has a larger formation free-energy per a single oxygen atom than that of the ferromagnetic material for the first and second ferromagnetic layers 11 and 14. The interfaces between the oxide layer 13 and the first and second ferromagnetic layers 11 and 14 are thermally stable.

As a modification to the above, Mg and lanthanoids are also available for the electrically conductive material for the electrically conductive layer 12.

Fourth Method

The fourth novel method in accordance with the present invention will be described with reference to FIGS. 5A through 5D which are fragmentary cross sectional elevation views in sequential steps involved in a fourth novel method of forming a tunnel barrier layer sandwiched between two ferromagnetic layers in a ferromagnetic tunnel junction device in accordance with the present invention.

Figure 5A:
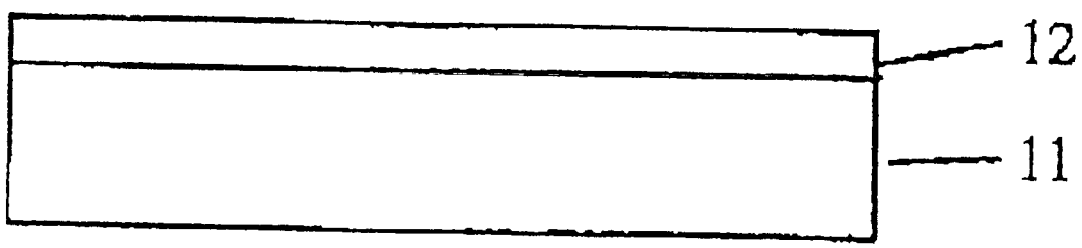
FIGS. 5A through 5D are fragmentary cross sectional elevation views in sequential steps involved in a fourth novel method of forming a tunnel barrier layer sandwiched between two ferromagnetic layers in a ferromagnetic tunnel junction device in accordance with the present invention.

With reference to FIG. 5A, a first ferromagnetic layer 11 is grown in a vacuum and subsequently an electrically conductive layer 12 is then grown on a surface of the first ferromagnetic layer 11 in the vacuum.

Figure 5B:
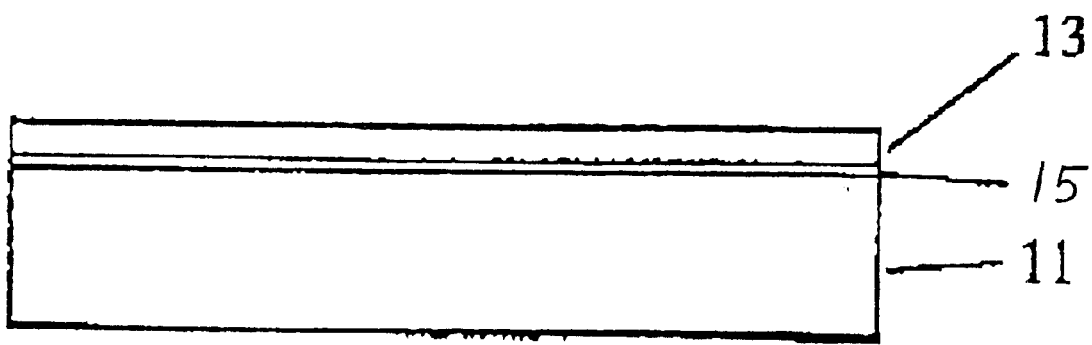

With reference to FIG. 5B, only a pure oxygen is introduced into the vacuum so that a surface of the electrically conductive layer 12 is subjected to the pure oxygen gas for causing an over-natural oxidation of the electrically conductive layer 12, whereby not only the electrically conductive layer 12 but also an upper region of the first ferromagnetic layer 11 are naturally oxidized. The over-natural oxidation is so conducted that both an entire part of the electrically conductive layer 12 is made into an oxide layer 13 as well as an upper region of the first ferromagnetic layer 11 is made into an oxide upper region 15 of the first ferromagnetic layer 11. An electrically conductive material of the electrically conductive layer 12 is selected to have a larger formation free-energy per a single oxygen atom than that of the ferromagnetic material for the first ferromagnetic layer 11. Oxygen atoms are more thermally stable in the electrically conductive layer 12 than in the first ferromagnetic layer 11.

Figure 5C:
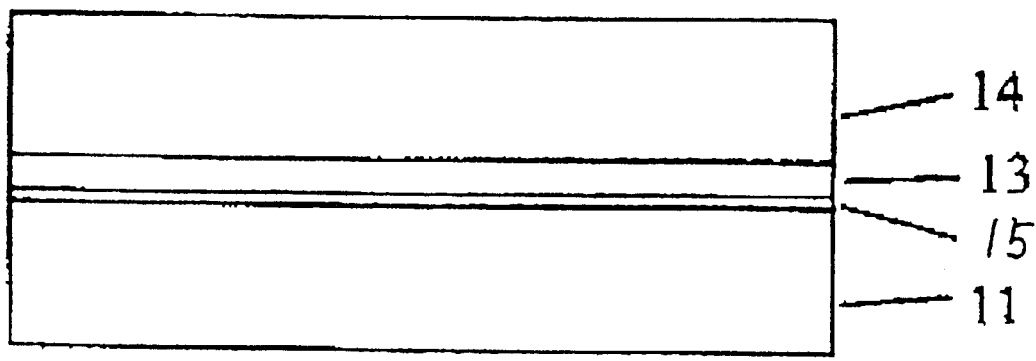

With reference to FIG. 5C, the pure oxygen gas is discharged before a second ferromagnetic layer 14 is grown on the oxide layer 13 so that the first and second ferromagnetic layers 11 and 14 sandwich the oxide layer 13 serving as a tunnel barrier. A ferromagnetic material for the second ferromagnetic layer 14 is selected to have a smaller formation free-energy per a single oxygen atom than that of the electrically conductive material of the electrically conductive layer 12, for which reason oxygen atoms are more thermally stable in the oxide layer 13 than in the second ferromagnetic layer 14. Therefore, no oxygen atoms are diffused from the oxide layer 13 to the second ferromagnetic layer 14. Therefore, substantially no oxygen atoms remain in the second ferromagnetic layer 14. As a result of the formation of the second ferromagnetic layer 14, a second abrupt interface is also formed between the second ferromagnetic layer 14 and the oxide layer 13 serving as a tunnel barrier, wherein the second abrupt interface has such an extremely high abruptness as a monoatomic layer level like that a width of a boundary area between an oxygen atom containing region as the oxide layer 13 and an oxygen atom free region as the second ferromagnetic layer 14 is substantially the same as a boundary between adjacent two monoatomic layers which are respectively present in the oxide layer 13 and the second ferromagnetic layer 14.

Figure 5D:
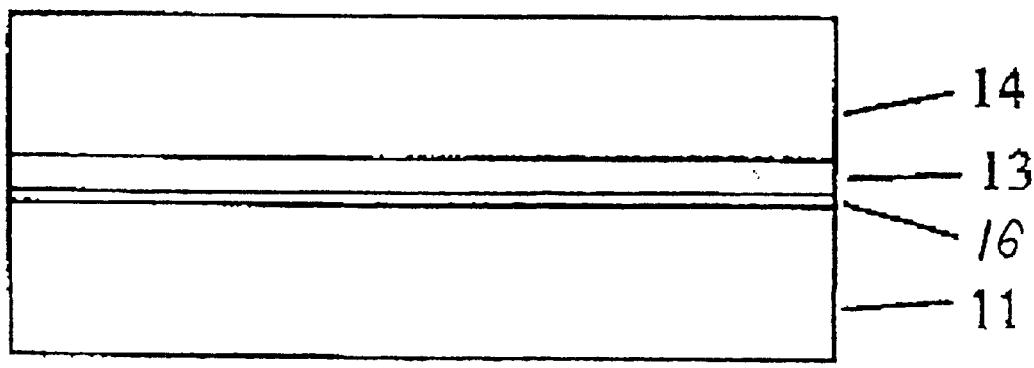

With reference to FIG. 5D, a heat treatment is carried out to the laminations of the first and second ferromagnetic layer 14, the oxide layer 13 and the oxide upper region 15 of the first ferromagnetic layer 11. As described above, the electrically conductive material of the electrically conductive layer 12 is selected to have a larger formation free-energy per a single oxygen atom than that of the ferromagnetic material for the first ferromagnetic layer 11, for which reason oxygen atoms are more thermally stable in the electrically conductive layer 12 than in the first ferromagnetic layer 11. Therefore, the heat treatment is so carried out as to cause a thermal diffusion of oxygen from the oxide upper region 15 of the first ferromagnetic layer 11 into the oxide layer 13 prepared by having natural-oxidized the electrically conductive layer 12. As a result of the thermal diffusion of oxygen atoms, the oxide upper region 15 of the first ferromagnetic layer 11 is exactly reduced to form a reduction upper region 16 of the first ferromagnetic layer 11. Substantially all of the oxygen atoms in the oxide upper region 15 of the first ferromagnetic layer 11 are diffused into the oxide layer 13, whilst no oxygen atoms are, however, diffused from the oxide layer 13 to the reduction upper region 16 of the first ferromagnetic layer 11. Therefore, substantially no oxygen atoms remain in the reduction upper region 16 of the first ferromagnetic layer 11. The reduction upper region 16 exhibits the same ferromagnetic function and the same property as the first ferromagnetic layer 11, for which reason the reduction upper region 16 of the first ferromagnetic layer 11 is considered to be a part of the first ferromagnetic layer 11.

As a result of the thermal diffusion of oxygen, a first abrupt interface is formed between the reduction upper region 16 of the first ferromagnetic layer 11 and the oxide layer 13 serving as a tunnel barrier, wherein the first abrupt interface has such an extremely high abruptness as a monoatomic layer level like that a width of a boundary area between an oxygen atom containing region as the oxide layer 13 and an oxygen atom free region as the reduction upper region 16 of the first ferromagnetic layer 11 is substantially the same as a boundary between adjacent two monoatomic layers which are respectively present in the oxide layer 13 and the reduction upper region 16.

Namely, the oxide layer 13 forms a single tunnel barrier and has the first and second extremely high abrupt interfaces with the first and second ferromagnetic layers 11 and 14, wherein each of the first and second abrupt interfaces has such an extremely high abruptness as a monoatomic layer level like that a width of a boundary area between an oxygen atom containing region as the oxide layer 13 and an oxygen atom free region as the first or second ferromagnetic layer 11 or 14 is substantially the same as a boundary between adjacent two monoatomic layers which are respectively present in the oxide layer 13 and the first or second ferromagnetic layer 11 or 14.

An electrically conductive material for the electrically conductive layer 12 should preferably have a smaller surface free energy than that of a ferromagnetic material for the first and second ferromagnetic layers 11 and 14 for allowing the electrically conductive layer 12 to possess a good coverage characteristic to the first ferromagnetic layer 11. For this reason, Fe, Co, Ni and alloys thereof are available for the first and second ferromagnetic layers 11 and 14, whilst Al is available for the electrically conductive layer 12. Since the electrically conductive layer 12 has a smaller surface free energy than that of the ferromagnetic material for the first ferromagnetic layer 11 and possesses a good coverage, then the electrically conductive layer 12 is free of any pin holes, whereby the electrically conductive layer 12 is free from a problem with formation of an electrical short circuit between the first and second ferromagnetic layers 11 and 14 through any pin hole.

In addition, the electrically conductive material Al of the electrically conductive layer 12 has a larger formation free-energy per a single oxygen atom than that of the ferromagnetic material for the first and second ferromagnetic layers 11 and 14. The interfaces between the oxide layer 13 and the first and second ferromagnetic layers 11 and 14 are thermally stable.

As a modification to the above, Mg and lanthanoids are also available for the electrically conductive material for the electrically conductive layer 12.

Fifth Method

The fifth novel method in accordance with the present invention will be described with reference to FIGS. 6A through 6E which are fragmentary cross sectional elevation views in sequential steps involved in a fifth novel method of forming a tunnel barrier layer sandwiched between two ferromagnetic layers in a ferromagnetic tunnel junction device in accordance with the present invention.

Figure 6A:
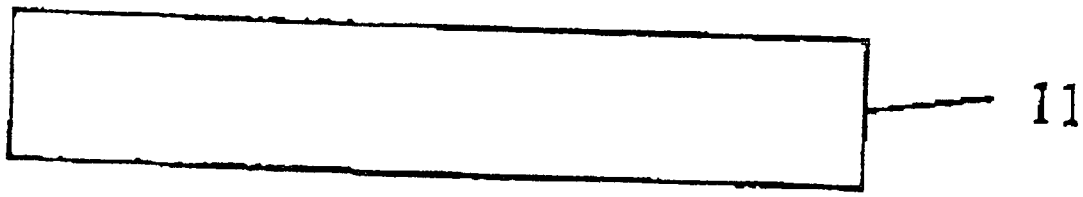
FIGS. 6A through 6E are fragmentary cross sectional elevation views in sequential steps involved in a fifth novel method of forming a tunnel barrier layer sandwiched between two ferromagnetic layers in a ferromagnetic tunnel junction device in accordance with the present invention.

With reference to FIG. 6A, a first ferromagnetic layer 11 is grown in a vacuum in a vacuum.

Figure 6B:
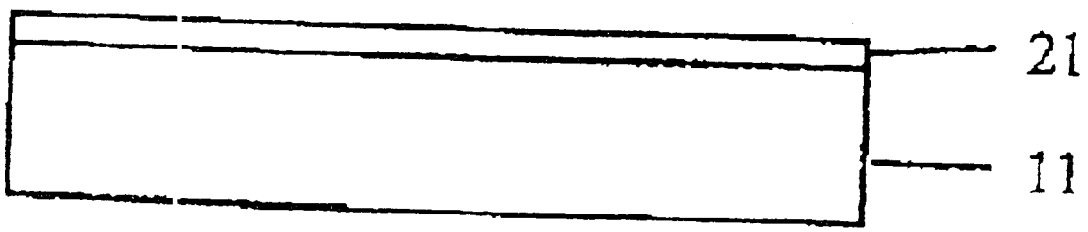

With reference to FIG. 6B, only a pure oxygen is introduced into the vacuum so that a surface of the first ferromagnetic layer 11 is subjected to the pure oxygen gas for causing a natural oxidation of the first ferromagnetic layer 11, whereby an upper region of the first ferromagnetic layer 11 is naturally oxidized. The natural oxidation is so conducted that an upper region of the first ferromagnetic layer 11 is made into an oxide upper region 21 of the first ferromagnetic layer 11.

Figure 6C:
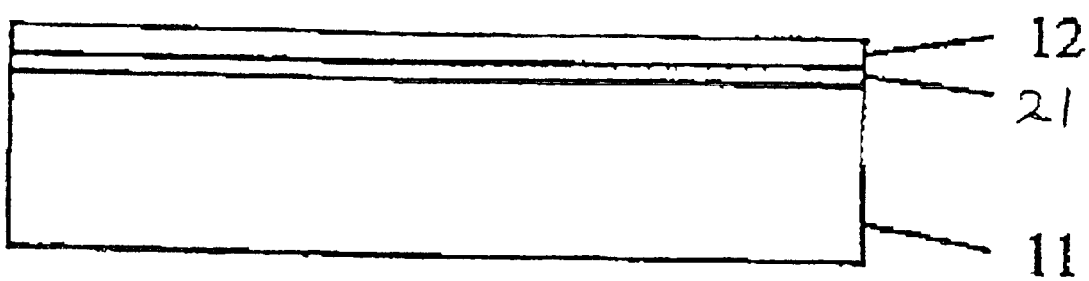

With reference to FIG. 6C, the pure oxygen gas is discharged before an electrically conductive layer 12 is grown in a vacuum on the oxide upper region 21 of the first ferromagnetic layer 11. An electrically conductive material of the electrically conductive layer 12 is selected to have a larger formation free-energy per a single oxygen atom than that of the ferromagnetic material for the first ferromagnetic layer 11. Oxygen atoms are more thermally stable in the electrically conductive layer 12 than in the oxide upper region 21 of the first ferromagnetic layer 11.

Figure 6D:
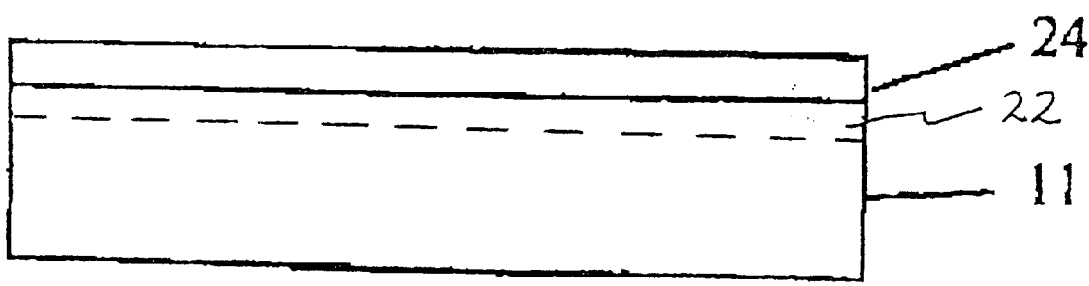

With reference to FIG. 6D, a heat treatment is carried out to the laminations of the first ferromagnetic layer 11, the electrically conductive layer 12 and the oxide upper region 21 of the first ferromagnetic layer 11. As described above, the electrically conductive material of the electrically conductive layer 12 is selected to have a larger formation free-energy per a single oxygen atom than that of the ferromagnetic material for the first ferromagnetic layer 11, for which reason oxygen atoms are more thermally stable in the electrically conductive layer 12 than in the oxide upper region 21 of the first ferromagnetic layer 11. Therefore, the heat treatment is so carried out as to cause a thermal diffusion of oxygen from the oxide upper region 21 of the first ferromagnetic layer 11 into the electrically conductive layer 12, whereby an entire part of the electrically conductive layer 12 is oxidized by the thermal diffusion of oxygen. As a result of the thermal diffusion of oxygen atoms, the electrically conductive layer 12 is made into an oxide layer 24, whilst the oxide upper region 21 of the first ferromagnetic layer 11 is exactly reduced to form a reduction upper region 22 of the first ferromagnetic layer 11. Substantially all of the oxygen atoms in the oxide upper region 21 of the first ferromagnetic layer 11 are diffused into the electrically conductive layer 12, whilst no oxygen atoms are, however, diffused from the oxide layer 24 to the reduction upper region 22 of the first ferromagnetic layer 11. Therefore, substantially no oxygen atoms remain in the reduction upper region 22 of the first ferromagnetic layer 11. The reduction upper region 22 exhibits the same ferromagnetic function and the same property as the first ferromagnetic layer 11, for which reason the reduction upper region 22 of the first ferromagnetic layer 11 is considered to be a part of the first ferromagnetic layer 11.

As a result of the thermal diffusion of oxygen, a first abrupt interface is formed between the reduction upper region 22 of the first ferromagnetic layer 11 and the oxide layer 24 serving as a tunnel barrier, wherein the first abrupt interface has such an extremely high abruptness as a monoatomic layer level like that a width of a boundary area between an oxygen atom containing region as the oxide layer 24 and an oxygen atom free region as the reduction upper region 21 of the first ferromagnetic layer 11 is substantially the same as a boundary between adjacent two monoatomic layers which are respectively present in the oxide layer 24 and the reduction upper region 21.

Figure 6E:
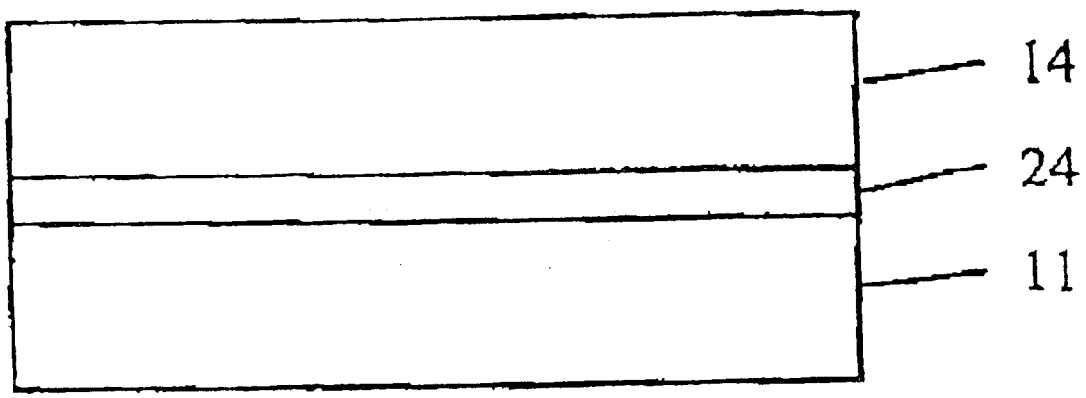

With reference to FIG. 6E, a second ferromagnetic layer 14 is grown on the oxide layer 24 so that the first and second ferromagnetic layers 11 and 14 sandwich the oxide layer 24 serving as a tunnel barrier. A ferromagnetic material for the second ferromagnetic layer 14 is selected to have a smaller formation free-energy per a single oxygen atom than that of the electrically conductive material of the electrically conductive layer 12, for which reason oxygen atoms are more thermally stable in the oxide layer 24 than in the second ferromagnetic layer 14. Therefore, no oxygen atoms are diffused from the oxide layer 24 to the second ferromagnetic layer 14. Therefore, substantially no oxygen atoms remain in the second ferromagnetic layer 14. As a result of the formation of the second ferromagnetic layer 14, a second abrupt interface is also formed between the second ferromagnetic layer 14 and the oxide layer 24 serving as a tunnel barrier, wherein the second abrupt interface has such an extremely high abruptness as a monoatomic layer level like that a width of a boundary area between an oxygen atom containing region as the oxide layer 24 and an oxygen atom free region as the second ferromagnetic layer 14 is substantially the same as a boundary between adjacent two monoatomic layers which are respectively present in the oxide layer 24 and the second ferromagnetic layer 14.

Namely, the oxide layer 24 forms a single tunnel barrier and has the first and second extremely high abrupt interfaces with the first and second ferromagnetic layers 11 and 14, wherein each of the first and second abrupt interfaces has such an extremely high abruptness as a monoatomic layer level like that a width of a boundary area between an oxygen atom containing region as the oxide layer 24 and an oxygen atom free region as the first or second ferromagnetic layer 11 or 14 is substantially the same as a boundary between adjacent two monoatomic layers which are respectively present in the oxide layer 24 and the first or second ferromagnetic layer 11 or 14.

An electrically conductive material for the electrically conductive layer 12 should preferably have a smaller surface free energy than that of a ferromagnetic material for the first and second ferromagnetic layers 11 and 14 for allowing the electrically conductive layer 12 to possess a good coverage characteristic to the first ferromagnetic layer 11. For this reason, Fe, Co, Ni and alloys thereof are available for the first and second ferromagnetic layers 11 and 14, whilst Al is available for the electrically conductive layer 12. Since the electrically conductive layer 12 has a smaller surface free energy than that of the ferromagnetic material for the first ferromagnetic layer 11 and possesses a good coverage, then the electrically conductive layer 12 is free of any pin holes, whereby the electrically conductive layer 12 is free from a problem with formation of an electrical short circuit between the first and second ferromagnetic layers 11 and 14 through any pin hole.

In addition, the electrically conductive material Al of the electrically conductive layer 12 has a larger formation free-energy per a single oxygen atom than that of the ferromagnetic material for the first and second ferromagnetic layers 11 and 14. The interfaces between the oxide layer 24 and the first and second ferromagnetic layers 11 and 14 are thermally stable.

As a modification to the above, Mg and lanthanoids are also available for the electrically conductive material for the electrically conductive layer 12.

Sixth Method

The sixth novel method in accordance with the present invention will be described with reference to FIGS. 7A through 7F which are fragmentary cross sectional elevation views in sequential steps involved in a sixth novel method of forming a tunnel barrier layer sandwiched between two ferromagnetic layers in a ferromagnetic tunnel junction device in accordance with the present invention.

Figure 7A:
FIGS. 7A through 7F are fragmentary cross sectional elevation views in sequential steps involved in a sixth novel method of forming a tunnel barrier layer sandwiched between two ferromagnetic layers in a ferromagnetic tunnel junction device in accordance with the present invention.

With reference to FIG. 7A, a first ferromagnetic layer 11 is grown in a vacuum in a vacuum.

Figure 7B:
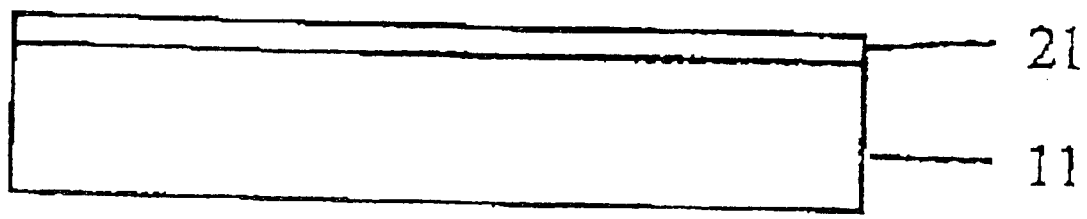

With reference to FIG. 7B, only a pure oxygen is introduced into the vacuum so that a surface of the first ferromagnetic layer 11 is subjected to the pure oxygen gas for causing a natural oxidation of the first ferromagnetic layer 11, whereby an upper region of the first ferromagnetic layer 11 is naturally oxidized. The natural oxidation is so conducted that an upper region of the first ferromagnetic layer 11 is made into an oxide upper region 21 of the first ferromagnetic layer 11.

Figure 7C:
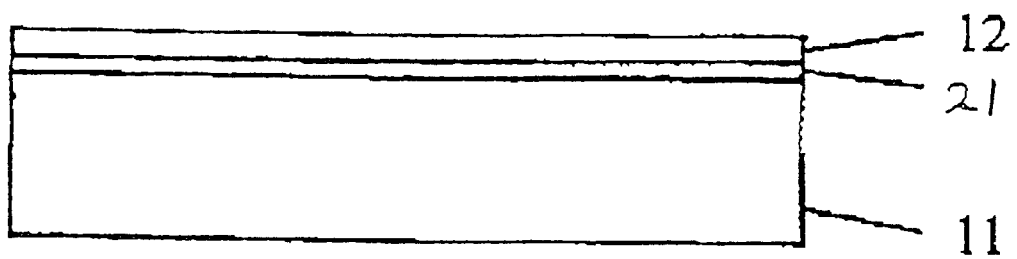

With reference to FIG. 7C, the pure oxygen gas is discharged before an electrically conductive layer 12 is grown in a vacuum on the oxide upper region 21 of the first ferromagnetic layer 11. An electrically conductive material of the electrically conductive layer 12 is selected to have a larger formation free-energy per a single oxygen atom than that of the ferromagnetic material for the first ferromagnetic layer 11. Oxygen atoms are more thermally stable in the electrically conductive layer 12 than in the oxide upper region 21 of the first ferromagnetic layer 11.

Figure 7D:
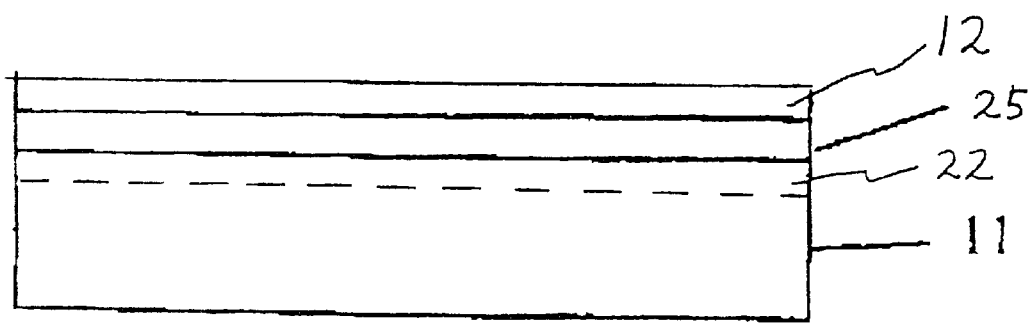

With reference to FIG. 7D, a heat treatment is carried out to the laminations of the first ferromagnetic layer 11, the electrically conductive layer 12 and the oxide upper region 21 of the first ferromagnetic layer 11. As described above, the electrically conductive material of the electrically conductive layer 12 is selected to have a larger formation free-energy per a single oxygen atom than that of the ferromagnetic material for the first ferromagnetic layer 11, for which reason oxygen atoms are more thermally stable in the electrically conductive layer 12 than in the oxide upper region 21 of the first ferromagnetic layer 11. Therefore, the heat treatment is so carried out as to cause a thermal diffusion of oxygen from the oxide upper region 21 of the first ferromagnetic layer 11 into the electrically conductive layer 12, whereby only a lower region of the electrically conductive layer 12 is selectively oxidized by the thermal diffusion of oxygen. As a result of the thermal diffusion of oxygen atoms, only the lower region of the electrically conductive layer 12 is made into a lower oxide layer 25, whilst the oxide upper region 21 of the first ferromagnetic layer 11 is exactly reduced to form a reduction upper region 22 of the first ferromagnetic layer 11. Thus, the lower oxide layer 25 is formed over the reduction upper region 22 of the first ferromagnetic layer 11. Substantially all of the oxygen atoms in the oxide upper region 21 of the first ferromagnetic layer 11 are diffused into the lower region of the electrically conductive layer 12, whilst no oxygen atoms are, however, diffused from the lower oxide layer 25 to the reduction upper region 22 of the first ferromagnetic layer 11. Therefore, substantially no oxygen atoms remain in the reduction upper region 22 of the first ferromagnetic layer 11. The reduction upper region 22 exhibits the same ferromagnetic function and the same property as the first ferromagnetic layer 11, for which reason the reduction upper region 22 of the first ferromagnetic layer 11 is considered to be a part of the first ferromagnetic layer 11.

As a result of the thermal diffusion of oxygen, a first abrupt interface is formed between the reduction upper region 22 of the first ferromagnetic layer 11 and the lower oxide layer 25 serving as a lower tunnel barrier, wherein the first abrupt interface has such an extremely high abruptness as a monoatomic layer level like that a width of a boundary area between an oxygen atom containing region as the lower oxide layer 25 and an oxygen atom free region as the reduction upper region 22 of the first ferromagnetic layer 11 is substantially the same as a boundary between adjacent two monoatomic layers which are respectively present in the lower oxide layer 25 and the reduction upper region 22 of the first ferromagnetic layer 11.

Figure 7E:
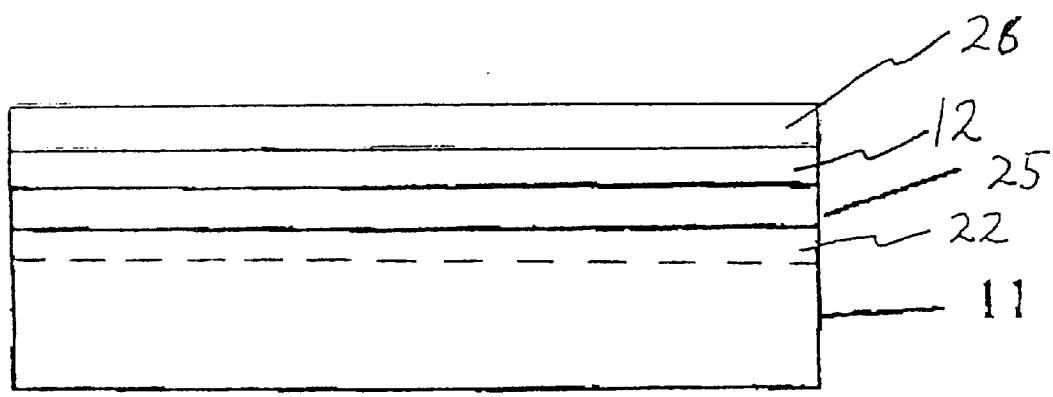

With reference to FIG. 7E, a pure oxygen is introduced into a vacuum to prepare a pure oxygen gas before the remaining electrically conductive layer 12 is subjected to the pure oxygen gas to cause a natural oxidation of only an upper region of the remaining electrically conductive layer 12, whereby only the upper region of the remaining electrically conductive layer 12 is made into an upper oxide layer 26 serving as an upper tunnel barrier, whilst an intermediate region of the originally formed electrically conductive layer 12 finally remains as the intermediate electrically conductive layer 12. As a result of the natural oxidation, the upper oxide layer 26 is formed over the intermediate electrically conductive layer 12 extending over the lower oxide layer 25. Namely, the intermediate electrically conductive layer 12 is sandwiched between the lower oxide layer 25 and the upper oxide layer 26. The lower oxide layer 25 and the upper oxide layer 26 form double tunnel barriers whilst the intermediate electrically conductive layer 12 forms a single potential well, thereby to form double tunnel barriers and a single potential well defined between the double tunnel barriers.

Figure 7F:
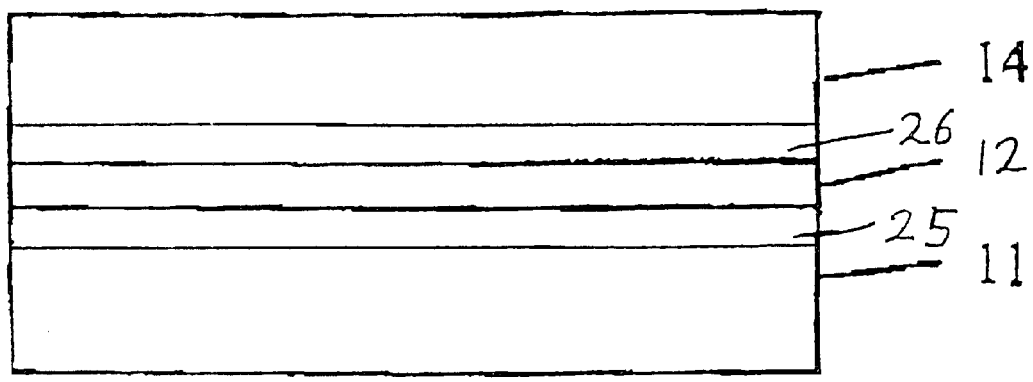

With reference to FIG. 7F, the oxygen gas is discharged before a second ferromagnetic layer 14 is grown on the upper oxide layer 26 so that the first and second ferromagnetic layers 11 and 14 sandwich laminations of the lower oxide layer 25, the intermediate electrically conductive layer 12 and the upper oxide layer 26. A ferromagnetic material for the second ferromagnetic layer 14 is selected to have a smaller formation free-energy per a single oxygen atom than that of the electrically conductive material of the electrically conductive layer 12, for which reason oxygen atoms are more thermally stable in the upper oxide layer 26 than in the second ferromagnetic layer 14. Therefore, no oxygen atoms are diffused from the upper oxide layer 26 to the second ferromagnetic layer 14. Therefore, substantially no oxygen atoms remain in the second ferromagnetic layer 14. As a result of the formation of the second ferromagnetic layer 14, a second abrupt interface is also formed between the second ferromagnetic layer 14 and the upper oxide layer 26 serving as the upper tunnel barrier, wherein the second abrupt interface has such an extremely high abruptness as a monoatomic layer level like that a width of a boundary area between an oxygen atom containing region as the upper oxide layer 26 and an oxygen atom free region as the second ferromagnetic layer 14 is substantially the same as a boundary between adjacent two monoatomic layers which are respectively present in the upper oxide layer 26 and the second ferromagnetic layer 14.

Namely, the lower and upper oxide layers 25 and 26 form double tunnel barriers and have the first and second extremely high abrupt interfaces with the first and second ferromagnetic layers 11 and 14 respectively, wherein each of the first and second abrupt interfaces has such an extremely high abruptness as a monoatomic layer level like that a width of a boundary area between an oxygen atom containing region as the lower and upper oxide layers 25 and 26 and an oxygen atom free region as the first or second ferromagnetic layer 11 or 14 is substantially the same as a boundary between adjacent two monoatomic layers which are respectively present in the lower or upper oxide layer 25 or 26 and the first or second ferromagnetic layer 11 or 14.

An electrically conductive material for the electrically conductive layer 12 should preferably have a smaller surface free energy than that of a ferromagnetic material for the first and second ferromagnetic layers 11 and 14 for allowing the electrically conductive layer 12 to possess a good coverage characteristic to the first ferromagnetic layer 11. For this reason, Fe, Co, Ni and alloys thereof are available for the first and second ferromagnetic layers 11 and 14, whilst Al is available for the electrically conductive layer 12. Since the electrically conductive layer 12 has a smaller surface free energy than that of the ferromagnetic material for the first ferromagnetic layer 11 and possesses a good coverage, then the electrically conductive layer 12 is free of any pin holes, whereby the electrically conductive layer 12 is free from a problem with formation of an electrical short circuit between the first and second ferromagnetic layers 11 and 14 through any pin hole.

In addition, the electrically conductive material Al of the electrically conductive layer 12 has a larger formation free-energy per a single oxygen atom than that of the ferromagnetic material for the first and second ferromagnetic layers 11 and 14. The first and second interfaces between the lower and upper oxide layers 25 and 26 and the first and second ferromagnetic layers 11 and 14 are thermally stable.

As a modification to the above, Mg and lanthanoids are also available for the electrically conductive material for the electrically conductive layer 12.

Seventh Method

The seventh novel method in accordance with the present invention will be described with reference to FIGS. 8A through 8F which are fragmentary cross sectional elevation views in sequential steps involved in a seventh novel method of forming a tunnel barrier layer sandwiched between two ferromagnetic layers in a ferromagnetic tunnel junction device in accordance with the present invention.

Figure 8A:
FIGS. 8A through 8F are fragmentary cross sectional elevation views in sequential steps involved in a seventh novel method of forming a tunnel barrier layer sandwiched between two ferromagnetic layers in a ferromagnetic tunnel junction device in accordance with the present invention.

With reference to FIG. 8A, a first ferromagnetic layer 11 is grown in a vacuum in a vacuum.

Figure 8B:
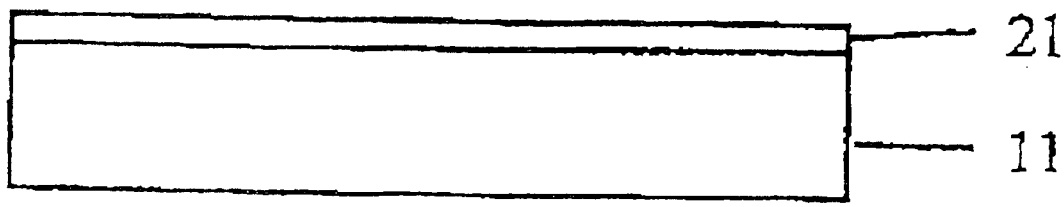

With reference to FIG. 8B, only a pure oxygen is introduced into the vacuum so that a surface of the first ferromagnetic layer 11 is subjected to the pure oxygen gas for causing a natural oxidation of the first ferromagnetic layer 11, whereby an upper region of the first ferromagnetic layer 11 is naturally oxidized. The natural oxidation is so conducted that an upper region of the first ferromagnetic layer 11 is made into an oxide upper region 21 of the first ferromagnetic layer 11.

Figure 8C:
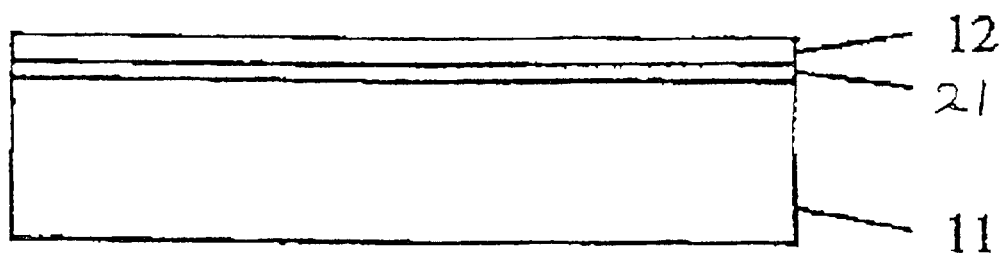

With reference to FIG. 8C, the pure oxygen gas is discharged before an electrically conductive layer 12 is grown in a vacuum on the oxide upper region 21 of the first ferromagnetic layer 11. An electrically conductive material of the electrically conductive layer 12 is selected to have a larger formation free-energy per a single oxygen atom than that of the ferromagnetic material for the first ferromagnetic layer 11. Oxygen atoms are more thermally stable in the electrically conductive layer 12 than in the oxide upper region 21 of the first ferromagnetic layer 11.

Figure 8D:
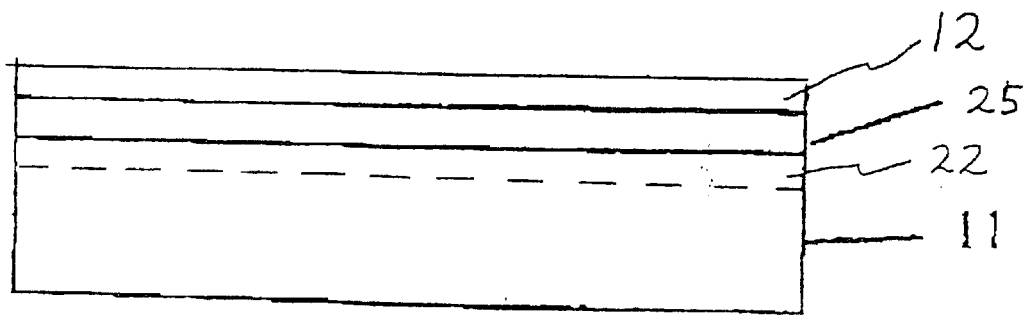

With reference to FIG. 8D, a heat treatment is carried out to the laminations of the first ferromagnetic layer 11, the electrically conductive layer 12 and the oxide upper region 21 of the first ferromagnetic layer 11. As described above, the electrically conductive material of the electrically conductive layer 12 is selected to have a larger formation free-energy per a single oxygen atom than that of the ferromagnetic material for the first ferromagnetic layer 11, for which reason oxygen atoms are more thermally stable in the electrically conductive layer 12 than in the oxide upper region 21 of the first ferromagnetic layer 11. Therefore, the heat treatment is so carried out as to cause a thermal diffusion of oxygen from the oxide upper region 21 of the first ferromagnetic layer 11 into the electrically conductive layer 12, whereby only a lower region of the electrically conductive layer 12 is selectively oxidized by the thermal diffusion of oxygen. As a result of the thermal diffusion of oxygen atoms, only the lower region of the electrically conductive layer 12 is made into a lower oxide layer 25, whilst the oxide upper region 21 of the first ferromagnetic layer 11 is exactly reduced to form a reduction upper region 22 of the first ferromagnetic layer 11. Thus, the lower oxide layer 25 is formed over the reduction upper region 22 of the first ferromagnetic layer 11. The lower oxide layer 25 forms a lower tunnel barrier. Substantially all of the oxygen atoms in the oxide upper region 21 of the first ferromagnetic layer 11 are diffused into the lower region of the electrically conductive layer 12, whilst no oxygen atoms are, however, diffused from the lower oxide layer 25 to the reduction upper region 22 of the first ferromagnetic layer 11. Therefore, substantially no oxygen atoms remain in the reduction upper region 22 of the first ferromagnetic layer 11. The reduction upper region 22 exhibits the same ferromagnetic function and the same property as the first ferromagnetic layer 11, for which reason the reduction upper region 22 of the first ferromagnetic layer 11 is considered to be a part of the first ferromagnetic layer 11.

As a result of the thermal diffusion of oxygen, a first abrupt interface is formed between the reduction upper region 22 of the first ferromagnetic layer 11 and the lower oxide layer 25 serving as a lower tunnel barrier, wherein the first abrupt interface has such an extremely high abruptness as a monoatomic layer level like that a width of a boundary area between an oxygen atom containing region as the oxide layer 24 and an oxygen atom free region as the reduction upper region 22 of the first ferromagnetic layer 11 is substantially the same as a boundary between adjacent two monoatomic layers which are respectively present in the lower oxide layer 25 and the reduction upper region 21 of the first ferromagnetic layer 11.

Figure 8E:
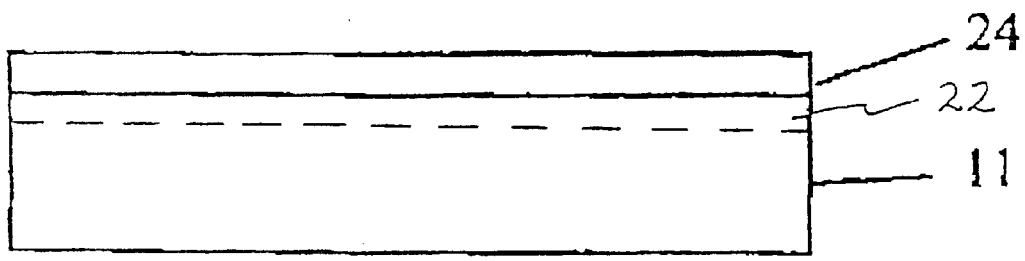

With reference to FIG. 8E, a pure oxygen is introduced into a vacuum to prepare a pure oxygen gas before the remaining electrically conductive layer 12 is subjected to the pure oxygen gas to cause a natural oxidation of an entire region of the remaining electrically conductive layer 12, whereby an entire part region of the remaining electrically conductive layer 12 and the lower oxide layer 25 are made into an intermediate oxide layer 24 serving as a single tunnel barrier. As a result of the natural oxidation, the intermediate oxide layer 24 is formed over the reduction upper region 22 of the first ferromagnetic layer 11. The intermediate oxide layer 24 forms a single tunnel barrier.

Figure 8F:
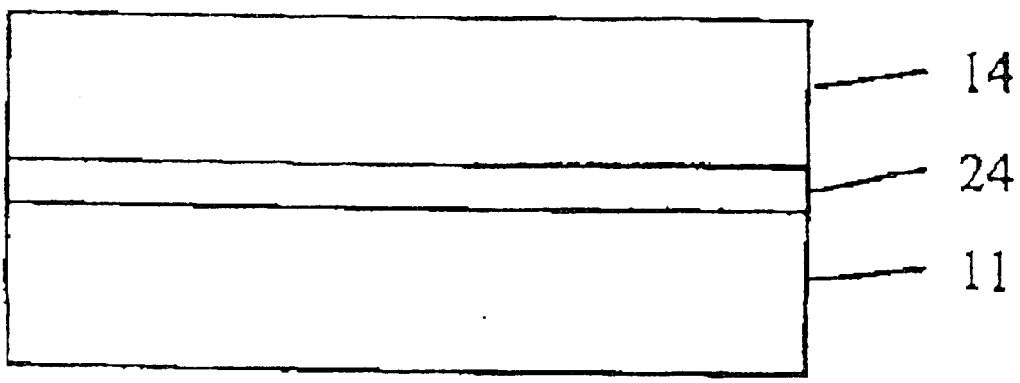

With reference to FIG. 8F, a second ferromagnetic layer 14 is grown on the intermediate oxide layer 24 so that the first and second ferromagnetic layers 11 and 14 sandwich the intermediate oxide layer 24 forming the single tunnel barrier. A ferromagnetic material for the second ferromagnetic layer 14 is selected to have a smaller formation free-energy per a single oxygen atom than that of the electrically conductive material of the electrically conductive layer 12, for which reason oxygen atoms are more thermally stable in the oxide layer 24 than in the second ferromagnetic layer 14. Therefore, no oxygen atoms are diffused from the oxide layer 24 to the second ferromagnetic layer 14. Therefore, substantially no oxygen atoms remain in the second ferromagnetic layer 14. As a result of the formation of the second ferromagnetic layer 14, a second abrupt interface is also formed between the second ferromagnetic layer 14 and the oxide layer 24 serving as the upper tunnel barrier, wherein the second abrupt interface has such an extremely high abruptness as a monoatomic layer level like that a width of a boundary area between an oxygen atom containing region as the oxide layer 24 and an oxygen atom free region as the second ferromagnetic layer 14 is substantially the same as a boundary between adjacent two monoatomic layers which are respectively present in the oxide layer 24 and the second ferromagnetic layer 14.

Namely, the intermediate oxide layer 24 forms a single tunnel barrier and has the first and second extremely high abrupt interfaces with the first and second ferromagnetic layers 11 and 14 respectively, wherein each of the first and second abrupt interfaces has such an extremely high abruptness as a monoatomic layer level like that a width of a boundary area between an oxygen atom containing region as the oxide layer 24 and an oxygen atom free region as the first or second ferromagnetic layer 11 or 14 is substantially the same as a boundary between adjacent two monoatomic layers which are respectively present in the oxide layer 24 and the first or second ferromagnetic layer 11 or 14.

An electrically conductive material for the electrically conductive layer 12 should preferably have a smaller surface free energy than that of a ferromagnetic material for the first and second ferromagnetic layers 11 and 14 for allowing the electrically conductive layer 12 to possess a good coverage characteristic to the first ferromagnetic layer 11. For this reason, Fe, Co, Ni and alloys thereof are available for the first and second ferromagnetic layers 11 and 14, whilst Al is available for the electrically conductive layer 12. Since the electrically conductive layer 12 has a smaller surface free energy than that of the ferromagnetic material for the first ferromagnetic layer 11 and possesses a good coverage, then the electrically conductive layer 12 is free of any pin holes, whereby the electrically conductive layer 12 is free from a problem with formation of an electrical short circuit between the first and second ferromagnetic layers 11 and 14 through any pin hole.

In addition, the electrically conductive material Al of the electrically conductive layer 12 has a larger formation free-energy per a single oxygen atom than that of the ferromagnetic material for the first and second ferromagnetic layers 11 and 14. The first and second interfaces between the oxide layer 24 and the first and second ferromagnetic layers 11 and 14 are thermally stable.

As a modification to the above, Mg and lanthanoids are also available for the electrically conductive material for the electrically conductive layer 12.

Eighth Method

The eighth novel method in accordance with the present invention will be described with reference to FIGS. 9A through 9E which are fragmentary cross sectional elevation views in sequential steps involved in an eighth novel method of forming a tunnel barrier layer sandwiched between two ferromagnetic layers in a ferromagnetic tunnel junction device in accordance with the present invention.

Figure 9A:
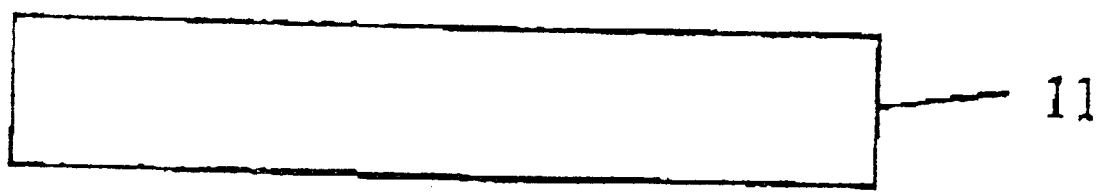
FIGS. 9A through 9E are fragmentary cross sectional elevation views in sequential steps involved in an eighth novel method of forming a tunnel barrier layer sandwiched between two ferromagnetic layers in a ferromagnetic tunnel junction device in accordance with the present invention.

With reference to FIG. 9A, a first ferromagnetic layer 11 is grown in a vacuum in a vacuum.

Figure 9B:
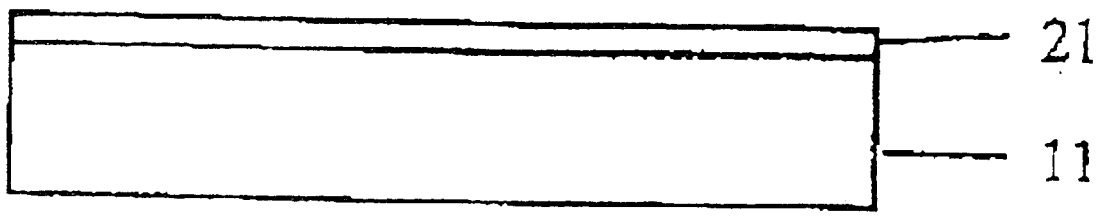

With reference to FIG. 9B, only a pure oxygen is introduced into the vacuum so that a surface of the first ferromagnetic layer 11 is subjected to the pure oxygen gas for causing a natural oxidation of the first ferromagnetic layer 11, whereby an upper region of the first ferromagnetic layer 11 is naturally oxidized. The natural oxidation is so conducted that an upper region of the first ferromagnetic layer 11 is made into an oxide upper region 21 of the first ferromagnetic layer 11.

Figure 9C:
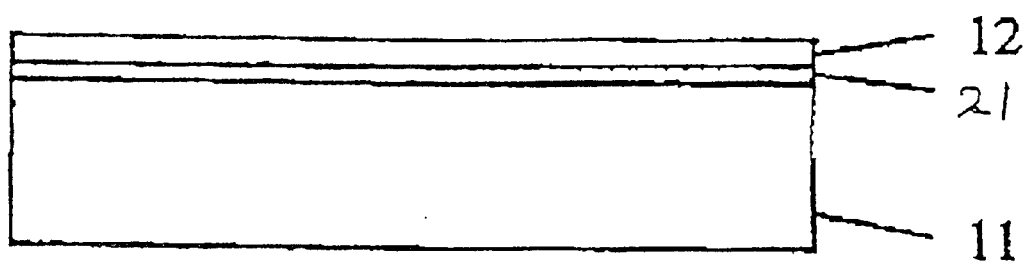

With reference to FIG. 9C, the pure oxygen gas is discharged before an electrically conductive layer 12 is grown in a vacuum on the oxide upper region 21 of the first ferromagnetic layer 11. An electrically conductive material of the electrically conductive layer 12 is selected to have a larger formation free-energy per a single oxygen atom than that of the ferromagnetic material for the first ferromagnetic layer 11. Oxygen atoms are more thermally stable in the electrically conductive layer 12 than in the oxide upper region 21 of the first ferromagnetic layer 11.

Figure 9D:
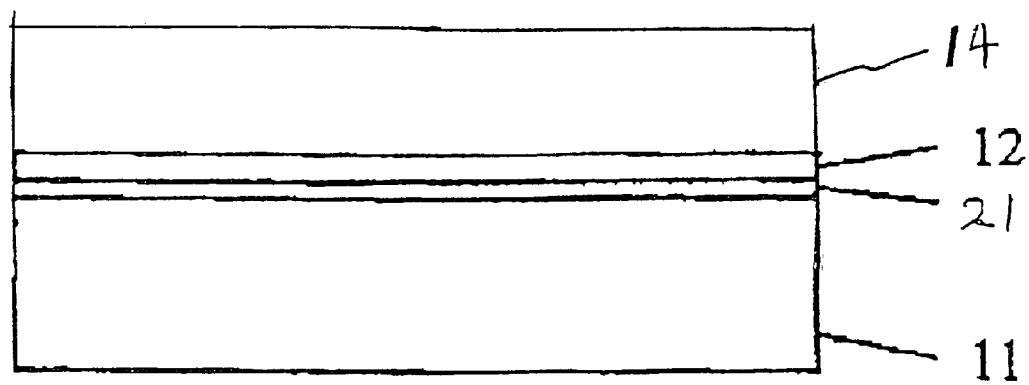

With reference to FIG. 9D, the oxygen gas is discharged before a second ferromagnetic layer 14 is grown on the electrically conductive layer 12 so that the first and second ferromagnetic layers 11 and 14 sandwich the electrically conductive layer 12. A ferromagnetic material for the second ferromagnetic layer 14 is selected to have a smaller formation free-energy per a single oxygen atom than that of the electrically conductive material of the electrically conductive layer 12, for which reason oxygen atoms are more thermally stable in the electrically conductive layer 12 than in the second ferromagnetic layer 14.

Figure 9E:
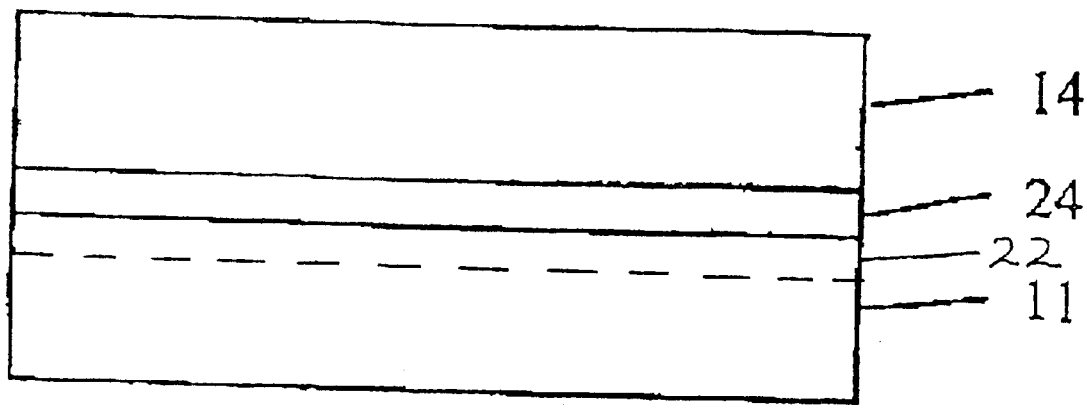

With reference to FIG. 9E, a heat treatment is carried out to the laminations of the first and second ferromagnetic layers 11 and 14, the electrically conductive layer 12 and the oxide upper region 21 of the first ferromagnetic layer 11. As described above, the electrically conductive material of the electrically conductive layer 12 is selected to have a larger formation free-energy per a single oxygen atom than that of the ferromagnetic material for the first ferromagnetic layer 11, for which reason oxygen atoms are more thermally stable in the electrically conductive layer 12 than in the oxide upper region 21 of the first ferromagnetic layer 11. Therefore, the heat treatment is so carried out as to cause a thermal diffusion of oxygen from the oxide upper region 21 of the first ferromagnetic layer 11 into the electrically conductive layer 12, whereby an entire part of the electrically conductive layer 12 is oxidized by the thermal diffusion of oxygen. As a result of the thermal diffusion of oxygen atoms, the electrically conductive layer 12 is entirely made into an oxide layer 24, whilst the oxide upper region 21 of the first ferromagnetic layer 11 is exactly reduced to form a reduction upper region 22 of the first ferromagnetic layer 11. Thus, the oxide layer 24 is formed over the reduction upper region 22 of the first ferromagnetic layer 11. The oxide layer 24 forms a single tunnel barrier. Substantially all of the oxygen atoms in the oxide upper region 21 of the first ferromagnetic layer 11 are diffused into the entire part of the electrically conductive layer 12, whilst no oxygen atoms are, however, diffused from the oxide layer 24 to the reduction upper region 22 of the first ferromagnetic layer 11. Therefore, substantially no oxygen atoms remain in the reduction upper region 22 of the first ferromagnetic layer 11. The reduction upper region 22 exhibits the same ferromagnetic function and the same property as the first ferromagnetic layer 11, for which reason the reduction upper region 22 of the first ferromagnetic layer 11 is considered to be a part of the first ferromagnetic layer 11.

As a result of the thermal diffusion of oxygen, a first abrupt interface is formed between the reduction upper region 22 of the first ferromagnetic layer 11 and the oxide layer 24 serving as a lower tunnel barrier, wherein the first abrupt interface has such an extremely high abruptness as a monoatomic layer level like that a width of a boundary area between an oxygen atom containing region as the oxide layer 24 and an oxygen atom free region as the reduction upper region 22 of the first ferromagnetic layer 11 is substantially the same as a boundary between adjacent two monoatomic layers which are respectively present in the lower oxide layer 25 and the reduction upper region 21 of the first ferromagnetic layer 11.

Further as decried above, a ferromagnetic material for the second ferromagnetic layer 14 is selected to have a smaller formation free-energy per a single oxygen atom than that of the electrically conductive material of the electrically conductive layer 12, for which reason no oxygen atoms are diffused from the oxide layer 24 to the second ferromagnetic layer 14. Therefore, substantially no oxygen atoms remain in the second ferromagnetic layer 14. As a result of the formation of the second ferromagnetic layer 14, a second abrupt interface is also formed between the second ferromagnetic layer 14 and the oxide layer 24 serving as the upper tunnel barrier, wherein the second abrupt interface has such an extremely high abruptness as a monoatomic layer level like that a width of a boundary area between an oxygen atom containing region as the oxide layer 24 and an oxygen atom free region as the second ferromagnetic layer 14 is substantially the same as a boundary between adjacent two monoatomic layers which are respectively present in the oxide layer 24 and the second ferromagnetic layer 14.

Namely, the oxide layer 24 forms a single tunnel barrier and has the first and second extremely high abrupt interfaces with the first and second ferromagnetic layers 11 and 14 respectively, wherein each of the first and second abrupt interfaces has such an extremely high abruptness as a monoatomic layer level like that a width of a boundary area between an oxygen atom containing region as the oxide layer 24 and an oxygen atom free region as the first or second ferromagnetic layer 11 or 14 is substantially the same as a boundary between adjacent two monoatomic layers which are respectively present in the oxide layer 24 and the first or second ferromagnetic layer 11 or 14.

An electrically conductive material for the electrically conductive layer 12 should preferably have a smaller surface free energy than that of a ferromagnetic material for the first and second ferromagnetic layers 11 and 14 for allowing the electrically conductive layer 12 to possess a good coverage characteristic to the first ferromagnetic layer 11. For this reason, Fe, Co, Ni and alloys thereof are available for the first and second ferromagnetic layers 11 and 14, whilst Al is available for the electrically conductive layer 12. Since the electrically conductive layer 12 has a smaller surface free energy than that of the ferromagnetic material for the first ferromagnetic layer 11 and possesses a good coverage, then the electrically conductive layer 12 is free of any pin holes, whereby the electrically conductive layer 12 is free from a problem with formation of an electrical short circuit between the first and second ferromagnetic layers 11 and 14 through any pin hole.

In addition, the electrically conductive material Al of the electrically conductive layer 12 has a larger formation free-energy per a single oxygen atom than that of the ferromagnetic material for the first and second ferromagnetic layers 11 and 14. The first and second interfaces between the oxide layer 24 and the first and second ferromagnetic layers 11 and 14 are thermally stable.

As a modification to the above, Mg and lanthanoids are also available for the electrically conductive material for the electrically conductive layer 12.

Ninth Method

The ninth novel method in accordance with the present invention will be described with reference to FIGS. 10A through 10F which are fragmentary cross sectional elevation views in sequential steps involved in a ninth novel method of forming a tunnel barrier layer sandwiched between two ferromagnetic layers in a ferromagnetic tunnel junction device in accordance with the present invention.

Figure 10A:
FIGS. 10A through 10F are fragmentary cross sectional elevation views in sequential steps involved in a ninth novel method of forming a tunnel barrier layer sandwiched between two ferromagnetic layers in a ferromagnetic tunnel junction device in accordance with the present invention.

With reference to FIG. 10A, a first ferromagnetic layer 11 is grown in a vacuum in a vacuum.

Figure 10B:
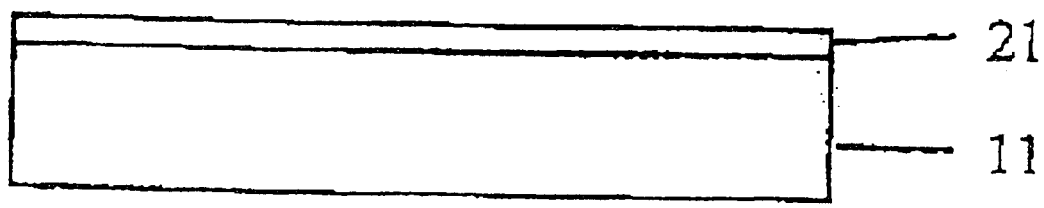

With reference to FIG. 10B, only a pure oxygen is introduced into the vacuum so that a surface of the first ferromagnetic layer 11 is subjected to the pure oxygen gas for causing a natural oxidation of the first ferromagnetic layer 11, whereby an upper region of the first ferromagnetic layer 11 is naturally oxidized. The natural oxidation is so conducted that an upper region of the first ferromagnetic layer 11 is made into an oxide upper region 21 of the first ferromagnetic layer 11.

Figure 10C:
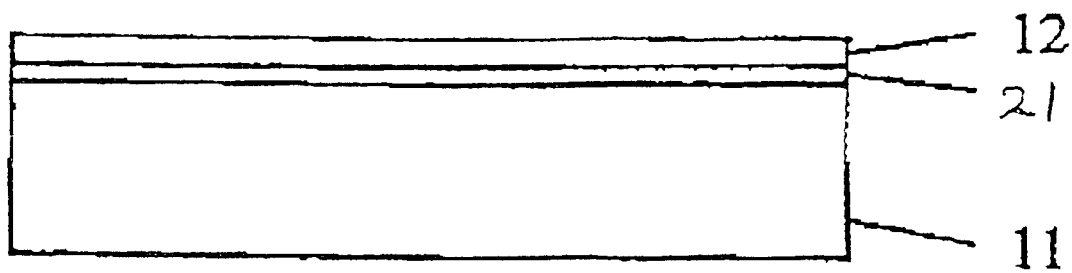

With reference to FIG. 10C, the pure oxygen gas is discharged before an electrically conductive layer 12 is grown in a vacuum on the oxide upper region 21 of the first ferromagnetic layer 11. An electrically conductive material of the electrically conductive layer 12 is selected to have a larger formation free-energy per a single oxygen atom than that of the ferromagnetic material for the first ferromagnetic layer 11. Oxygen atoms are more thermally stable in the electrically conductive layer 12 than in the oxide upper region 21 of the first ferromagnetic layer 11.

Figure 10D:
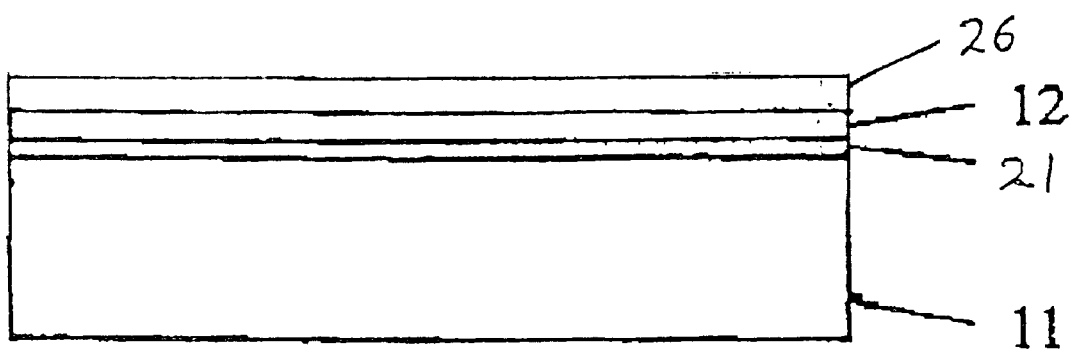

With reference to FIG. 10D, a pure oxygen is introduced into a vacuum to prepare a pure oxygen gas before a surface region of the electrically conductive layer 12 is subjected to the pure oxygen gas to cause a natural oxidation of only an upper region of the electrically conductive layer 12, whereby only the upper region of the electrically conductive layer 12 is made into an upper oxide layer 26 serving as an upper tunnel barrier. As a result of the natural oxidation, the upper oxide layer 26 is formed over the electrically conductive layer 12.

Figure 10E:
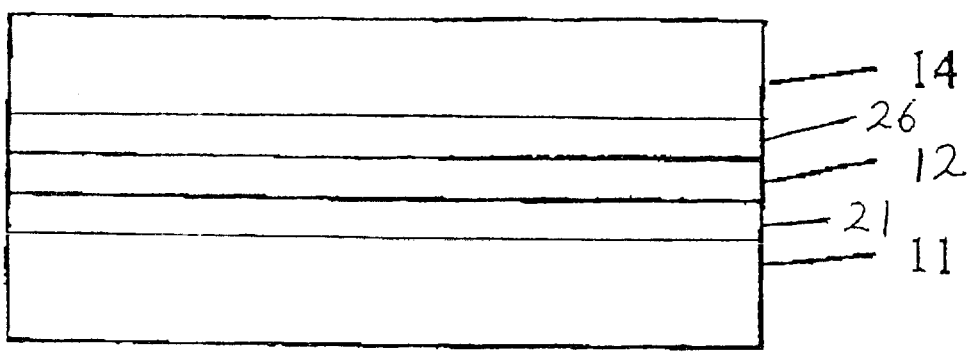

With reference to FIG. 10E, the oxygen gas is discharged before a second ferromagnetic layer 14 is grown on the upper oxide layer 26 so that the first and second ferromagnetic layers 11 and 14 sandwich laminations of the electrically conductive layer 12 and the upper oxide layer 26. A ferromagnetic material for the second ferromagnetic layer 14 is selected to have a smaller formation free-energy per a single oxygen atom than that of the electrically conductive material of the electrically conductive layer 12, for which reason oxygen atoms are more thermally stable in the upper oxide layer 26 than in the second ferromagnetic layer 14. Therefore, no oxygen atoms are diffused from the upper oxide layer 26 to the second ferromagnetic layer 14. Therefore, substantially no oxygen atoms remain in the second ferromagnetic layer 14. As a result of the formation of the second ferromagnetic layer 14, a second abrupt interface is also formed between the second ferromagnetic layer 14 and the upper oxide layer 26 serving as the upper tunnel barrier, wherein the second abrupt interface has such an extremely high abruptness as a monoatomic layer level like that a width of a boundary area between an oxygen atom containing region as the upper oxide layer 26 and an oxygen atom free region as the second ferromagnetic layer 14 is substantially the same as a boundary between adjacent two monoatomic layers which are respectively present in the upper oxide layer 26 and the second ferromagnetic layer 14.

Figure 10F:
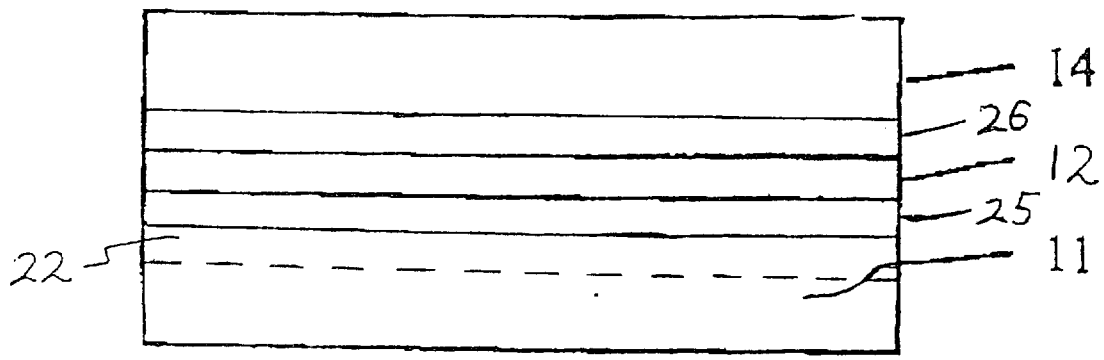

With reference to FIG. 10F, a heat treatment is carried out to the laminations of the first and second ferromagnetic layers 11 and 14, the electrically conductive layer 12, the upper oxide layer 26, and the oxide upper region 21 of the first ferromagnetic layer 11. As described above, the electrically conductive material of the electrically conductive layer 12 is selected to have a larger formation free-energy per a single oxygen atom than that of the ferromagnetic material for the first ferromagnetic layer 11, for which reason oxygen atoms are more thermally stable in the electrically conductive layer 12 than in the oxide upper region 21 of the first ferromagnetic layer 11. Therefore, the heat treatment is so carried out as to cause a thermal diffusion of oxygen from the oxide upper region 21 of the first ferromagnetic layer 11 into the remaining electrically conductive layer 12, whereby only a lower region of the remaining electrically conductive layer 12 is selectively oxidized by the thermal diffusion of oxygen. As a result of the thermal diffusion of oxygen atoms, only the lower region of the remaining electrically conductive layer 12 is made into a lower oxide layer 25 and the intermediate region of the originally formed electrically conductive layer 12 remains as an intermediate electrically conductive layer 12, whilst the oxide upper region 21 of the first ferromagnetic layer 11 is exactly reduced to form a reduction upper region 22 of the first ferromagnetic layer 11. Thus, the lower oxide layer 25 is formed over the intermediate electrically conductive layer 12. The lower oxide layer 25 forms a lower tunnel barrier. The upper oxide layer 26 forms an upper tunnel barrier. The intermediate electrically conductive layer 12 forms a single potential well. The lower and upper oxide layers 25 and 26 sandwiching the intermediate electrically conductive layer 12 form double tunnel barriers and a single potential well defined between the double tunnel barriers. Substantially all of the oxygen atoms in the oxide upper region 21 of the first ferromagnetic layer 11 are diffused into the lower region of the electrically conductive layer 12, whilst no oxygen atoms are, however, diffused from the lower oxide layer 25 to the reduction upper region 22 of the first ferromagnetic layer 11. Therefore, substantially no oxygen atoms remain in the reduction upper region 22 of the first ferromagnetic layer 11. The reduction upper region 22 exhibits the same ferromagnetic function and the same property as the first ferromagnetic layer 11, for which reason the reduction upper region 22 of the first ferromagnetic layer 11 is considered to be a part of the first ferromagnetic layer 11.

As a result of the thermal diffusion of oxygen, a first abrupt interface is formed between the reduction upper region 22 of the first ferromagnetic layer 11 and the lower oxide layer 25 serving as a lower tunnel barrier, wherein the first abrupt interface has such an extremely high abruptness as a monoatomic layer level like that a width of a boundary area between an oxygen atom containing region as the lower oxide layer 25 and an oxygen atom free region as the reduction upper region 22 of the first ferromagnetic layer 11 is substantially the same as a boundary between adjacent two monoatomic layers which are respectively present in the lower oxide layer 25 and the reduction upper region 22 of the first ferromagnetic layer 11.

Namely, the lower and upper oxide layers 25 and 26 form double tunnel barriers and have the first and second extremely high abrupt interfaces with the first and second ferromagnetic layers 11 and 14 respectively, wherein each of the first and second abrupt interfaces has such an extremely high abruptness as a monoatomic layer level like that a width of a boundary area between an oxygen atom containing region as the lower and upper oxide layers 25 and 26 and an oxygen atom free region as the first or second ferromagnetic layer 11 or 14 is substantially the same as a boundary between adjacent two monoatomic layers which are respectively present in the lower or upper oxide layer 25 or 26 and the first or second ferromagnetic layer 11 or 14.

An electrically conductive material for the electrically conductive layer 12 should preferably have a smaller surface free energy than that of a ferromagnetic material for the first and second ferromagnetic layers 11 and 14 for allowing the electrically conductive layer 12 to possess a good coverage characteristic to the first ferromagnetic layer 11. For this reason, Fe, Co, Ni and alloys thereof are available for the first and second ferromagnetic layers 11 and 14, whilst Al is available for the electrically conductive layer 12. Since the electrically conductive layer 12 has a smaller surface free energy than that of the ferromagnetic material for the first ferromagnetic layer 11 and possesses a good coverage, then the electrically conductive layer 12 is free of any pin holes, whereby the electrically conductive layer 12 is free from a problem with formation of an electrical short circuit between the first and second ferromagnetic layers 11 and 14 through any pin hole.

In addition, the electrically conductive material Al of the electrically conductive layer 12 has a larger formation free-energy per a single oxygen atom than that of the ferromagnetic material for the first and second ferromagnetic layers 11 and 14. The first and second interfaces between the lower and upper oxide layers 25 and 26 and the first and second ferromagnetic layers 11 and 14 are thermally stable.

As a modification to the above, Mg and lanthanoids are also available for the electrically conductive material for the electrically conductive layer 12.

Tenth Method

The tenth novel method in accordance with the present invention will be described with reference to FIGS. 11A through 11F which are fragmentary cross sectional elevation views in sequential steps involved in a tenth novel method of forming a tunnel barrier layer sandwiched between two ferromagnetic layers in a ferromagnetic tunnel junction device in accordance with the present invention.

Figure 11A:
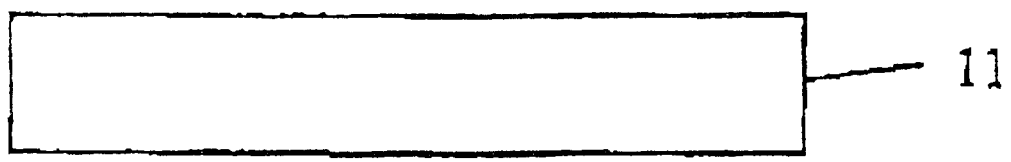
FIGS. 11A through 11F are fragmentary cross sectional elevation views in sequential steps involved in a tenth novel method of forming a tunnel barrier layer sandwiched between two ferromagnetic layers in a ferromagnetic tunnel junction device in accordance with the present invention.

With reference to FIG. 11A, a first ferromagnetic layer 11 is grown in a vacuum in a vacuum.

Figure 11B:
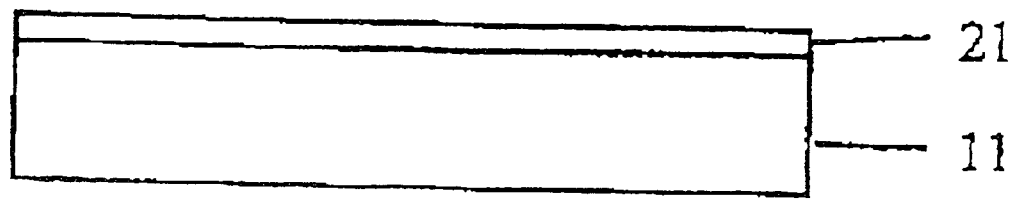

With reference to FIG. 11B, only a pure oxygen is introduced into the vacuum so that a surface of the first ferromagnetic layer 11 is subjected to the pure oxygen gas for causing a natural oxidation of the first ferromagnetic layer 11, whereby an upper region of the first ferromagnetic layer 11 is naturally oxidized. The natural oxidation is so conducted that an upper region of the first ferromagnetic layer 11 is made into an oxide upper region 21 of the first ferromagnetic layer 11.

Figure 11C:
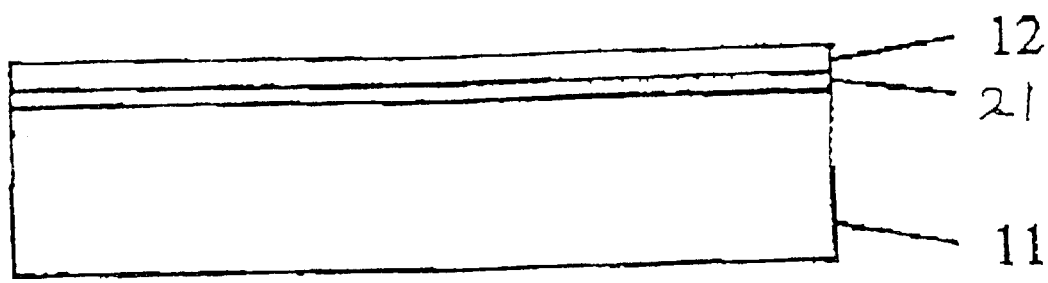

With reference to FIG. 11C, the pure oxygen gas is discharged before an electrically conductive layer 12 is grown in a vacuum on the oxide upper region 21 of the first ferromagnetic layer 11. An electrically conductive material of the electrically conductive layer 12 is selected to have a larger formation free-energy per a single oxygen atom than that of the ferromagnetic material for the first ferromagnetic layer 11. Oxygen atoms are more thermally stable in the electrically conductive layer 12 than in the oxide upper region 21 of the first ferromagnetic layer 11.

Figure 11D:
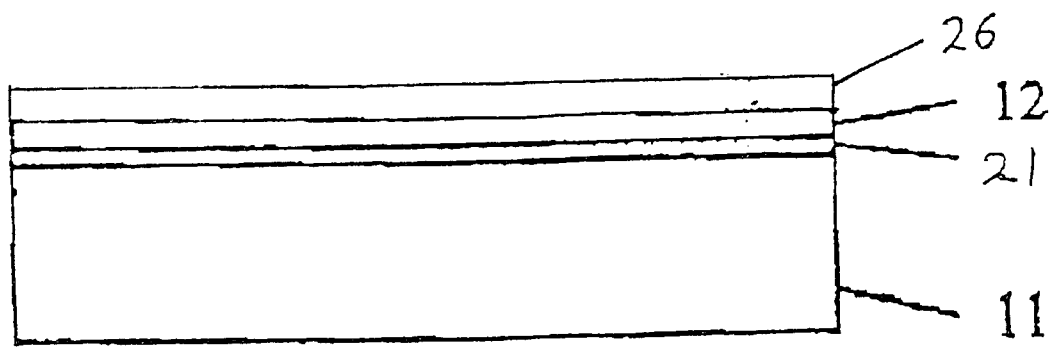

With reference to FIG. 11D, a pure oxygen is introduced into a vacuum to prepare a pure oxygen gas before a surface region of the electrically conductive layer 12 is subjected to the pure oxygen gas to cause a natural oxidation of only an upper region of the electrically conductive layer 12, whereby only the upper region of the electrically conductive layer 12 is made into an upper oxide layer 26 serving as an upper tunnel barrier. As a result of the natural oxidation, the upper oxide layer 26 is formed over the electrically conductive layer 12.

Figure 11E:
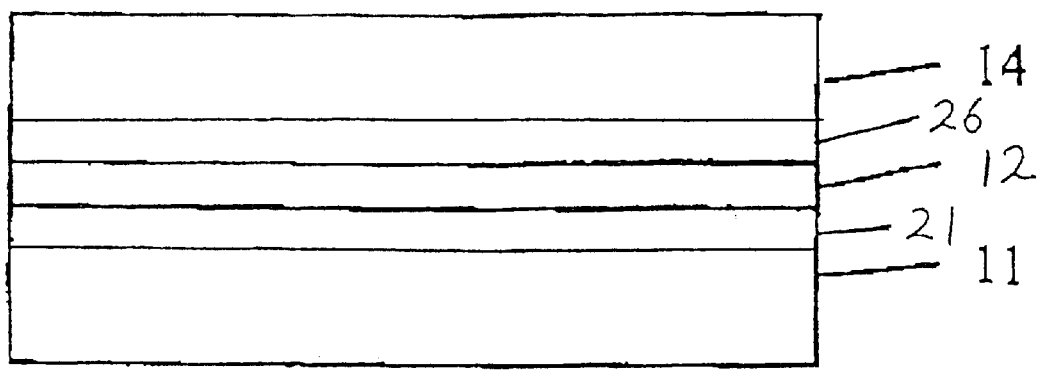

With reference to FIG. 11E, the oxygen gas is discharged before a second ferromagnetic layer 14 is grown on the upper oxide layer 26 so that the first and second ferromagnetic layers 11 and 14 sandwich laminations of the electrically conductive layer 12 and the upper oxide layer 26. A ferromagnetic material for the second ferromagnetic layer 14 is selected to have a smaller formation free-energy per a single oxygen atom than that of the electrically conductive material of the electrically conductive layer 12, for which reason oxygen atoms are more thermally stable in the upper oxide layer 26 than in the second ferromagnetic layer 14. Therefore, no oxygen atoms are diffused from the upper oxide layer 26 to the second ferromagnetic layer 14. Therefore, substantially no oxygen atoms remain in the second ferromagnetic layer 14. As a result of the formation of the second ferromagnetic layer 14, a second abrupt interface is also formed between the second ferromagnetic layer 14 and the upper oxide layer 26 serving as the upper tunnel barrier, wherein the second abrupt interface has such an extremely high abruptness as a monoatomic layer level like that a width of a boundary area between an oxygen atom containing region as the upper oxide layer 26 and an oxygen atom free region as the second ferromagnetic layer 14 is substantially the same as a boundary between adjacent two monoatomic layers which are respectively present in the upper oxide layer 26 and the second ferromagnetic layer 14.

Figure 11F:
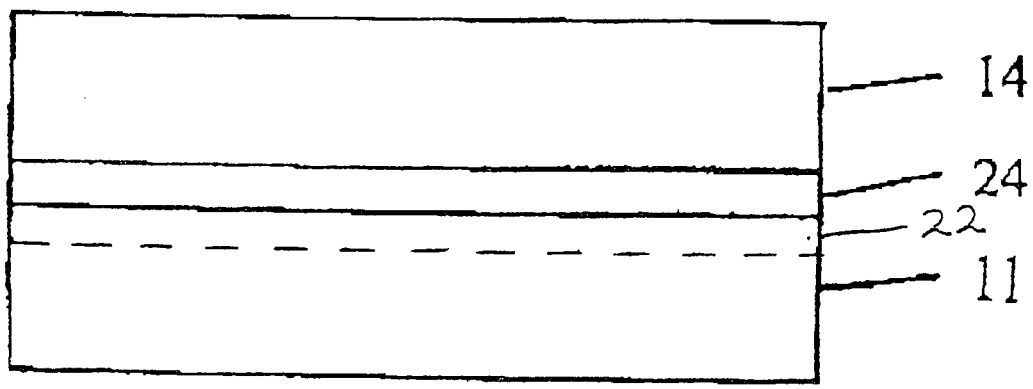

With reference to FIG. 11F, a heat treatment is carried out to the laminations of the first and second ferromagnetic layers 11 and 14, the electrically conductive layer 12, the upper oxide layer 26, and the oxide upper region 21 of the first ferromagnetic layer 11. As described above, the electrically conductive material of the electrically conductive layer 12 is selected to have a larger formation free-energy per a single oxygen atom than that of the ferromagnetic material for the first ferromagnetic layer 11, for which reason oxygen atoms are more thermally stable in the electrically conductive layer 12 than in the oxide upper region 21 of the first ferromagnetic layer 11. Therefore, the heat treatment is so carried out as to cause a thermal diffusion of oxygen from the oxide upper region 21 of the first ferromagnetic layer 11 into the remaining electrically conductive layer 12, whereby an entire region of the remaining electrically conductive layer 12 is entirely oxidized by the thermal diffusion of oxygen. As a result of the thermal diffusion of oxygen atoms, the remaining electrically conductive layer 12 and the upper oxide layer 26 are made into an intermediate oxide layer 24, whilst the oxide upper region 21 of the first ferromagnetic layer 11 is exactly reduced to form a reduction upper region 22 of the first ferromagnetic layer 11. Thus, the intermediate oxide layer 24 is formed between the first and second ferromagnetic layers 11 and 14. The intermediate oxide layer 24 forms a single tunnel barrier. Substantially all of the oxygen atoms in the oxide upper region 21 of the first ferromagnetic layer 11 are diffused into the electrically conductive layer 12, whilst no oxygen atoms are, however, diffused from the intermediate oxide layer 24 to the reduction upper region 22 of the first ferromagnetic layer 11. Therefore, substantially no oxygen atoms remain in the reduction upper region 22 of the first ferromagnetic layer 11. The reduction upper region 22 exhibits the same ferromagnetic function and the same property as the first ferromagnetic layer 11, for which reason the reduction upper region 22 of the first ferromagnetic layer 11 is considered to be a part of the first ferromagnetic layer 11.

As a result of the thermal diffusion of oxygen, a first abrupt interface is formed between the reduction upper region 22 of the first ferromagnetic layer 11 and the intermediate oxide layer 24 serving as a single tunnel barrier, wherein the first abrupt interface has such an extremely high abruptness as a monoatomic layer level like that a width of a boundary area between an oxygen atom containing region as the intermediate oxide layer 24 and an oxygen atom free region as the reduction upper region 22 of the first ferromagnetic layer 11 is substantially the same as a boundary between adjacent two monoatomic layers which are respectively present in the intermediate oxide layer 24 and the reduction upper region 22 of the first ferromagnetic layer 11.

Namely, the intermediate oxide layer 24 forms a single tunnel barrier and has the first and second extremely high abrupt interfaces with the first and second ferromagnetic layers 11 and 14 respectively, wherein each of the first and second abrupt interfaces has such an extremely high abruptness as a monoatomic layer level like that a width of a boundary area between an oxygen atom containing region as the intermediate oxide layer 24 and an oxygen atom free region as the first or second ferromagnetic layer 11 or 14 is substantially the same as a boundary between adjacent two monoatomic layers which are respectively present in the intermediate oxide layer 24 and the first or second ferromagnetic layer 11 or 14.

An electrically conductive material for the electrically conductive layer 12 should preferably have a smaller surface free energy than that of a ferromagnetic material for the first and second ferromagnetic layers 11 and 14 for allowing the electrically conductive layer 12 to possess a good coverage characteristic to the first ferromagnetic layer 11. For this reason, Fe, Co, Ni and alloys thereof are available for the first and second ferromagnetic layers 11 and 14, whilst Al is available for the electrically conductive layer 12. Since the electrically conductive layer 12 has a smaller surface free energy than that of the ferromagnetic material for the first ferromagnetic layer 11 and possesses a good coverage, then the electrically conductive layer 12 is free of any pin holes, whereby the electrically conductive layer 12 is free from a problem with formation of an electrical short circuit between the first and second ferromagnetic layers 11 and 14 through any pin hole.

In addition, the electrically conductive material Al of the electrically conductive layer 12 has a larger formation free-energy per a single oxygen atom than that of the ferromagnetic material for the first and second ferromagnetic layers 11 and 14. The first and second interfaces between the intermediate oxide layer 24 and the first and second ferromagnetic layers 11 and 14 are thermally stable.

As a modification to the above, Mg and lanthanoids are also available for the electrically conductive material for the electrically conductive layer 12.

Eleventh Method

The eleventh novel method in accordance with the present invention will be described with reference to FIGS. 12A through 12F which are fragmentary cross sectional elevation views in sequential steps involved in an eleventh novel method of forming a tunnel barrier layer sandwiched between two ferromagnetic layers in a ferromagnetic tunnel junction device in accordance with the present invention.

Figure 12A:
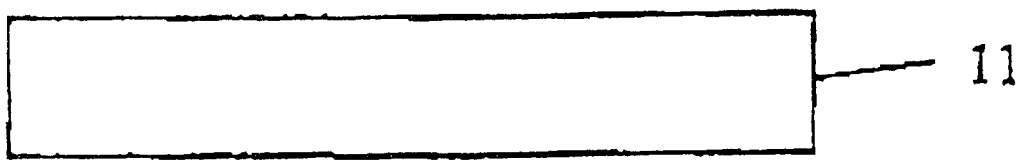
FIGS. 12A through 12F are fragmentary cross sectional elevation views in sequential steps involved in an eleventh novel method of forming a tunnel barrier layer sandwiched between two ferromagnetic layers in a ferromagnetic tunnel junction device in accordance with the present invention.

With reference to FIG. 12A, a first ferromagnetic layer 11 is grown in a vacuum in a vacuum.

Figure 12B:
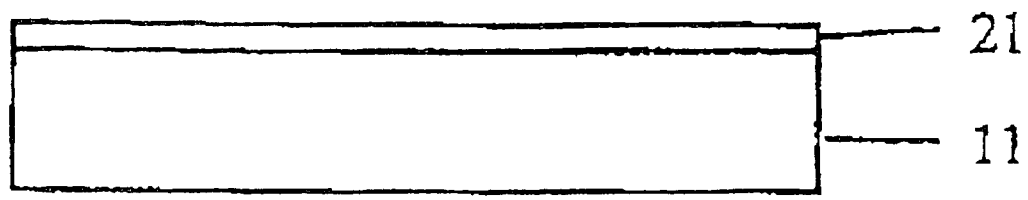

With reference to FIG. 12B, only a pure oxygen is introduced into the vacuum so that a surface of the first ferromagnetic layer 11 is subjected to the pure oxygen gas for causing a natural oxidation of the first ferromagnetic layer 11, whereby an upper region of the first ferromagnetic layer 11 is naturally oxidized. The natural oxidation is so conducted that an upper region of the first ferromagnetic layer 11 is made into an oxide upper region 21 of the first ferromagnetic layer 11.

Figure 12C:
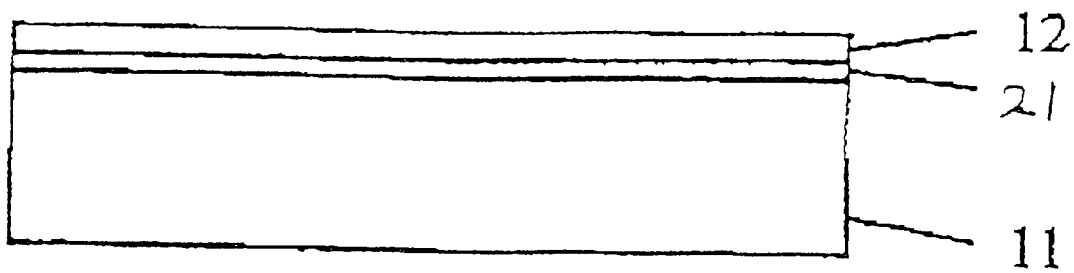

With reference to FIG. 12C, the pure oxygen gas is discharged before an electrically conductive layer 12 is grown in a vacuum on the oxide upper region 21 of the first ferromagnetic layer 11. An electrically conductive material of the electrically conductive layer 12 is selected to have a larger formation free-energy per a single oxygen atom than that of the ferromagnetic material for the first ferromagnetic layer 11. Oxygen atoms are more thermally stable in the electrically conductive layer 12 than in the oxide upper region 21 of the first ferromagnetic layer 11.

Figure 12D:
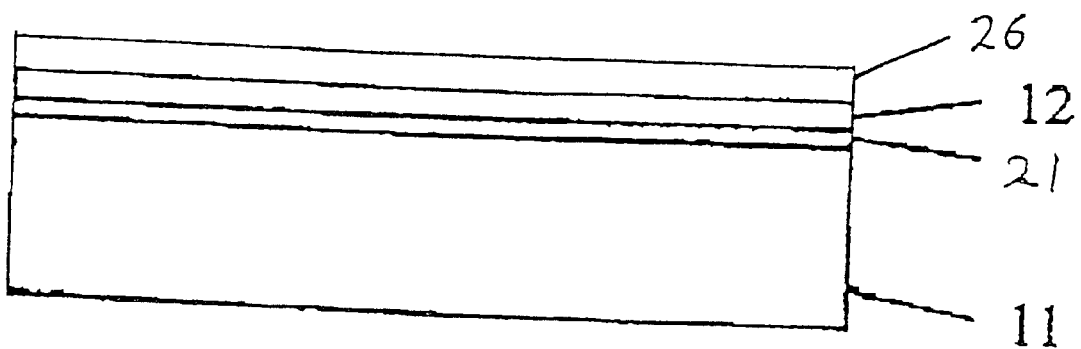

With reference to FIG. 12D, a pure oxygen is introduced into a vacuum to prepare a pure oxygen gas before a surface region of the electrically conductive layer 12 is subjected to the pure oxygen gas to cause a natural oxidation of only an upper region of the electrically conductive layer 12, whereby only the upper region of the electrically conductive layer 12 is made into an upper oxide layer 26 serving as an upper tunnel barrier. As a result of the natural oxidation, the upper oxide layer 26 is formed over the electrically conductive layer 12.

Figure 12E:
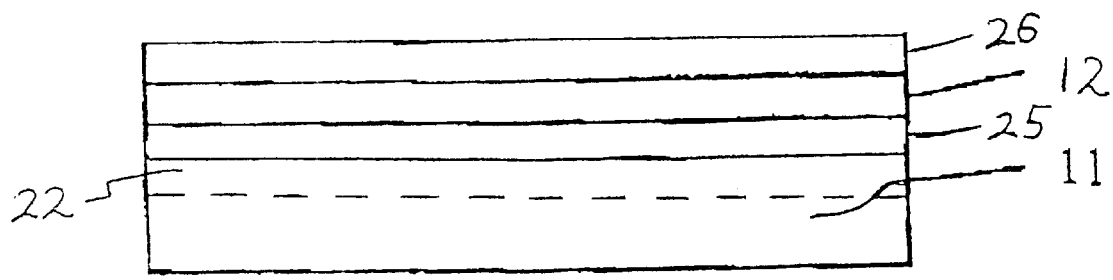

With reference to FIG. 12E, a heat treatment is carried out to the laminations of the first ferromagnetic layer 11, the electrically conductive layer 12, the upper oxide layer 26, and the oxide upper region 21 of the first ferromagnetic layer 11. As described above, the electrically conductive material of the electrically conductive layer 12 is selected to have a larger formation free-energy per a single oxygen atom than that of the ferromagnetic material for the first ferromagnetic layer 11, for which reason oxygen atoms are more thermally stable in the electrically conductive layer 12 than in the oxide upper region 21 of the first ferromagnetic layer 11. Therefore, the heat treatment is so carried out as to cause a thermal diffusion of oxygen from the oxide upper region 21 of the first ferromagnetic layer 11 into the remaining electrically conductive layer 12, whereby only a lower region of the remaining electrically conductive layer 12 is selectively oxidized by the thermal diffusion of oxygen. As a result of the thermal diffusion of oxygen atoms, only the lower region of the remaining electrically conductive layer 12 is made into a lower oxide layer 25 and the intermediate region of the originally formed electrically conductive layer 12 remains as an intermediate electrically conductive layer 12, whilst the oxide upper region 21 of the first ferromagnetic layer 11 is exactly reduced to form a reduction upper region 22 of the first ferromagnetic layer 11. Thus, the lower oxide layer 25 is formed over the intermediate electrically conductive layer 12. The lower oxide layer 25 forms a lower tunnel barrier. The upper oxide layer 26 forms an upper tunnel barrier. The intermediate electrically conductive layer 12 forms a single potential well. The lower and upper oxide layers 25 and 26 sandwiching the intermediate electrically conductive layer 12 form double tunnel barriers and a single potential well defined between the double tunnel barriers. Substantially all of the oxygen atoms in the oxide upper region 21 of the first ferromagnetic layer 11 are diffused into the lower region of the electrically conductive layer 12, whilst no oxygen atoms are, however, diffused from the lower oxide layer 25 to the reduction upper region 22 of the first ferromagnetic layer 11. Therefore, substantially no oxygen atoms remain in the reduction upper region 22 of the first ferromagnetic layer 11. The reduction upper region 22 exhibits the same ferromagnetic function and the same property as the first ferromagnetic layer 11, for which reason the reduction upper region 22 of the first ferromagnetic layer 11 is considered to be a part of the first ferromagnetic layer 11.

As a result of the thermal diffusion of oxygen, a first abrupt interface is formed between the reduction upper region 22 of the first ferromagnetic layer 11 and the lower oxide layer 25 serving as a lower tunnel barrier, wherein the first abrupt interface has such an extremely high abruptness as a monoatomic layer level like that a width of a boundary area between an oxygen atom containing region as the lower oxide layer 25 and an oxygen atom free region as the reduction upper region 22 of the first ferromagnetic layer 11 is substantially the same as a boundary between adjacent two monoatomic layers which are respectively present in the lower oxide layer 25 and the reduction upper region 22 of the first ferromagnetic layer 11.

Figure 12F:
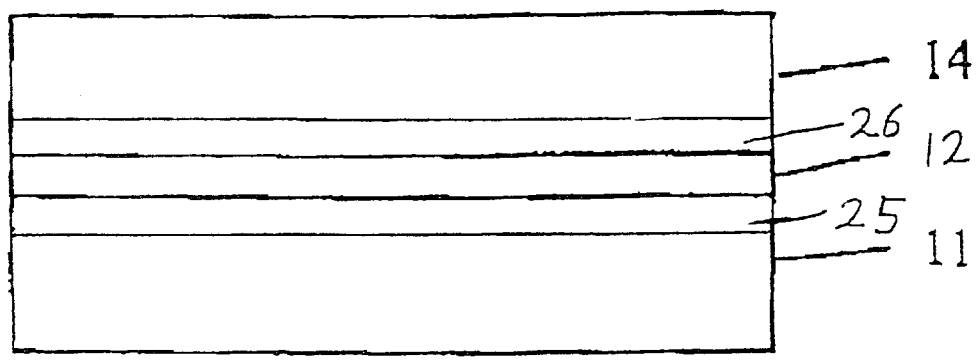

With reference to FIG. 12F, the oxygen gas is discharged before a second ferromagnetic layer 14 is grown on the upper oxide layer 26 so that the first and second ferromagnetic layers 11 and 14 sandwich laminations of the intermediate electrically conductive layer 12 and the lower and upper oxide layers 25 and 26. A ferromagnetic material for the second ferromagnetic layer 14 is selected to have a smaller formation free-energy per a single oxygen atom than that of the electrically conductive material of the electrically conductive layer 12, for which reason oxygen atoms are more thermally stable in the upper oxide layer 26 than in the second ferromagnetic layer 14. Therefore, no oxygen atoms are diffused from the upper oxide layer 26 to the second ferromagnetic layer 14. Therefore, substantially no oxygen atoms remain in the second ferromagnetic layer 14. As a result of the formation of the second ferromagnetic layer 14, a second abrupt interface is also formed between the second ferromagnetic layer 14 and the upper oxide layer 26 serving as the upper tunnel barrier, wherein the second abrupt interface has such an extremely high abruptness as a monoatomic layer level like that a width of a boundary area between an oxygen atom containing region as the upper oxide layer 26 and an oxygen atom free region as the second ferromagnetic layer 14 is substantially the same as a boundary between adjacent two monoatomic layers which are respectively present in the upper oxide layer 26 and the second ferromagnetic layer 14.

Namely, the lower and upper oxide layers 25 and 26 form double tunnel barriers and have the first and second extremely high abrupt interfaces with the first and second ferromagnetic layers 11 and 14 respectively, wherein each of the first and second abrupt interfaces has such an extremely high abruptness as a monoatomic layer level like that a width of a boundary area between an oxygen atom containing region as the lower and upper oxide layers 25 and 26 and an oxygen atom free region as the first or second ferromagnetic layer 11 or 14 is substantially the same as a boundary between adjacent two monoatomic layers which are respectively present in the lower or upper oxide layer 25 or 26 and the first or second ferromagnetic layer 11 or 14.

An electrically conductive material for the electrically conductive layer 12 should preferably have a smaller surface free energy than that of a ferromagnetic material for the first and second ferromagnetic layers 11 and 14 for allowing the electrically conductive layer 12 to possess a good coverage characteristic to the first ferromagnetic layer 11. For this reason, Fe, Co, Ni and alloys thereof are available for the first and second ferromagnetic layers 11 and 14, whilst Al is available for the electrically conductive layer 12. Since the electrically conductive layer 12 has a smaller surface free energy than that of the ferromagnetic material for the first ferromagnetic layer 11 and possesses a good coverage, then the electrically conductive layer 12 is free of any pin holes, whereby the electrically conductive layer 12 is free from a problem with formation of an electrical short circuit between the first and second ferromagnetic layers 11 and 14 through any pin hole.

In addition, the electrically conductive material Al of the electrically conductive layer 12 has a larger formation free-energy per a single oxygen atom than that of the ferromagnetic material for the first and second ferromagnetic layers 11 and 14. The first and second interfaces between the lower and upper oxide layers 25 and 26 and the first and second ferromagnetic layers 11 and 14 are thermally stable.

As a modification to the above, Mg and lanthanoids are also available for the electrically conductive material for the electrically conductive layer 12.

Twelfth Method

The twelfth novel method in accordance with the present invention will be described with reference to FIGS. 13A through 13F which are fragmentary cross sectional elevation views in sequential steps involved in a twelfth novel method of forming a tunnel barrier layer sandwiched between two ferromagnetic layers in a ferromagnetic tunnel junction device in accordance with the present invention.

Figure 13A:
FIGS. 13A through 13F are fragmentary cross sectional elevation views in sequential steps involved in a twelfth novel method of forming a tunnel barrier layer sandwiched between two ferromagnetic layers in a ferromagnetic tunnel junction device in accordance with the present invention.

With reference to FIG. 13A, a first ferromagnetic layer 11 is grown in a vacuum in a vacuum.

Figure 13B:
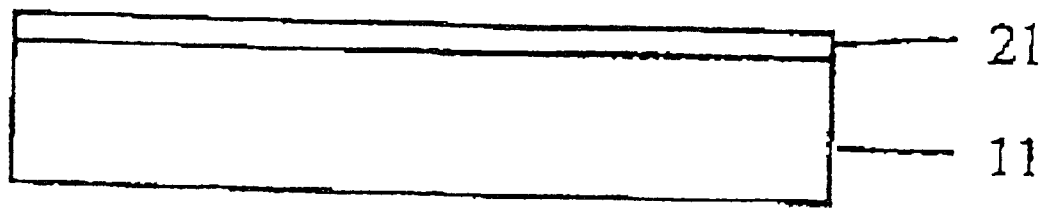

With reference to FIG. 13B, only a pure oxygen is introduced into the vacuum so that a surface of the first ferromagnetic layer 11 is subjected to the pure oxygen gas for causing a natural oxidation of the first ferromagnetic layer 11, whereby an upper region of the first ferromagnetic layer 11 is naturally oxidized. The natural oxidation is so conducted that an upper region of the first ferromagnetic layer 11 is made into an oxide upper region 21 of the first ferromagnetic layer 11.

Figure 13C:
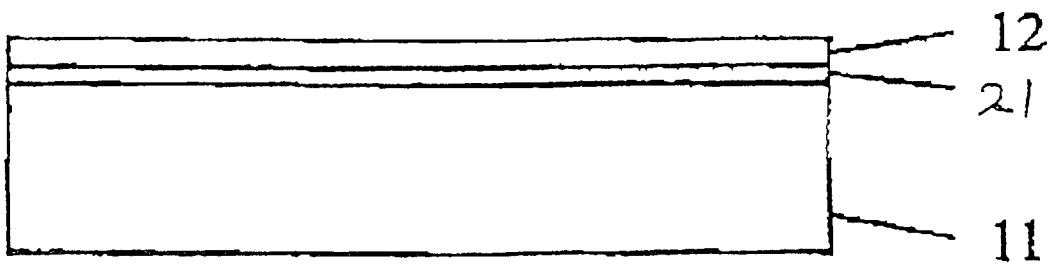

With reference to FIG. 13C, the pure oxygen gas is discharged before an electrically conductive layer 12 is grown in a vacuum on the oxide upper region 21 of the first ferromagnetic layer 11. An electrically conductive material of the electrically conductive layer 12 is selected to have a larger formation free-energy per a single oxygen atom than that of the ferromagnetic material for the first ferromagnetic layer 11. Oxygen atoms are more thermally stable in the electrically conductive layer 12 than in the oxide upper region 21 of the first ferromagnetic layer 11.

Figure 13D:
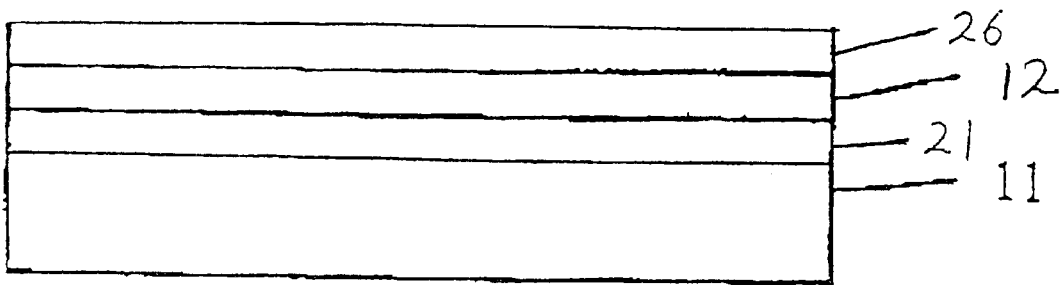

With reference to FIG. 13D, a pure oxygen is introduced into a vacuum to prepare a pure oxygen gas before a surface region of the electrically conductive layer 12 is subjected to the pure oxygen gas to cause a natural oxidation of only an upper region of the electrically conductive layer 12, whereby only the upper region of the electrically conductive layer 12 is made into an upper oxide layer 26 serving as an upper tunnel barrier. As a result of the natural oxidation, the upper oxide layer 26 is formed over the electrically conductive layer 12.

Figure 13E:
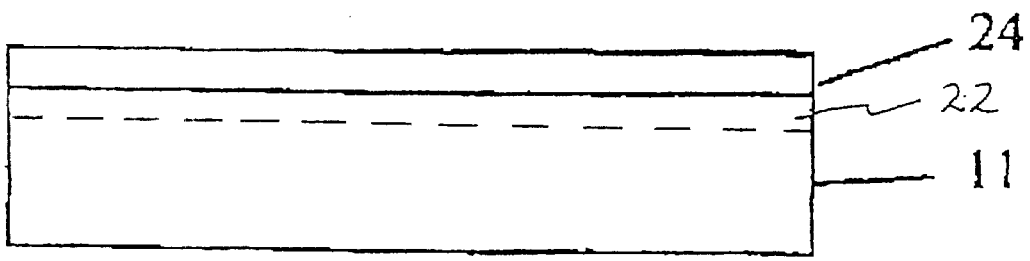

With reference to FIG. 13E, a heat treatment is carried out to the laminations of the first ferromagnetic layer 11, the electrically conductive layer 12, the upper oxide layer 26, and the oxide upper region 21 of the first ferromagnetic layer 11. As described above, the electrically conductive material of the electrically conductive layer 12 is selected to have a larger formation free-energy per a single oxygen atom than that of the ferromagnetic material for the first ferromagnetic layer 11, for which reason oxygen atoms are more thermally stable in the electrically conductive layer 12 than in the oxide upper region 21 of the first ferromagnetic layer 11. Therefore, the heat treatment is so carried out as to cause a thermal diffusion of oxygen from the oxide upper region 21 of the first ferromagnetic layer 11 into the remaining electrically conductive layer 12, whereby an entire region of the remaining electrically conductive layer 12 is entirely oxidized by the thermal diffusion of oxygen. As a result of the thermal diffusion of oxygen atoms, the remaining electrically conductive layer 12 and the upper oxide layer 26 are made into an intermediate oxide layer 24, whilst the oxide upper region 21 of the first ferromagnetic layer 11 is exactly reduced to form a reduction upper region 22 of the first ferromagnetic layer 11. The intermediate oxide layer 24 forms a single tunnel barrier. Substantially all of the oxygen atoms in the oxide upper region 21 of the first ferromagnetic layer 11 are diffused into the electrically conductive layer 12, whilst no oxygen atoms are, however, diffused from the intermediate oxide layer 24 to the reduction upper region 22 of the first ferromagnetic layer 11. Therefore, substantially no oxygen atoms remain in the reduction upper region 22 of the first ferromagnetic layer 11. The reduction upper region 22 exhibits the same ferromagnetic function and the same property as the first ferromagnetic layer 11, for which reason the reduction upper region 22 of the first ferromagnetic layer 11 is considered to be a part of the first ferromagnetic layer 11.

As a result of the thermal diffusion of oxygen, a first abrupt interface is formed between the reduction upper region 22 of the first ferromagnetic layer 11 and the intermediate oxide layer 24 serving as a single tunnel barrier, wherein the first abrupt interface has such an extremely high abruptness as a monoatomic layer level like that a width of a boundary area between an oxygen atom containing region as the intermediate oxide layer 24 and an oxygen atom free region as the reduction upper region 22 of the first ferromagnetic layer 11 is substantially the same as a boundary between adjacent two monoatomic layers which are respectively present in the intermediate oxide layer 24 and the reduction upper region 22 of the first ferromagnetic layer 11.

Figure 13F:
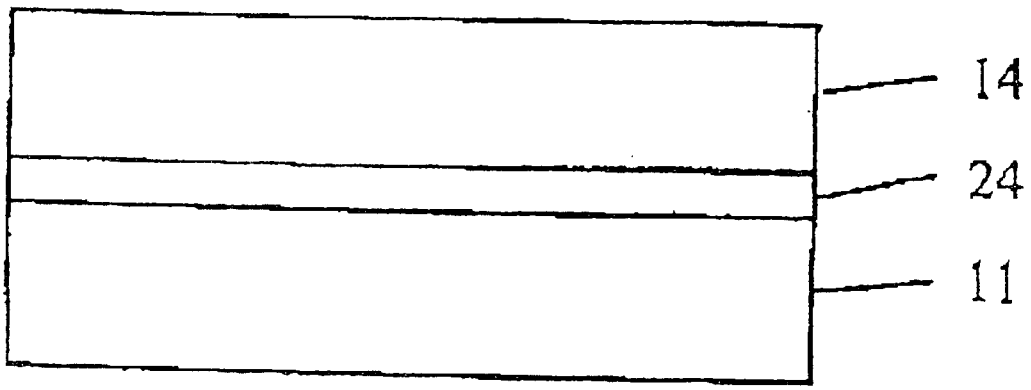

With reference to FIG. 13F, the oxygen gas is discharged before a second ferromagnetic layer 14 is grown on the intermediate oxide layer 24 so that the first and second ferromagnetic layers 11 and 14 sandwich the intermediate oxide layer 24. A ferromagnetic material for the second ferromagnetic layer 14 is selected to have a smaller formation free-energy per a single oxygen atom than that of the electrically conductive material of the electrically conductive layer 12, for which reason oxygen atoms are more thermally stable in the intermediate oxide layer 24 than in the second ferromagnetic layer 14. Therefore, no oxygen atoms are diffused from the intermediate oxide layer 24 to the second ferromagnetic layer 14. Therefore, substantially no oxygen atoms remain in the second ferromagnetic layer 14. As a result of the formation of the second ferromagnetic layer 14, a second abrupt interface is also formed between the second ferromagnetic layer 14 and the intermediate oxide layer 24 serving as the single tunnel barrier, wherein the second abrupt interface has such an extremely high abruptness as a monoatomic layer level like that a width of a boundary area between an oxygen atom containing region as the intermediate oxide layer 24 and an oxygen atom free region as the second ferromagnetic layer 14 is substantially the same as a boundary between adjacent two monoatomic layers which are respectively present in the intermediate oxide layer 24 and the second ferromagnetic layer 14.

Namely, the intermediate oxide layer 24 forms a single tunnel barrier and has the first and second extremely high abrupt interfaces with the first and second ferromagnetic layers 11 and 14 respectively, wherein each of the first and second abrupt interfaces has such an extremely high abruptness as a monoatomic layer level like that a width of a boundary area between an oxygen atom containing region as the intermediate oxide layer 24 and an oxygen atom free region as the first or second ferromagnetic layer 11 or 14 is substantially the same as a boundary between adjacent two monoatomic layers which are respectively present in the intermediate oxide layer 24 and the first or second ferromagnetic layer 11 or 14.

An electrically conductive material for the electrically conductive layer 12 should preferably have a smaller surface free energy than that of a ferromagnetic material for the first and second ferromagnetic layers 11 and 14 for allowing the electrically conductive layer 12 to possess a good coverage characteristic to the first ferromagnetic layer 11. For this reason, Fe, Co, Ni and alloys thereof are available for the first and second ferromagnetic layers 11 and 14, whilst Al is available for the electrically conductive layer 12. Since the electrically conductive layer 12 has a smaller surface free energy than that of the ferromagnetic material for the first ferromagnetic layer 11 and possesses a good coverage, then the electrically conductive layer 12 is free of any pin holes, whereby the electrically conductive layer 12 is free from a problem with formation of an electrical short circuit between the first and second ferromagnetic layers 11 and 14 through any pin hole.

In addition, the electrically conductive material Al of the electrically conductive layer 12 has a larger formation free-energy per a single oxygen atom than that of the ferromagnetic material for the first and second ferromagnetic layers 11 and 14. The first and second interfaces between the intermediate oxide layer 24 and the first and second ferromagnetic layers 11 and 14 are thermally stable.

As a modification to the above, Mg and lanthanoids are also available for the electrically conductive material for the electrically conductive layer 12.

Thirteenth Method

The thirteenth novel method in accordance with the present invention will be described with reference to FIGS. 14A through 14D which are fragmentary cross sectional elevation views in sequential steps involved in a thirteenth novel method of forming a tunnel barrier layer sandwiched between two ferromagnetic layers in a ferromagnetic tunnel junction device in accordance with the present invention.

Figure 14A:
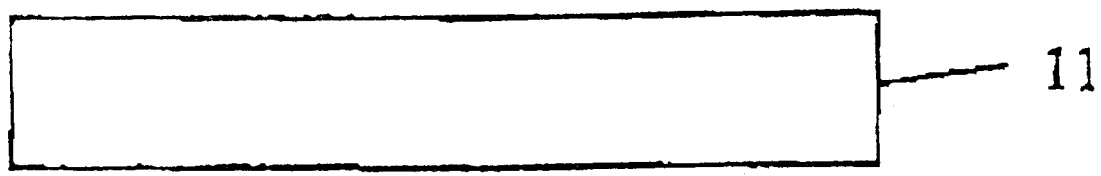
FIGS. 14A through 14D are fragmentary cross sectional elevation views in sequential steps involved in a thirteenth novel method of forming a tunnel barrier layer sandwiched between two ferromagnetic layers in a ferromagnetic tunnel junction device in accordance with the present invention.

With reference to FIG. 14A, a first ferromagnetic layer 11 is grown in a vacuum in a vacuum.

Figure 14B:
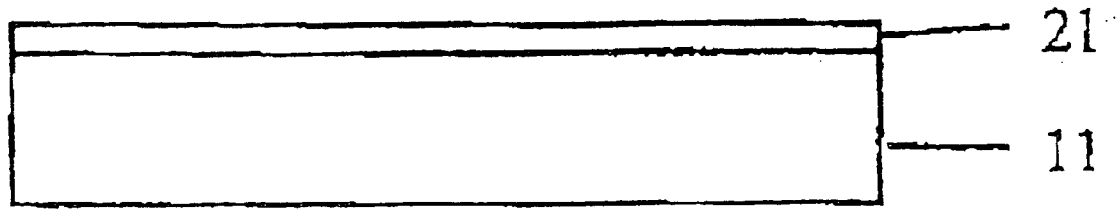

With reference to FIG. 14B, only a pure oxygen is introduced into the vacuum so that a surface of the first ferromagnetic layer 11 is subjected to the pure oxygen gas for causing a natural oxidation of the first ferromagnetic layer 11, whereby an upper region of the first ferromagnetic layer 11 is naturally oxidized. The natural oxidation is so conducted that an upper region of the first ferromagnetic layer 11 is made into an oxide upper region 21 of the first ferromagnetic layer 11.

Figure 14C:
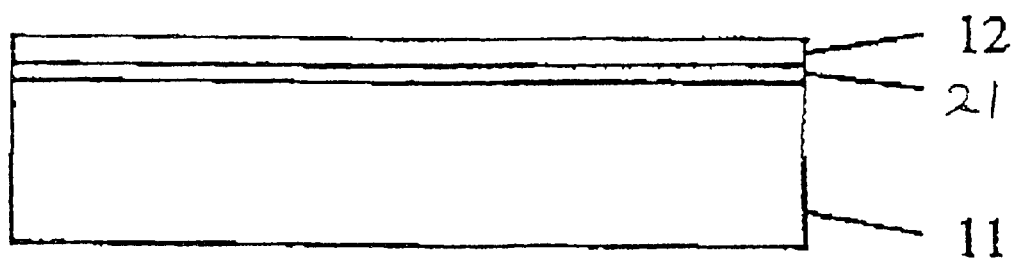

With reference to FIG. 14C, the pure oxygen gas is discharged before an electrically conductive layer 12 is grown in a vacuum on the oxide upper region 21 of the first ferromagnetic layer 11. An electrically conductive material of the electrically conductive layer 12 is selected to have a larger formation free-energy per a single oxygen atom than that of the ferromagnetic material for the first ferromagnetic layer 11. Oxygen atoms are more thermally stable in the electrically conductive layer 12 than in the oxide upper region 21 of the first ferromagnetic layer 11.

Figure 14D:
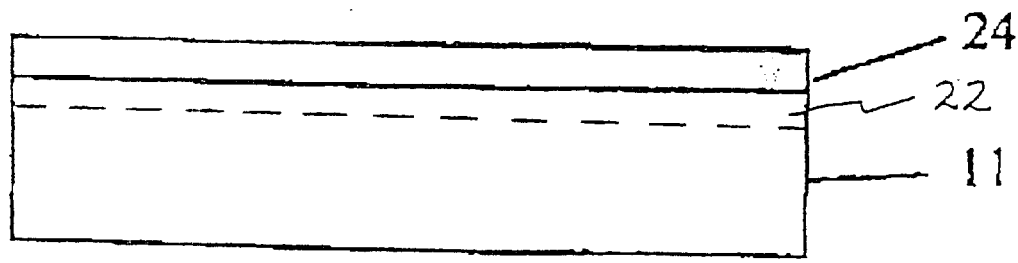

With reference to FIG. 14D, without any heat treatment, there is placed at about room temperature the laminations of the first ferromagnetic layer 11, the electrically conductive layer 12, and the oxide upper region 21 of the first ferromagnetic layer 11. As described above, the electrically conductive material of the electrically conductive layer 12 is selected to have a larger formation free-energy per a single oxygen atom than that of the ferromagnetic material for the first ferromagnetic layer 11, for which reason oxygen atoms are more thermally stable in the electrically conductive layer 12 than in the oxide upper region 21 of the first ferromagnetic layer 11. Therefore, there is caused a natural diffusion of oxygen from the oxide upper region 21 of the first ferromagnetic layer 11 into the electrically conductive layer 12, whereby an entire region of the remaining electrically conductive layer 12 is naturally oxidized by the natural diffusion of oxygen. As a result of the natural diffusion of oxygen atoms, the electrically conductive layer 12 is made into an intermediate oxide layer 24, whilst the oxide upper region 21 of the first ferromagnetic layer 11 is exactly reduced to form a reduction upper region 22 of the first ferromagnetic layer 11. The oxide layer 24 forms a single tunnel barrier. Substantially all of the oxygen atoms in the oxide upper region 21 of the first ferromagnetic layer 11 are diffused into the electrically conductive layer 12, whilst no oxygen atoms are, however, diffused from the intermediate oxide layer 24 to the reduction upper region 22 of the first ferromagnetic layer 11. Therefore, substantially no oxygen atoms remain in the reduction upper region 22 of the first ferromagnetic layer 11. The reduction upper region 22 exhibits the same ferromagnetic function and the same property as the first ferromagnetic layer 11, for which reason the reduction upper region 22 of the first ferromagnetic layer 11 is considered to be a part of the first ferromagnetic layer 11.

As a result of the natural diffusion of oxygen, a first abrupt interface is formed between the reduction upper region 22 of the first ferromagnetic layer 11 and the intermediate oxide layer 24 serving as a single tunnel barrier, wherein the first abrupt interface has such an extremely high abruptness as a monoatomic layer level like that a width of a boundary area between an oxygen atom containing region as the intermediate oxide layer 24 and an oxygen atom free region as the reduction upper region 22 of the first ferromagnetic layer 11 is substantially the same as a boundary between adjacent two monoatomic layers which are respectively present in the intermediate oxide layer 24 and the reduction upper region 22 of the first ferromagnetic layer 11.

Figure 14E:
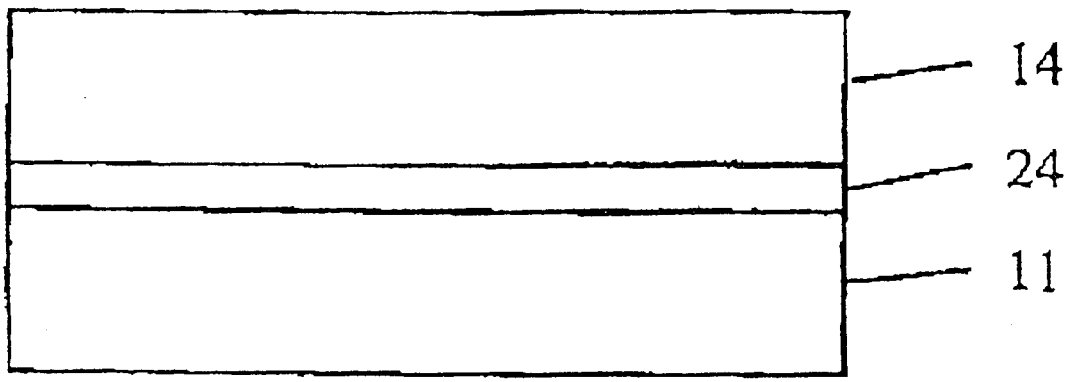

With reference to FIG. 14E, a second ferromagnetic layer 14 is grown on the intermediate oxide layer 24 so that the first and second ferromagnetic layers 11 and 14 sandwich the intermediate oxide layer 24. A ferromagnetic material for the second ferromagnetic layer 14 is selected to have a smaller formation free-energy per a single oxygen atom than that of the electrically conductive material of the electrically conductive layer 12, for which reason oxygen atoms are more thermally stable in the intermediate oxide layer 24 than in the second ferromagnetic layer 14. Therefore, no oxygen atoms are diffused from the intermediate oxide layer 24 to the second ferromagnetic layer 14. Therefore, substantially no oxygen atoms remain in the second ferromagnetic layer 14. As a result of the formation of the second ferromagnetic layer 14, a second abrupt interface is also formed between the second ferromagnetic layer 14 and the intermediate oxide layer 24 serving as the single tunnel barrier, wherein the second abrupt interface has such an extremely high abruptness as a monoatomic layer level like that a width of a boundary area between an oxygen atom containing region as the intermediate oxide layer 24 and an oxygen atom free region as the second ferromagnetic layer 14 is substantially the same as a boundary between adjacent two monoatomic layers which are respectively present in the intermediate oxide layer 24 and the second ferromagnetic layer 14.

Namely, the intermediate oxide layer 24 forms a single tunnel barrier and has the first and second extremely high abrupt interfaces with the first and second ferromagnetic layers 11 and 14 respectively, wherein each of the first and second abrupt interfaces has such an extremely high abruptness as a monoatomic layer level like that a width of a boundary area between an oxygen atom containing region as the intermediate oxide layer 24 and an oxygen atom free region as the first or second ferromagnetic layer 11 or 14 is substantially the same as a boundary between adjacent two monoatomic layers which are respectively present in the intermediate oxide layer 24 and the first or second ferromagnetic layer 11 or 14.

An electrically conductive material for the electrically conductive layer 12 should preferably have a smaller surface free energy than that of a ferromagnetic material for the first and second ferromagnetic layers 11 and 14 for allowing the electrically conductive layer 12 to possess a good coverage characteristic to the first ferromagnetic layer 11. For this reason, Fe, Co, Ni and alloys thereof are available for the first and second ferromagnetic layers 11 and 14, whilst Al is available for the electrically conductive layer 12. Since the electrically conductive layer 12 has a smaller surface free energy than that of the ferromagnetic material for the first ferromagnetic layer 11 and possesses a good coverage, then the electrically conductive layer 12 is free of any pin holes, whereby the electrically conductive layer 12 is free from a problem with formation of an electrical short circuit between the first and second ferromagnetic layers 11 and 14 through any pin hole.

In addition, the electrically conductive material Al of the electrically conductive layer 12 has a larger formation free-energy per a single oxygen atom than that of the ferromagnetic material for the first and second ferromagnetic layers 11 and 14. The first and second interfaces between the intermediate oxide layer 24 and the first and second ferromagnetic layers 11 and 14 are thermally stable.

As a modification to the above, Mg and lanthanoids are also available for the electrically conductive material for the electrically conductive layer 12.

Fourteenth Method

The fourteenth novel method in accordance with the present invention will be described with reference to FIGS. 15A through 15F which are fragmentary cross sectional elevation views in sequential steps involved in a fourteenth novel method of forming a tunnel barrier layer sandwiched between two ferromagnetic layers in a ferromagnetic tunnel junction device in accordance with the present invention.

Figure 15A:
FIGS. 15A through 15F are fragmentary cross sectional elevation views in sequential steps involved in a fourteenth novel method of forming a tunnel barrier layer sandwiched between two ferromagnetic layers in a ferromagnetic tunnel junction device in accordance with the present invention.

With reference to FIG. 15A, a first ferromagnetic layer 11 is grown in a vacuum in a vacuum.

Figure 15B:
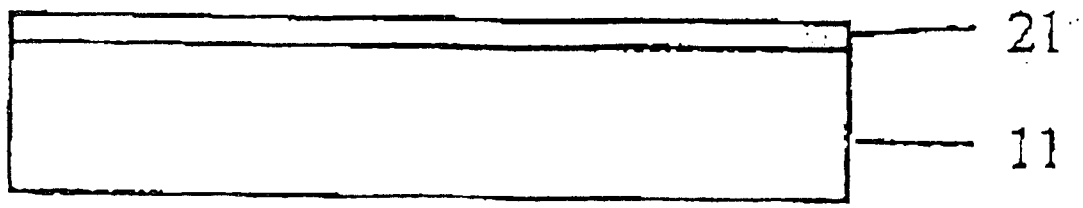

With reference to FIG. 15B, only a pure oxygen is introduced into the vacuum so that a surface of the first ferromagnetic layer 11 is subjected to the pure oxygen gas for causing a natural oxidation of the first ferromagnetic layer 11, whereby an upper region of the first ferromagnetic layer 11 is naturally oxidized. The natural oxidation is so conducted that an upper region of the first ferromagnetic layer 11 is made into an oxide upper region 21 of the first ferromagnetic layer 11.

Figure 15C:
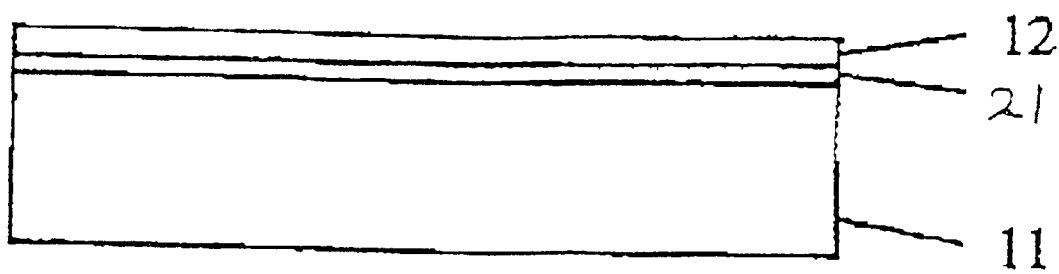

With reference to FIG. 15C, the pure oxygen gas is discharged before an electrically conductive layer 12 is grown in a vacuum on the oxide upper region 21 of the first ferromagnetic layer 11. An electrically conductive material of the electrically conductive layer 12 is selected to have a larger formation free-energy per a single oxygen atom than that of the ferromagnetic material for the first ferromagnetic layer 11. Oxygen atoms are more thermally stable in the electrically conductive layer 12 than in the oxide upper region 21 of the first ferromagnetic layer 11.

Figure 15D:
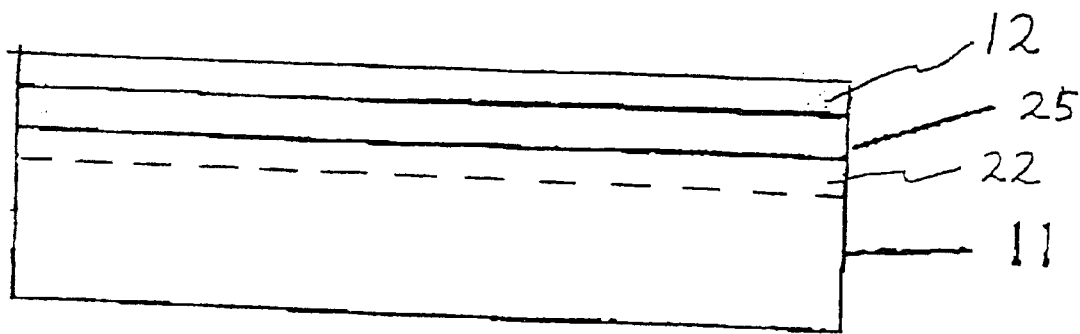

With reference to FIG. 15D, without any heat treatment, there are placed at about room temperature the laminations of the first ferromagnetic layer 11, the electrically conductive layer 12 and the oxide upper region 21 of the first ferromagnetic layer 11. As described above, the electrically conductive material of the electrically conductive layer 12 is selected to have a larger formation free-energy per a single oxygen atom than that of the ferromagnetic material for the first ferromagnetic layer 11, for which reason oxygen atoms are more thermally stable in the electrically conductive layer 12 than in the oxide upper region 21 of the first ferromagnetic layer 11. Therefore, there is caused a natural diffusion of oxygen from the oxide upper region 21 of the first ferromagnetic layer 11 into the electrically conductive layer 12, whereby only a lower region of the electrically conductive layer 12 is selectively oxidized by the natural diffusion of oxygen. As a result of the natural diffusion of oxygen atoms, only the lower region of the electrically conductive layer 12 is made into a lower oxide layer 25, whilst the oxide upper region 21 of the first ferromagnetic layer 11 is exactly reduced to form a reduction upper region 22 of the first ferromagnetic layer 11. Thus, the lower oxide layer 25 is formed over the reduction upper region 22 of the first ferromagnetic layer 11. Substantially all of the oxygen atoms in the oxide upper region 21 of the first ferromagnetic layer 11 are diffused into the lower region of the electrically conductive layer 12, whilst no oxygen atoms are, however, diffused from the lower oxide layer 25 to the reduction upper region 22 of the first ferromagnetic layer 11. Therefore, substantially no oxygen atoms remain in the reduction upper region 22 of the first ferromagnetic layer 11. The reduction upper region 22 exhibits the same ferromagnetic function and the same property as the first ferromagnetic layer 11, for which reason the reduction upper region 22 of the first ferromagnetic layer 11 is considered to be a part of the first ferromagnetic layer 11.

As a result of the natural diffusion of oxygen, a first abrupt interface is formed between the reduction upper region 22 of the first ferromagnetic layer 11 and the lower oxide layer 25 serving as a lower tunnel barrier, wherein the first abrupt interface has such an extremely high abruptness as a monoatomic layer level like that a width of a boundary area between an oxygen atom containing region as the lower oxide layer 25 and an oxygen atom free region as the reduction upper region 22 of the first ferromagnetic layer 11 is substantially the same as a boundary between adjacent two monoatomic layers which are respectively present in the lower oxide layer 25 and the reduction upper region 22 of the first ferromagnetic layer 11.

Figure 15E:
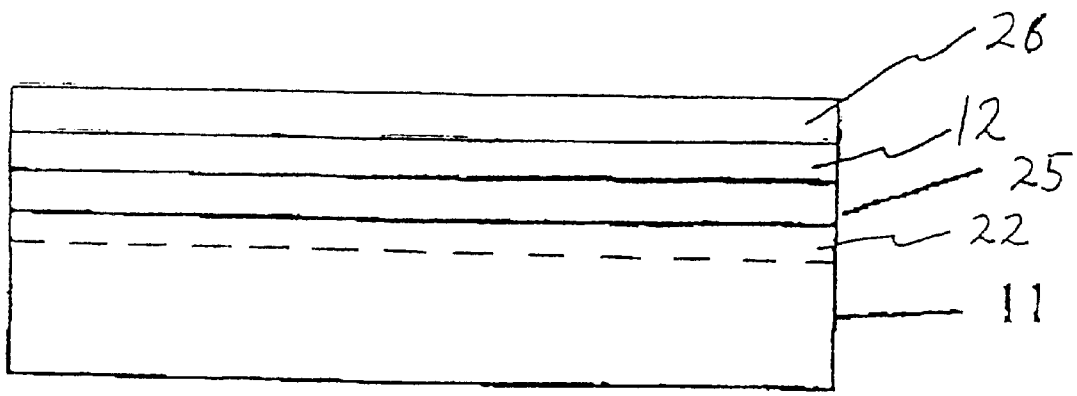

With reference to FIG. 15E, a pure oxygen is introduced into a vacuum to prepare a pure oxygen gas before the remaining electrically conductive layer 12 is subjected to the pure oxygen gas to cause a natural oxidation of only an upper region of the remaining electrically conductive layer 12, whereby only the upper region of the remaining electrically conductive layer 12 is made into an upper oxide layer 26 serving as an upper tunnel barrier, whilst an intermediate region of the originally formed electrically conductive layer 12 finally remains as the intermediate electrically conductive layer 12. As a result of the natural oxidation, the upper oxide layer 26 is formed over the intermediate electrically conductive layer 12 extending over the lower oxide layer 25. Namely, the intermediate electrically conductive layer 12 is sandwiched between the lower oxide layer 25 and the upper oxide layer 26. The lower oxide layer 25 and the upper oxide layer 26 form double tunnel barriers whilst the intermediate electrically conductive layer 12 forms a single potential well, thereby to form double tunnel barriers and a single potential well defined between the double tunnel barriers.

Figure 15F:
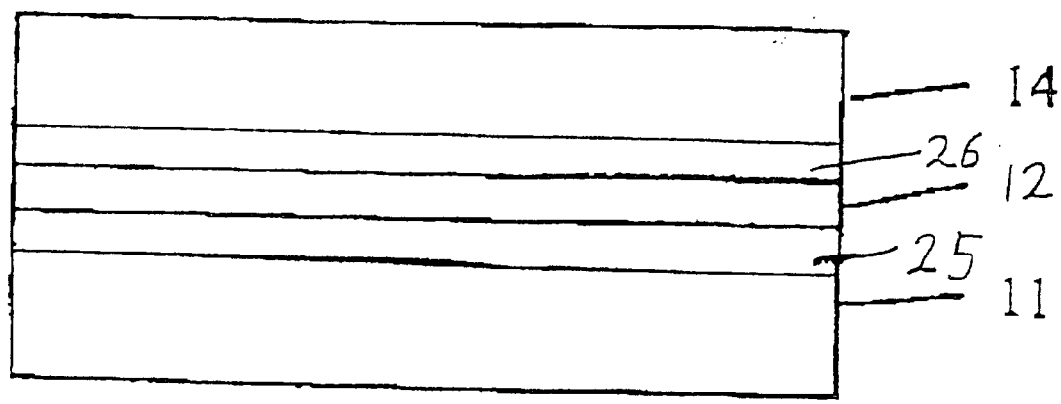

With reference to FIG. 15F, the oxygen gas is discharged before a second ferromagnetic layer 14 is grown on the upper oxide layer 26 so that the first and second ferromagnetic layers 11 and 14 sandwich laminations of the lower oxide layer 25, the intermediate electrically conductive layer 12 and the upper oxide layer 26. A ferromagnetic material for the second ferromagnetic layer 14 is selected to have a smaller formation free-energy per a single oxygen atom than that of the electrically conductive material of the electrically conductive layer 12, for which reason oxygen atoms are more thermally stable in the upper oxide layer 26 than in the second ferromagnetic layer 14. Therefore, no oxygen atoms are diffused from the upper oxide layer 26 to the second ferromagnetic layer 14. Therefore, substantially no oxygen atoms remain in the second ferromagnetic layer 14. As a result of the formation of the second ferromagnetic layer 14, a second abrupt interface is also formed between the second ferromagnetic layer 14 and the upper oxide layer 26 serving as the upper tunnel barrier, wherein the second abrupt interface has such an extremely high abruptness as a monoatomic layer level like that a width of a boundary area between an oxygen atom containing region as the upper oxide layer 26 and an oxygen atom free region as the second ferromagnetic layer 14 is substantially the same as a boundary between adjacent two monoatomic layers which are respectively present in the upper oxide layer 26 and the second ferromagnetic layer 14.

Namely, the lower and upper oxide layers 25 and 26 form double tunnel barriers and have the first and second extremely high abrupt interfaces with the first and second ferromagnetic layers 11 and 14 respectively, wherein each of the first and second abrupt interfaces has such an extremely high abruptness as a monoatomic layer level like that a width of a boundary area between an oxygen atom containing region as the lower and upper oxide layers 25 and 26 and an oxygen atom free region as the first or second ferromagnetic layer 11 or 14 is substantially the same as a boundary between adjacent two monoatomic layers which are respectively present in the lower or upper oxide layer 25 or 26 and the first or second ferromagnetic layer 11 or 14.

An electrically conductive material for the electrically conductive layer 12 should preferably have a smaller surface free energy than that of a ferromagnetic material for the first and second ferromagnetic layers 11 and 14 for allowing the electrically conductive layer 12 to possess a good coverage characteristic to the first ferromagnetic layer 11. For this reason, Fe, Co, Ni and alloys thereof are available for the first and second ferromagnetic layers 11 and 14, whilst Al is available for the electrically conductive layer 12. Since the electrically conductive layer 12 has a smaller surface free energy than that of the ferromagnetic material for the first ferromagnetic layer 11 and possesses a good coverage, then the electrically conductive layer 12 is free of any pin holes, whereby the electrically conductive layer 12 is free from a problem with formation of an electrical short circuit between the first and second ferromagnetic layers 11 and 14 through any pin hole.

In addition, the electrically conductive material Al of the electrically conductive layer 12 has a larger formation free-energy per a single oxygen atom than that of the ferromagnetic material for the first and second ferromagnetic layers 11 and 14. The first and second interfaces between the lower and upper oxide layers 25 and 26 and the first and second ferromagnetic layers 11 and 14 are thermally stable.

As a modification to the above, Mg and lanthanoids are also available for the electrically conductive material for the electrically conductive layer 12.

Fifteenth Method

The fifteenth novel method in accordance with the present invention will be described with reference to FIGS. 16A through 16F which are fragmentary cross sectional elevation views in sequential steps involved in a fifteenth novel method of forming a tunnel barrier layer sandwiched between two ferromagnetic layers in a ferromagnetic tunnel junction device in accordance with the present invention.

Figure 16A:
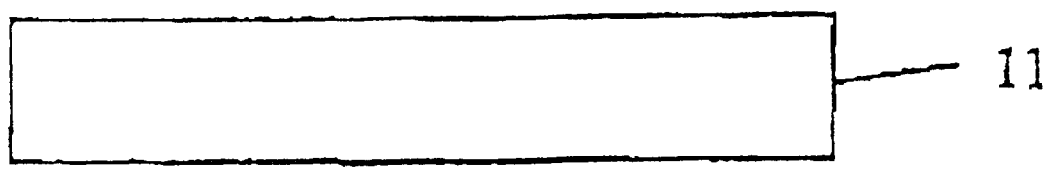
FIGS. 16A through 16F are fragmentary cross sectional elevation views in sequential steps involved in a fifteenth novel method of forming a tunnel barrier layer sandwiched between two ferromagnetic layers in a ferromagnetic tunnel junction device in accordance with the present invention.

With reference to FIG. 16A, a first ferromagnetic layer 11 is grown in a vacuum in a vacuum.

Figure 16B:
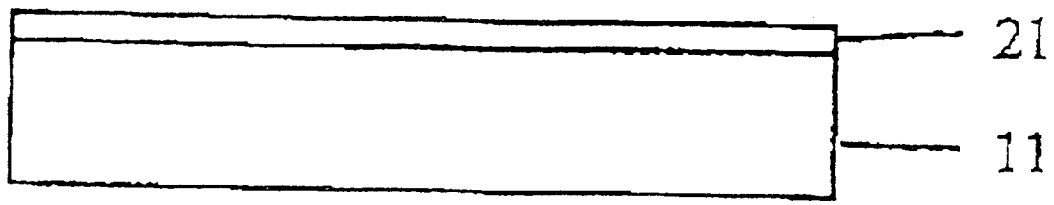

With reference to FIG. 16B, only a pure oxygen is introduced into the vacuum so that a surface of the first ferromagnetic layer 11 is subjected to the pure oxygen gas for causing a natural oxidation of the first ferromagnetic layer 11, whereby an upper region of the first ferromagnetic layer 11 is naturally oxidized. The natural oxidation is so conducted that an upper region of the first ferromagnetic layer 11 is made into an oxide upper region 21 of the first ferromagnetic layer 11.

Figure 16C:
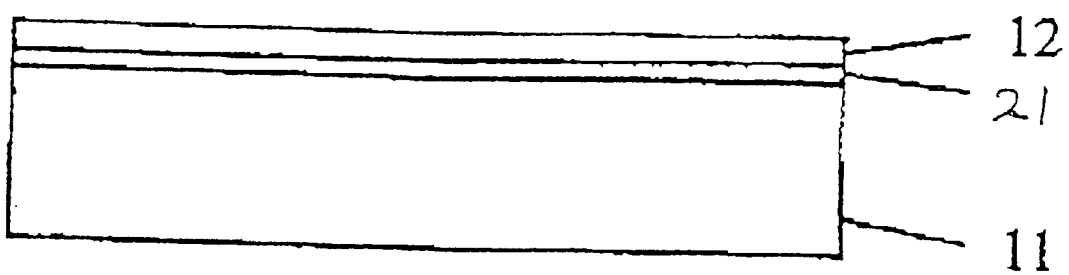

With reference to FIG. 16C, the pure oxygen gas is discharged before an electrically conductive layer 12 is grown in a vacuum on the oxide upper region 21 of the first ferromagnetic layer 11. An electrically conductive material of the electrically conductive layer 12 is selected to have a larger formation free-energy per a single oxygen atom than that of the ferromagnetic material for the first ferromagnetic layer 11. Oxygen atoms are more thermally stable in the electrically conductive layer 12 than in the oxide upper region 21 of the first ferromagnetic layer 11.

Figure 16D:
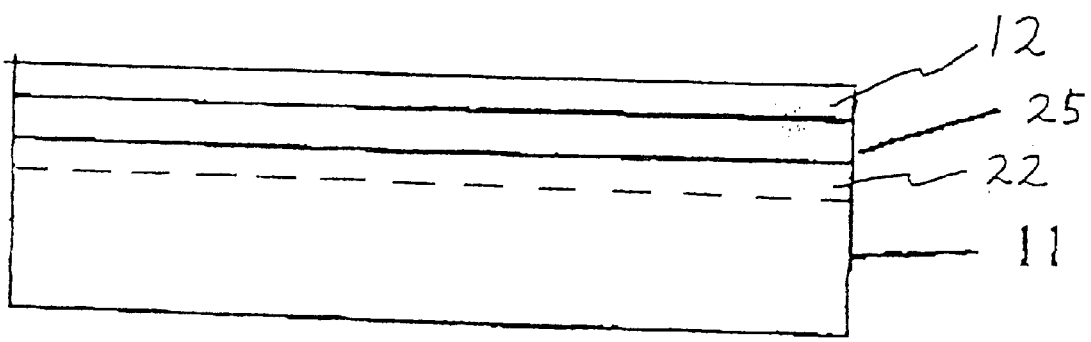

With reference to FIG. 16D, without any heat treatment, there are placed at about room temperature the laminations of the first ferromagnetic layer 11, the electrically conductive layer 12 and the oxide upper region 21 of the first ferromagnetic layer 11. As described above, the electrically conductive material of the electrically conductive layer 12 is selected to have a larger formation free-energy per a single oxygen atom than that of the ferromagnetic material for the first ferromagnetic layer 11, for which reason oxygen atoms are more thermally stable in the electrically conductive layer 12 than in the oxide upper region 21 of the first ferromagnetic layer 11. Therefore, there is caused a natural diffusion of oxygen from the oxide upper region 21 of the first ferromagnetic layer 11 into the electrically conductive layer 12, whereby only a lower region of the electrically conductive layer 12 is selectively oxidized by the natural diffusion of oxygen. As a result of the natural diffusion of oxygen atoms, only the lower region of the electrically conductive layer 12 is made into a lower oxide layer 25, whilst the oxide upper region 21 of the first ferromagnetic layer 11 is exactly reduced to form a reduction upper region 22 of the first ferromagnetic layer 11. Thus, the lower oxide layer 25 is formed over the reduction upper region 22 of the first ferromagnetic layer 11. The lower oxide layer 25 forms a lower tunnel barrier. Substantially all of the oxygen atoms in the oxide upper region 21 of the first ferromagnetic layer 11 are diffused into the lower region of the electrically conductive layer 12, whilst no oxygen atoms are, however, diffused from the lower oxide layer 25 to. the reduction upper region 22 of the first ferromagnetic layer 11. Therefore, substantially no oxygen atoms remain in the reduction upper region 22 of the first ferromagnetic layer 11. The reduction upper region 22 exhibits the same ferromagnetic function and the same property as the first ferromagnetic layer 11, for which reason the reduction upper region 22 of the first ferromagnetic layer 11 is considered to be a part of the first ferromagnetic layer 11.

As a result of the thermal diffusion of oxygen, a first abrupt interface is formed between the reduction upper region 22 of the first ferromagnetic layer 11 and the lower oxide layer 25 serving as a lower tunnel barrier, wherein the first abrupt interface has such an extremely high abruptness as a monoatomic layer level like that a width of a boundary area between an oxygen atom containing region as the oxide layer 24 and an oxygen atom free region as the reduction upper region 22 of the first ferromagnetic layer 11 is substantially the same as a boundary between adjacent two monoatomic layers which are respectively present in the lower oxide layer 25 and the reduction upper region 21 of the first ferromagnetic layer 11.

Figure 16E:
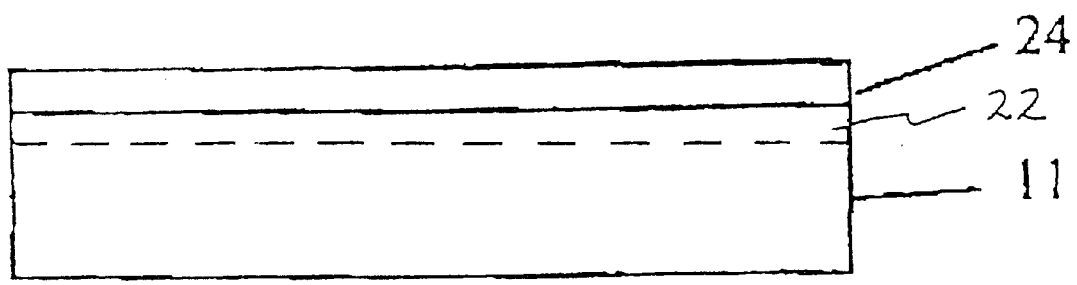

With reference to FIG. 16E, a pure oxygen is introduced into a vacuum to prepare a pure oxygen gas before the remaining electrically conductive layer 12 is subjected to the pure oxygen gas to cause a natural oxidation of an entire region of the remaining electrically conductive layer 12, whereby an entire part region of the remaining electrically conductive layer 12 and the lower oxide layer 25 are made into an intermediate oxide layer 24 serving as a single tunnel barrier. As a result of the natural oxidation, the intermediate oxide layer 24 is formed over the reduction upper region 22 of the first ferromagnetic layer 11. The intermediate oxide layer 24 forms a single tunnel barrier.

Figure 16F:
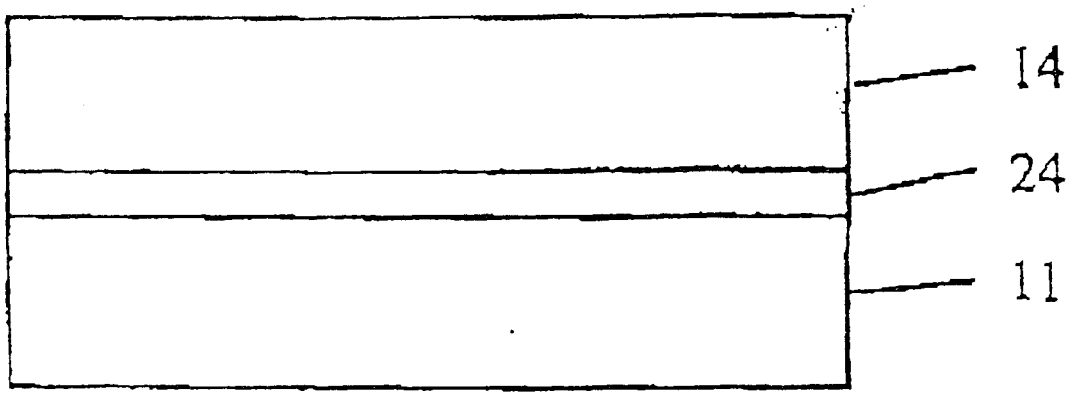

With reference to FIG. 16F, a second ferromagnetic layer 14 is grown on the intermediate oxide layer 24 so that the first and second ferromagnetic layers 11 and 14 sandwich the intermediate oxide layer 24 forming the single tunnel barrier. A ferromagnetic material for the second ferromagnetic layer 14 is selected to have a smaller formation free-energy per a single oxygen atom than that of the electrically conductive material of the electrically conductive layer 12, for which reason oxygen atoms are more thermally stable in the oxide layer 24 than in the second ferromagnetic layer 14. Therefore, no oxygen atoms are diffused from the oxide layer 24 to the second ferromagnetic layer 14. Therefore, substantially no oxygen atoms remain in the second ferromagnetic layer 14. As a result of the formation of the second ferromagnetic layer 14, a second abrupt interface is also formed between the second ferromagnetic layer 14 and the oxide layer 24 serving as the upper tunnel barrier, wherein the second abrupt interface has such an extremely high abruptness as a monoatomic layer level like that a width of a boundary area between an oxygen atom containing region as the oxide layer 24 and an oxygen atom free region as the second ferromagnetic layer 14 is substantially the same as a boundary between adjacent two monoatomic layers which are respectively present in the oxide layer 24 and the second ferromagnetic layer 14.

Namely, the intermediate oxide layer 24 forms a single tunnel barrier and has the first and second extremely high abrupt interfaces with the first and second ferromagnetic layers 11 and 14 respectively, wherein each of the first and second abrupt interfaces has such an extremely high abruptness as a monoatomic layer level like that a width of a boundary area between an oxygen atom containing region as the oxide layer 24 and an oxygen atom free region as the first or second ferromagnetic layer 11 or 14 is substantially the same as a boundary between adjacent two monoatomic layers which are respectively present in the oxide layer 24 and the first or second ferromagnetic layer 11 or 14.

An electrically conductive material for the electrically conductive layer 12 should preferably have a smaller surface free energy than that of a ferromagnetic material for the first and second ferromagnetic layers 11 and 14 for allowing the electrically conductive layer 12 to possess a good coverage characteristic to the first ferromagnetic layer 11. For this reason, Fe, Co, Ni and alloys thereof are available for the first and second ferromagnetic layers 11 and 14, whilst Al is available for the electrically conductive layer 12. Since the electrically conductive layer 12 has a smaller surface free energy than that of the ferromagnetic material for the first ferromagnetic layer 11 and possesses a good coverage, then the electrically conductive layer 12 is free of any pin holes, whereby the electrically conductive layer 12 is free from a problem with formation of an electrical short circuit between the first and second ferromagnetic layers 11 and 14 through any pin hole.

In addition, the electrically conductive material Al of the electrically conductive layer 12 has a larger formation free-energy per a single oxygen atom than that of the ferromagnetic material for the first and second ferromagnetic layers 11 and 14. The first and second interfaces between the oxide layer 24 and the first and second ferromagnetic layers 11 and 14 are thermally stable.

As a modification to the above, Mg and lanthanoids are also available for the electrically conductive material for the electrically conductive layer 12.

Sixteenth Method

The sixteenth novel method in accordance with the present invention will be described with reference to FIGS. 17A through 17E which are fragmentary cross sectional elevation views in sequential steps involved in a sixteenth novel method of forming a tunnel barrier layer sandwiched between two ferromagnetic layers in a ferromagnetic tunnel junction device in accordance with the present invention.

Figure 17A:
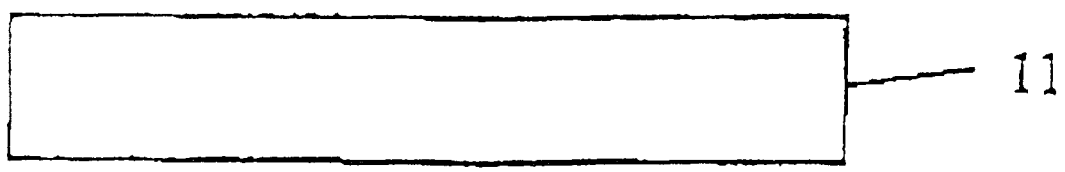
FIGS. 17A through 17E are fragmentary cross sectional elevation views in sequential steps involved in a sixteenth novel method of forming a tunnel barrier layer sandwiched between two ferromagnetic layers in a ferromagnetic tunnel junction device in accordance with the present invention.

With reference to FIG. 17A, a first ferromagnetic layer 11 is grown in a vacuum in a vacuum.

Figure 17B:
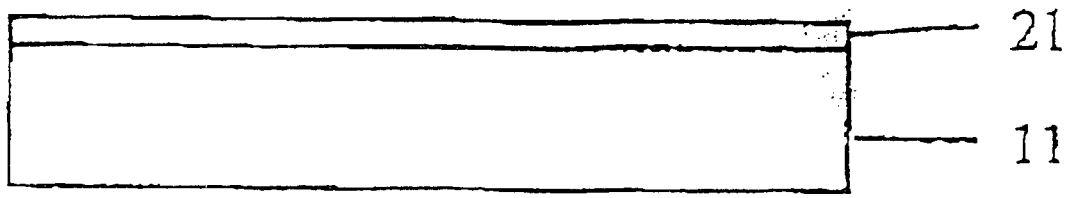

With reference to FIG. 17B, only a pure oxygen is introduced into the vacuum so that a surface of the first ferromagnetic layer 11 is subjected to the pure oxygen gas for causing a natural oxidation of the first ferromagnetic layer 11, whereby an upper region of the first ferromagnetic layer 11 is naturally oxidized. The natural oxidation is so conducted that an upper region of the first ferromagnetic layer 11 is made into an oxide upper region 21 of the first ferromagnetic layer 11.

Figure 17C:
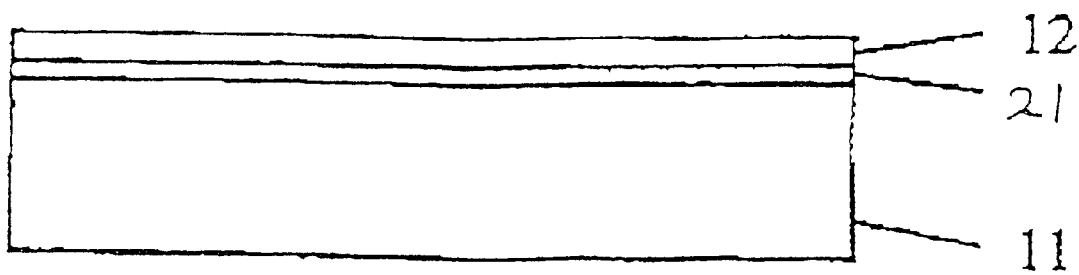

With reference to FIG. 17C, the pure oxygen gas is discharged before an electrically conductive layer 12 is grown in a vacuum on the oxide upper region 21 of the first ferromagnetic layer 11. An electrically conductive material of the electrically conductive layer 12 is selected to have a larger formation free-energy per a single oxygen atom than that of the ferromagnetic material for the first ferromagnetic layer 11. Oxygen atoms are more thermally stable in the electrically conductive layer 12 than in the oxide upper region 21 of the first ferromagnetic layer 11.

Figure 17D:
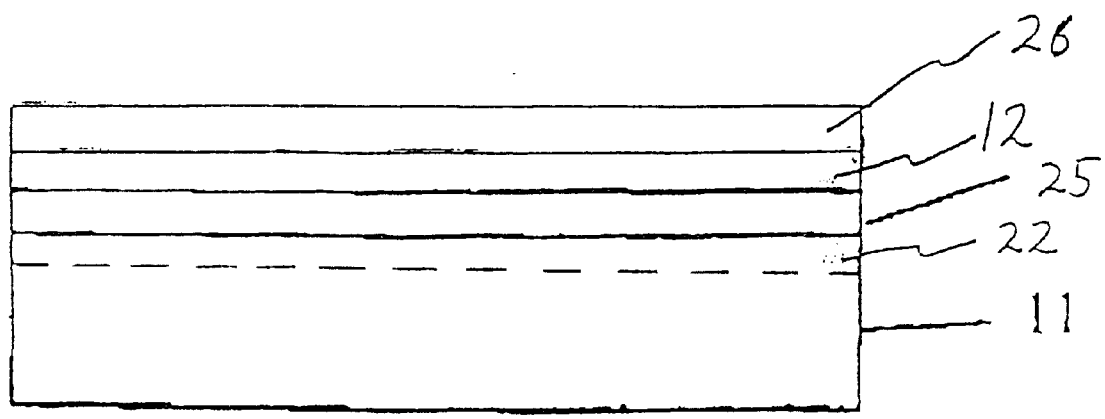

With reference to FIG. 17D, immediately after the electrically conductive layer 12 has been grown, a pure oxygen is introduced into a vacuum to prepare a pure oxygen gas before the remaining electrically conductive layer 12 is subjected to the pure oxygen gas to cause a natural oxidation of only an upper region of the remaining electrically conductive layer 12, whereby only the upper region of the remaining electrically conductive layer 12 is made into an upper oxide layer 26 serving as an upper tunnel barrier, whilst an intermediate region of the originally formed electrically conductive layer 12 finally remains as the intermediate electrically conductive layer 12. As a result of the natural oxidation, the upper oxide layer 26 is formed over the intermediate electrically conductive layer 12.

During the above natural oxidation of the upper region of the remaining electrically conductive layer 12, there are placed at about room temperature the laminations of the first ferromagnetic layer 11, the electrically conductive layer 12 and the oxide upper region 21 of the first ferromagnetic layer 11 without any heat treatment. As described above, the electrically conductive material of the electrically conductive layer 12 is selected to have a larger formation free-energy per a single oxygen atom than that of the ferromagnetic material for the first ferromagnetic layer 11, for which reason oxygen atoms are more thermally stable in the electrically conductive layer 12 than in the oxide upper region 21 of the first ferromagnetic layer 11. Therefore, there is caused a natural diffusion of oxygen from the oxide upper region 21 of the first ferromagnetic layer 11 into the electrically conductive layer 12, whereby only a lower region of the electrically conductive layer 12 is selectively oxidized by the natural diffusion of oxygen. As a result of the natural diffusion of oxygen atoms, only the lower region of the electrically conductive layer 12 is made into a lower oxide layer 25, whilst the oxide upper region 21 of the first ferromagnetic layer 11 is exactly reduced to form a reduction upper region 22 of the first ferromagnetic layer 11. Thus, the lower oxide layer 25 is formed over the reduction upper region 22 of the first ferromagnetic layer 11. Substantially all of the oxygen atoms in the oxide upper region 21 of the first ferromagnetic layer 11 are diffused into the lower region of the electrically conductive layer 12, whilst no oxygen atoms are, however, diffused from the lower oxide layer 25 to the reduction upper region 22 of the first ferromagnetic layer 11. Therefore, substantially no oxygen atoms remain in the reduction upper region 22 of the first ferromagnetic layer 11. The reduction upper region 22 exhibits the same ferromagnetic function and the same property as the first ferromagnetic layer 11, for which reason the reduction upper region 22 of the first ferromagnetic layer 11 is considered to be a part of the first ferromagnetic layer 11.

Therefore, there are concurrently caused both the natural oxidation by subjecting the upper region of the electrically conductive material to the pure oxygen gas and the natural diffusion of oxygen atoms from the oxide upper region 21 of the first ferromagnetic layer 11 into the lower region of the electrically conductive layer 12, whereby the lower oxide layer 25 and the upper oxide layer 26 are concurrently formed to sandwich the remaining intermediate electrically conductive layer 12.

Namely, the intermediate electrically conductive layer 12 is sandwiched between the lower oxide layer 25 and the upper oxide layer 26. The lower oxide layer 25 and the upper oxide layer 26 form double tunnel barriers whilst the intermediate electrically conductive layer 12 forms a single potential well, thereby to form double tunnel barriers and a single potential well defined between the double tunnel barriers.

As a result of the natural diffusion of oxygen, a first abrupt interface is formed between the reduction upper region 22 of the first ferromagnetic layer 11 and the lower oxide layer 25 serving as a lower tunnel barrier, wherein the first abrupt interface has such an extremely high abruptness as a monoatomic layer level like that a width of a boundary area between an oxygen atom containing region as the lower oxide layer 25 and an oxygen atom free region as the reduction upper region 22 of the first ferromagnetic layer 11 is substantially the same as a boundary between adjacent two monoatomic layers which are respectively present in the lower oxide layer 25 and the reduction upper region 22 of the first ferromagnetic layer 11.

Figure 17E:
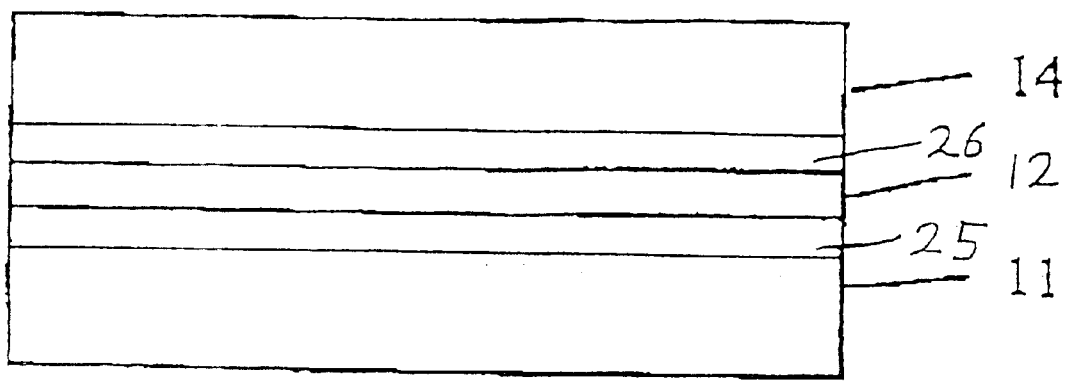

With reference to FIG. 17E, the oxygen gas is discharged before a second ferromagnetic layer 14 is grown on the upper oxide layer 26 so that the first and second ferromagnetic layers 11 and 14 sandwich laminations of the lower oxide layer 25, the intermediate electrically conductive layer 12 and the upper oxide layer 26. A ferromagnetic material for the second ferromagnetic layer 14 is selected to have a smaller formation free-energy per a single oxygen atom than that of the electrically conductive material of the electrically conductive layer 12, for which reason oxygen atoms are more thermally stable in the upper oxide layer 26 than in the second ferromagnetic layer 14. Therefore, no oxygen atoms are diffused from the upper oxide layer 26 to the second ferromagnetic layer 14. Therefore, substantially no oxygen atoms remain in the second ferromagnetic layer 14. As a result of the formation of the second ferromagnetic layer 14, a second abrupt interface is also formed between the second ferromagnetic layer 14 and the upper oxide layer 26 serving as the upper tunnel barrier, wherein the second abrupt interface has such an extremely high abruptness as a monoatomic layer level like that a width of a boundary area between an oxygen atom containing region as the upper oxide layer 26 and an oxygen atom free region as the second ferromagnetic layer 14 is substantially the same as a boundary between adjacent two monoatomic layers which are respectively present in the upper oxide layer 26 and the second ferromagnetic layer 14.

Namely, the lower and upper oxide layers 25 and 26 form double tunnel barriers and have the first and second extremely high abrupt interfaces with the first and second ferromagnetic layers 11 and 14 respectively, wherein each of the first and second abrupt interfaces has such an extremely high abruptness as a monoatomic layer level like that a width of a boundary area between an oxygen atom containing region as the lower and upper oxide layers 25 and 26 and an oxygen atom free region as the first or second ferromagnetic layer 11 or 14 is substantially the same as a boundary between adjacent two monoatomic layers which are respectively present in the lower or upper oxide layer 25 or 26 and the first or second ferromagnetic layer 11 or 14.

An electrically conductive material for the electrically conductive layer 12 should preferably have a smaller surface free energy than that of a ferromagnetic material for the first and second ferromagnetic layers 11 and 14 for allowing the electrically conductive layer 12 to possess a good coverage characteristic to the first ferromagnetic layer 11. For this reason, Fe, Co, Ni and alloys thereof are available for the first and second ferromagnetic layers 11 and 14, whilst Al is available for the electrically conductive layer 12. Since the electrically conductive layer 12 has a smaller surface free energy than that of the ferromagnetic material for the first ferromagnetic layer 11 and possesses a good coverage, then the electrically conductive layer 12 is free of any pin holes, whereby the electrically conductive layer 12 is free from a problem with formation of an electrical short circuit between the first and second ferromagnetic layers 11 and 14 through any pin hole.

In addition, the electrically conductive material Al of the electrically conductive layer 12 has a larger formation free-energy per a single oxygen atom than that of the ferromagnetic material for the first and second ferromagnetic layers 11 and 14. The first and second interfaces between the lower and upper oxide layers 25 and 26 and the first and second ferromagnetic layers 11 and 14 are thermally stable.

As a modification to the above, Mg and lanthanoids are also available for the electrically conductive material for the electrically conductive layer 12.

Seventeenth Method

The seventeenth novel method in accordance with the present invention will be described with reference to FIGS. 18A through 18E which are fragmentary cross sectional elevation views in sequential steps involved in a seventeenth novel method of forming a tunnel barrier layer sandwiched between two ferromagnetic layers in a ferromagnetic tunnel junction device in accordance with the present invention.

Figure 18A:
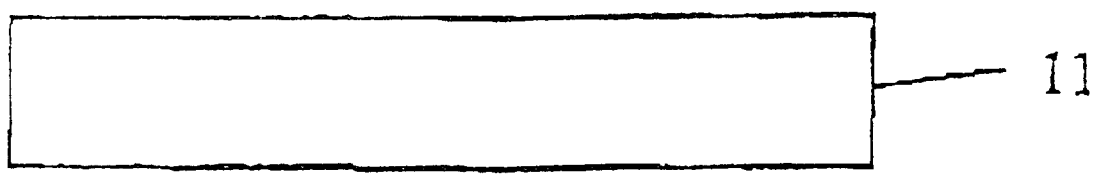
FIGS. 18A through 18E are fragmentary cross sectional elevation views in sequential steps involved in a seventeenth novel method of forming a tunnel barrier layer sandwiched between two ferromagnetic layers in a ferromagnetic tunnel junction device in accordance with the present invention.

With reference to FIG. 18A, a first ferromagnetic layer 11 is grown in a vacuum in a vacuum.

Figure 18B:
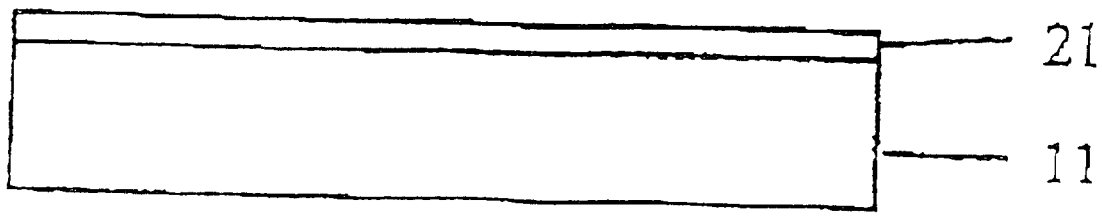

With reference to FIG. 18B, only a pure oxygen is introduced into the vacuum so that a surface of the first ferromagnetic layer 11 is subjected to the pure oxygen gas for causing a natural oxidation of the first ferromagnetic layer 11, whereby an upper region of the first ferromagnetic layer 11 is naturally oxidized. The natural oxidation is so conducted that an upper region of the first ferromagnetic layer 11 is made into an oxide upper region 21 of the first ferromagnetic layer 11.

Figure 18C:
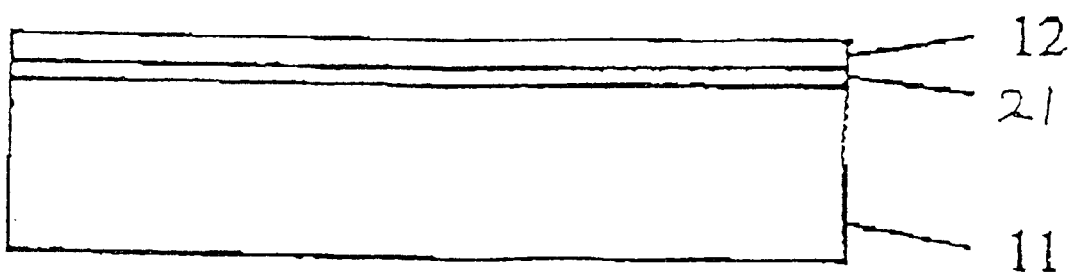

With reference to FIG. 18C, the pure oxygen gas is discharged before an electrically conductive layer 12 is grown in a vacuum on the oxide upper region 21 of the first ferromagnetic layer 11. An electrically conductive material of the electrically conductive layer 12 is selected to have a larger formation free-energy per a single oxygen atom than that of the ferromagnetic material for the first ferromagnetic layer 11. Oxygen atoms are more thermally stable in the electrically conductive layer 12 than in the oxide upper region 21 of the first ferromagnetic layer 11.

Figure 18D:
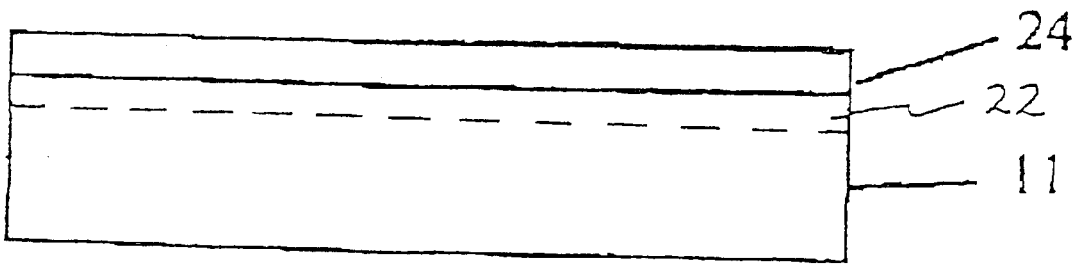

With reference to FIG. 18D, immediately after the electrically conductive layer 12 has been grown, a pure oxygen is introduced into a vacuum to prepare a pure oxygen gas before the remaining electrically conductive layer 12 is subjected to the pure oxygen gas to cause a natural oxidation of only an upper region of the remaining electrically conductive layer 12.

During the above natural oxidation of the upper region of the remaining electrically conductive layer 12, there are placed at about room temperature the laminations of the first ferromagnetic layer 11, the electrically conductive layer 12 and the oxide upper region 21 of the first ferromagnetic layer 11 without any heat treatment. As described above, the electrically conductive material of the electrically conductive layer 12 is selected to have a larger formation free-energy per a single oxygen atom than that of the ferromagnetic material for the first ferromagnetic layer 11, for which reason oxygen atoms are more thermally stable in the electrically conductive layer 12 than in the oxide upper region 21 of the first ferromagnetic layer 11. Therefore, there is caused a natural diffusion of oxygen from the oxide upper region 21 of the first ferromagnetic layer 11 into the electrically conductive layer 12, whereby a lower region of the electrically conductive layer 12 is oxidized by the natural diffusion of oxygen. As a result of the natural diffusion of oxygen atoms, the oxide upper region 21 of the first ferromagnetic layer 11 is exactly reduced to form a reduction upper region 22 of the first ferromagnetic layer 11. Thus, the lower oxide layer 25 is formed over the reduction upper region 22 of the first ferromagnetic layer 11. Substantially all of the oxygen atoms in the oxide upper region 21 of the first ferromagnetic layer 11 are diffused into the electrically conductive layer 12, whilst no oxygen atoms are, however, diffused from the lower oxide layer 25 to the reduction upper region 22 of the first ferromagnetic layer 11. Therefore, substantially no oxygen atoms remain in the reduction upper region 22 of the first ferromagnetic layer 11. The reduction upper region 22 exhibits the same ferromagnetic function and the same property as the first ferromagnetic layer 11, for which reason the reduction upper region 22 of the first ferromagnetic layer 11 is considered to be a part of the first ferromagnetic layer 11.

Therefore, there are concurrently caused both the natural oxidation by subjecting the upper region of the electrically conductive material to the pure oxygen gas and the natural diffusion of oxygen atoms from the oxide upper region 21 of the first ferromagnetic layer 11 into the lower region of the electrically conductive layer 12, whereby the entire part of the electrically conductive layer 12 is made into an intermediate oxide layer 14. Thus, the intermediate oxide layer 24 is formed on the reduction upper region 22 of the first ferromagnetic layer 11.

Namely, the intermediate oxide layer 24 is sandwiched between the first and second ferromagnetic layers 11 and 14. The intermediate oxide layer 24 forms a single tunnel barrier.

As a result of the natural diffusion of oxygen, a first abrupt interface is formed between the reduction upper region 22 of the first ferromagnetic layer 11 and the intermediate oxide layer 24 serving as a single tunnel barrier, wherein the first abrupt interface has such an extremely high abruptness as a monoatomic layer level like that a width of a boundary area between an oxygen atom containing region as the intermediate oxide layer 24 and an oxygen atom free region as the reduction upper region 22 of the first ferromagnetic layer 11 is substantially the same as a boundary between adjacent two monoatomic layers which are respectively present in the intermediate oxide layer 24 and the reduction upper region 22 of the first ferromagnetic layer 11.

Figure 18E:
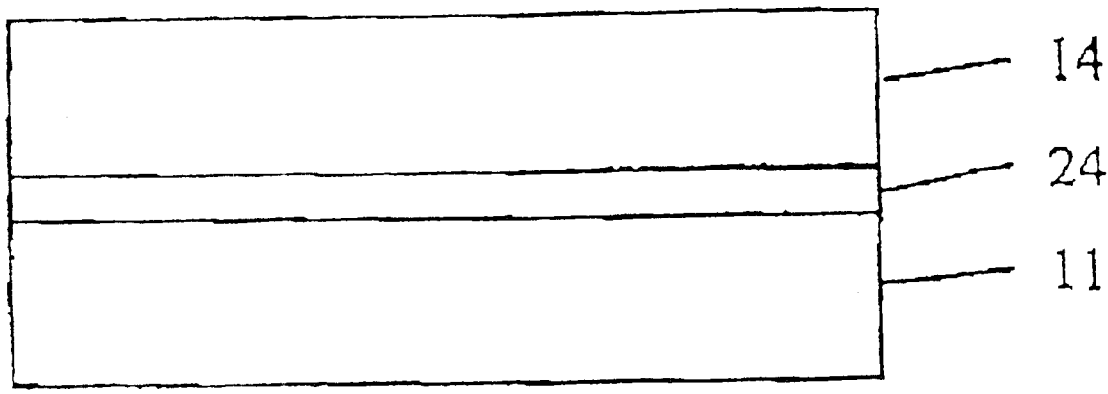

With reference to FIG. 18E, the oxygen gas is discharged before a second ferromagnetic layer 14 is grown on the intermediate oxide layer 24 so that the first and second ferromagnetic layers 11 and 14 sandwich the intermediate oxide layer 24. A ferromagnetic material for the second ferromagnetic layer 14 is selected to have a smaller formation free-energy per a single oxygen atom than that of the electrically conductive material of the electrically conductive layer 12, for which reason oxygen atoms are more thermally stable in the intermediate oxide layer 24 than in the second ferromagnetic layer 14. Therefore, no oxygen atoms are diffused from the intermediate oxide layer 24 to the second ferromagnetic layer 14. Therefore, substantially no oxygen atoms remain in the second ferromagnetic layer 14. As a result of the formation of the second ferromagnetic layer 14, a second abrupt interface is also formed between the second ferromagnetic layer 14 and the intermediate oxide layer 24 serving as the single tunnel barrier, wherein the second abrupt interface has such an extremely high abruptness as a monoatomic layer level like that a width of a boundary area between an oxygen atom containing region as the intermediate oxide layer 24 and an oxygen atom free region as the second ferromagnetic layer 14 is substantially the same as a boundary between adjacent two monoatomic layers which are respectively present in the intermediate oxide layer 24 and the second ferromagnetic layer 14.

Namely, the intermediate oxide layer 24 forms the single tunnel barrier and has the first and second extremely high abrupt interfaces with the first and second ferromagnetic layers 11 and 14 respectively, wherein each of the first and second abrupt interfaces has such an extremely high abruptness as a monoatomic layer level like that a width of a boundary area between an oxygen atom containing region as the intermediate oxide layer 24 and an oxygen atom free region as the first or second ferromagnetic layer 11 or 14 is substantially the same as a boundary between adjacent two monoatomic layers which are respectively present in the intermediate oxide layer 24 and the first or second ferromagnetic layer 11 or 14.

An electrically conductive material for the electrically conductive layer 12 should preferably have a smaller surface free energy than that of a ferromagnetic material for the first and second ferromagnetic layers 11 and 14 for allowing the electrically conductive layer 12 to possess a good coverage characteristic to the first ferromagnetic layer 11. For this reason, Fe, Co, Ni and alloys thereof are available for the first and second ferromagnetic layers 11 and 14, whilst Al is available for the electrically conductive layer 12. Since the electrically conductive layer 12 has a smaller surface free energy than that of the ferromagnetic material for the first ferromagnetic layer 11 and possesses a good coverage, then the electrically conductive layer 12 is free of any pin holes, whereby the electrically conductive layer 12 is free from a problem with formation of an electrical short circuit between the first and second ferromagnetic layers 11 and 14 through any pin hole.

In addition, the electrically conductive material Al of the electrically conductive layer 12 has a larger formation free-energy per a single oxygen atom than that of the ferromagnetic material for the first and second ferromagnetic layers 11 and 14. The first and second interfaces between the intermediate oxide layer 24 and the first and second ferromagnetic layers 11 and 14 are thermally stable.

As a modification to the above, Mg and lanthanoids are also available for the electrically conductive material for the electrically conductive layer 12.

PREFERRED EMBODIMENTS
First Embodiment

A first embodiment according to the present invention will be described in detail with reference to FIGS. 19A through 19F which are fragmentary cross sectional elevation views illustrative of novel ferromagnetic tunnel junction devices in sequential steps involved in a novel fabrication method in a first embodiment in accordance with the present invention.

Figure 19A:
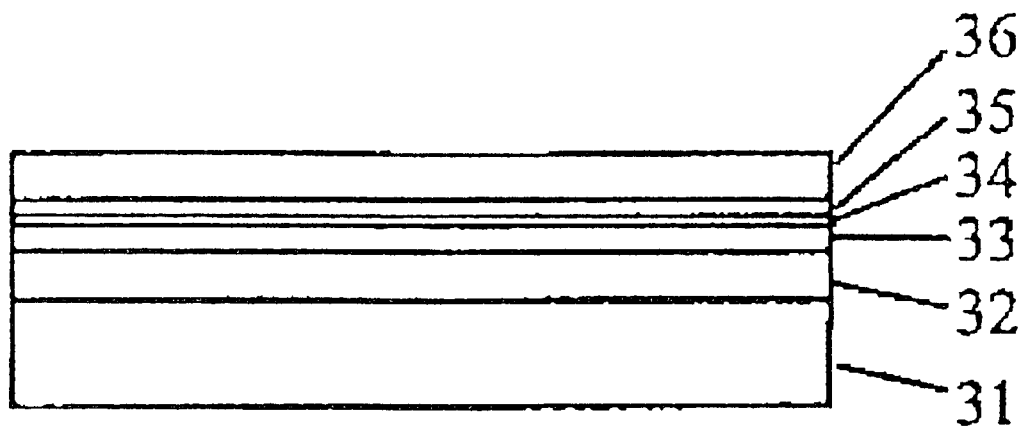
FIGS. 19A through 19F are fragmentary cross sectional elevation views illustrative of novel ferromagnetic tunnel junction devices in sequential steps involved in a novel fabrication method in a first embodiment in accordance with the present invention.

With reference to FIG. 19A, a silicon substrate 31 is prepared for forming a ferromagnetic tunnel junction device thereon. A surface of the silicon substrate 31 is subjected to a thermal oxidation to form an oxide surface which is not illustrated. A first Al interconnection layer 32 having a thickness of 50 nanometers is deposited by a sputtering method on the oxide surface of the silicon substrate 31. Subsequently, a first Fe ferromagnetic layer 33 having a thickness of 10 nanometers is further deposited by a sputtering method on the first Al interconnection layer 32. Further subsequently, an Al conductive layer 34 having a thickness of 2 nanometers is deposited by a sputtering method on the first Fe ferromagnetic layer 33. Those sequential sputtering processes are conducted using a radio frequency magnetron sputtering system provided with four targets of 4 inches in diameter. Further, those sequential sputtering processes are conducted under the conditions of a background pressure of not higher than $1 \times 10^{-7}$ Torr, an Ar pressure of 10 mTorr, and a high frequency power of 200 W.

Thereafter, a pure oxygen is introduced into a sputter chamber of the radio frequency magnetron sputtering system so as to keep an oxygen pressure in the range of 20 mTorr to 200 Torr for 10 minutes whereby the surface of the Al conductive layer 34 is subjected to the pure oxygen gas for causing a natural oxidation of the Al conductive layer 34 except for a lower region thereof. As a result, an alumina tunnel barrier layer 35 is formed over the remaining Al conductive layer 34. The oxygen is discharged to reduce the pressure into the above background pressure before a second CoFe ferromagnetic layer 36 having a thickness of 20 nanometers is deposited by a sputtering method onto a surface of the alumina tunnel barrier layer 35 thereby to form a multi-layer structure over the silicon substrate 31, wherein the multi-layer structure comprises laminations of the first Al interconnection layer 32, the first Fe ferromagnetic layer 33. the Al conductive layer 34, the alumina tunnel barrier layer 35 and the second CoFe ferromagnetic layer 36.

Figure 19B:
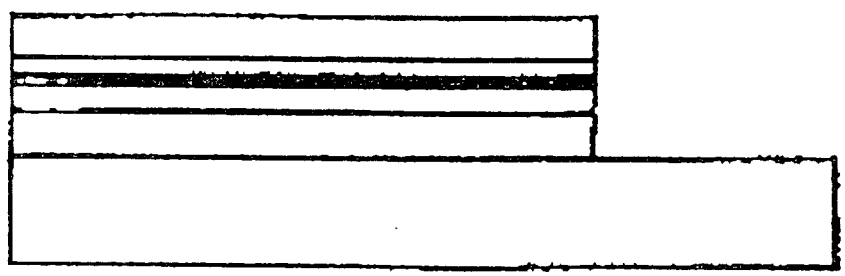

With reference to FIG. 19B, the multi-layer structure is patterned in the form of a bottom interconnection by the normal techniques of a photo-lithography and a subsequent ion-milling.

Figure 19C:
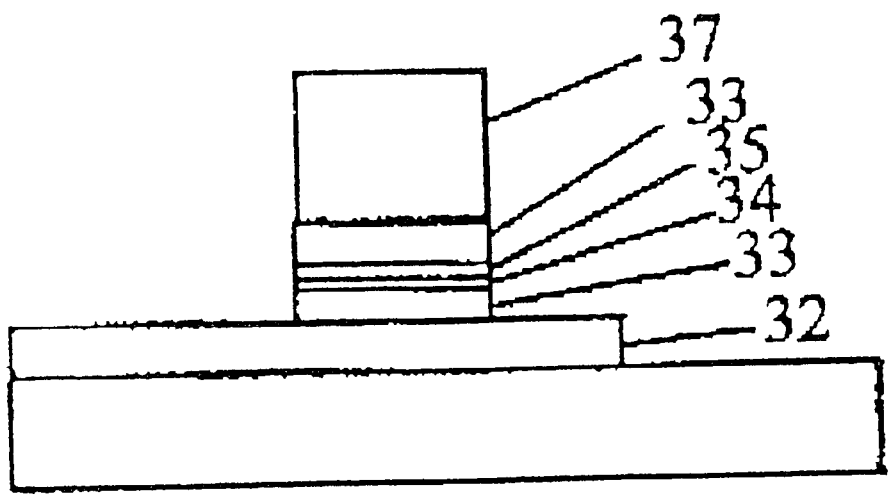

With reference to FIG. 19C, a resist pattern 37 for defining a junction dimension or size is formed on the patterned multi-layer structure so that an ion-milling is carried out using the resist pattern 37 as a mask to selectively remove the multi-layer structure except for the first Al interconnection layer 32.

Figure 19D:
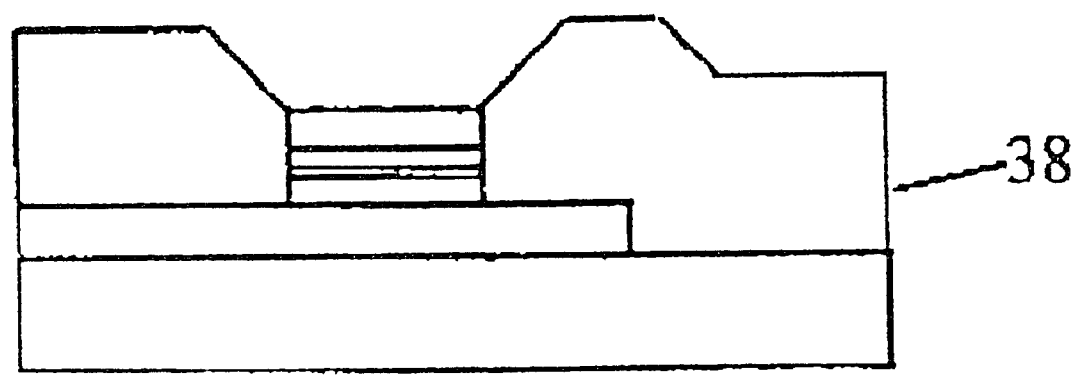

With reference to FIG. 19D, the resist pattern 37 remains on the remaining multi-layer structure whilst an alumina insulating film 38 is entirely deposited by an electron beam evaporation over the first Al interconnection layer 32, the resist pattern 37 and the silicon substrate 31. A lift-off process of the resist pattern 37 is carried out to remove not only the resist pattern 37 but also the alumina insulating film 38 but only over the resist pattern 37.

Figure 19E:
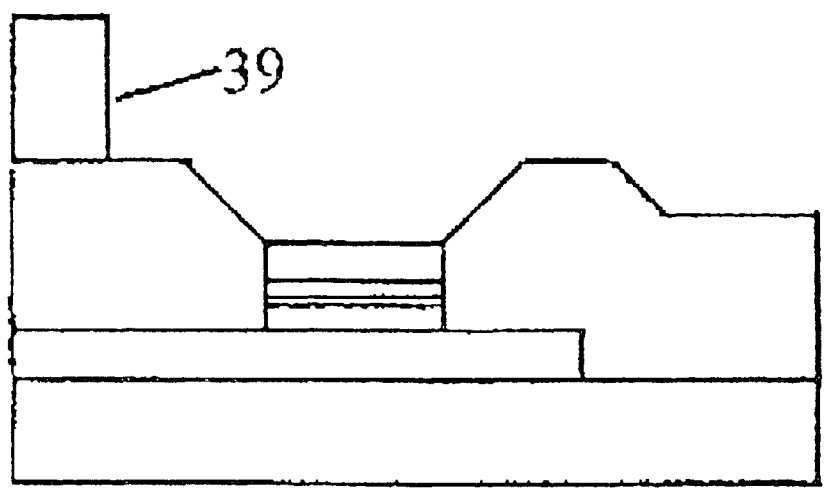

With reference to FIG. 19E, a resist pattern 39 is selectively formed on the remaining alumina insulating film 38.

Figure 19F:
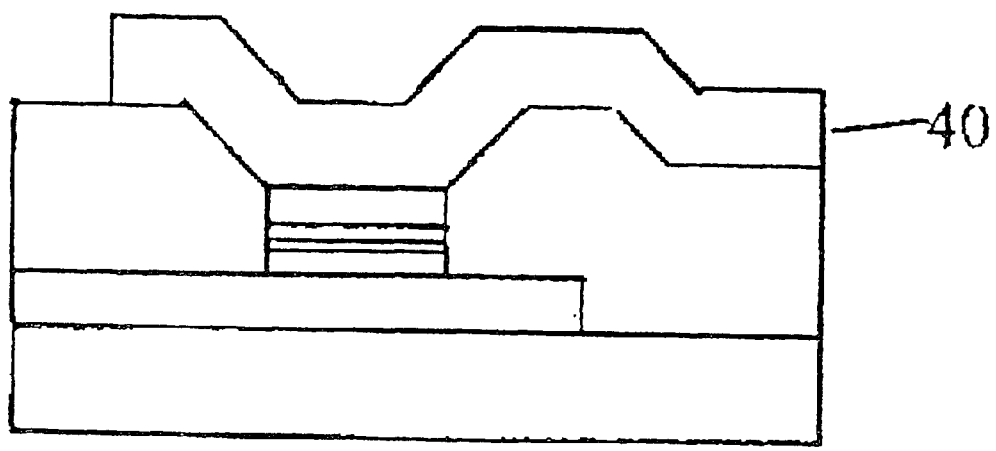

With reference to FIG. 19F, a surface of the second CoFe ferromagnetic layer 36 is subjected to a reverse sputter cleaning wherein the surface of the second CoFe ferromagnetic layer 36 is sputtered. Subsequently, a second Al interconnection layer 40 having a thickness of 200 nanometers is entirely deposited so that the second Al interconnection layer 40 extends over the resist pattern 39, the alumina insulating film 38 and the surface of the second CoFe ferromagnetic layer 36. A lift-off process of the resist pattern 39 is carried out to remove not only the resist pattern 39 but also the second Al interconnection layer 40 but only over the resist pattern 39, thereby to form a top Al interconnection 40 is formed. As a result, the ferromagnetic tunnel junction device is formed over the silicon substrate 31.

Figure 20:
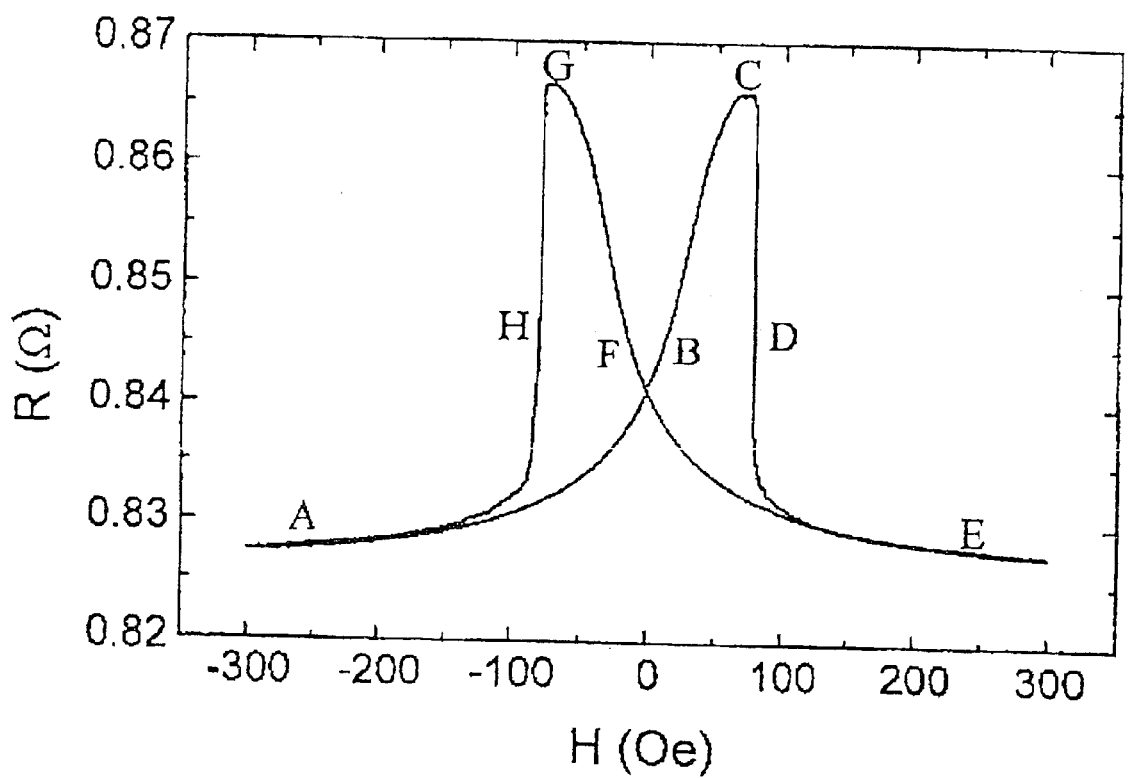
FIG. 20 is a diagram illustrative of variations in magnetoresistance over an applied magnetic field of the ferromagnetic tunnel junction device prepared in the above novel method in the first embodiment in accordance with the present invention.

FIG. 20 is a diagram illustrative of variations in magnetoresistance over an applied magnetic field of the ferromagnetic tunnel junction device prepared in the above novel method in the first embodiment in accordance with the present invention. The novel ferromagnetic tunnel junction device has a junction area of 40×40 $\mu m^2$. The oxygen pressure in oxidation of the Al layer for forming the tunnel barrier layer was set at 20 Torr. An applied magnetic field to the novel ferromagnetic tunnel junction device was varied to increase from −300 Oe to +300 Oe and then decrease from +300 Oe to −300 Oe. The measured resistance of the novel ferromagnetic tunnel junction device is varied to draw curves along A-B-C-D-E-F-G-H-A. Namely, as the applied magnetic field was increased from −300 Oe to +20 Oe, then the resistance of the novel ferromagnetic tunnel junction device is also increased to draw a curve from A to B. As the applied magnetic field was further increased from +20 Oe to +70 Oe, then the resistance of the novel ferromagnetic tunnel junction device is rapidly increased to draw a curve from B to C. As the applied magnetic field was further increased from +70 Oe to +80 Oe, then the resistance of the novel ferromagnetic tunnel junction device is rapidly decreased to draw a curve from C to D. As the applied magnetic field was further increased from +80 Oe to +300 Oe, then the resistance of the novel ferromagnetic tunnel junction device is further decreased to draw a curve from D to E. As the applied magnetic field was decreased from +300 Oe to 20 Oe, then the resistance of the novel ferromagnetic tunnel junction device is gradually increased to draw a curve from E to F. As the applied magnetic field was further decreased from −20 Oe to −70 Oe, then the resistance of the novel ferromagnetic tunnel junction device is rapidly increased to draw a curve from F to G. As the applied magnetic field was further decreased from −70 Oe to −80 Oe, then the resistance of the novel ferromagnetic tunnel junction device is rapidly decreased to draw a curve from G to H. As the applied magnetic field was further decreased from −80 Oe to −300 Oe, then the resistance of the novel ferromagnetic tunnel junction device is further decreased to draw a curve from H to A. The rapid increases on the points B and F correspond to the coercive force of Fe of the first Fe ferromagnetic layer. The rapid decreases on the points D and H correspond to the coercive force of CoFe of the second CoFe ferromagnetic layer. On the points A and E, Fe of the first Fe ferromagnetic layer and CoFe of the second CoFe ferromagnetic layer have parallel magnetization directions to each other. On the points C and G, Fe of the first Fe ferromagnetic layer and CoFe of the second CoFe ferromagnetic layer have anti-parallel magnetization directions to each other. From the above magnetoresistance curves A-B-CD-E-F-G-H-A, a rate of variation in magnetoresistance of the novel ferromagnetic tunnel junction device is estimated to be about 5%. If the junction area of the novel ferromagnetic tunnel junction device is varied in the range of from 2×2 $\mu m^2$ to 40×40 $\mu m^2$, then the rate of variation in magnetoresistance of the novel ferromagnetic tunnel junction device almost remains unchanged at about 5%.

Figure 21:
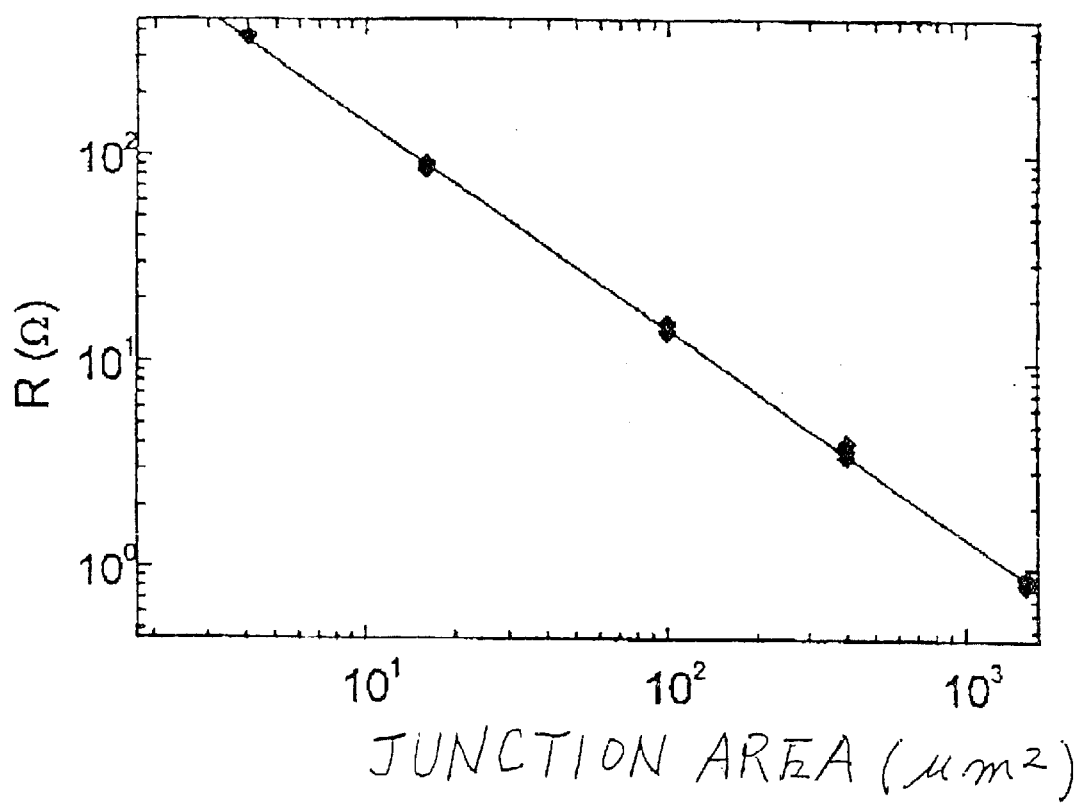
FIG. 21 is a diagram illustrative of variations in resistance over junction area of the ferromagnetic tunnel junction device prepared in the above novel method in the first embodiment in accordance with the present invention.

FIG. 21 is a diagram illustrative of variations in resistance over junction area of the ferromagnetic tunnel junction device prepared in the above novel method in the first embodiment in accordance with the present invention. As the junction area of the ferromagnetic tunnel junction device is increased, then the resistance of the ferromagnetic tunnel junction device is decreased so that the resistance is inversely proportional to the junction area. A gradient of the resistance variation line is found by the least square method to be −1.004. This shows that the ferromagnetic tunnel junction device was well accurately prepared. The resistance normalized with the junction area was $1.5 \times 10^{-5}$ $\Omega cm^2$. If the oxygen pressure in oxidation of the Al layer for forming the tunnel barrier layer is reduced to 20 mTorr, then the resistance of the ferromagnetic tunnel junction device is also dropped by at least one digit. The obtained minimum resistance of the ferromagnetic tunnel junction device is much smaller than the conventional ferromagnetic tunnel junction device by two or three digits.

Figure 22:
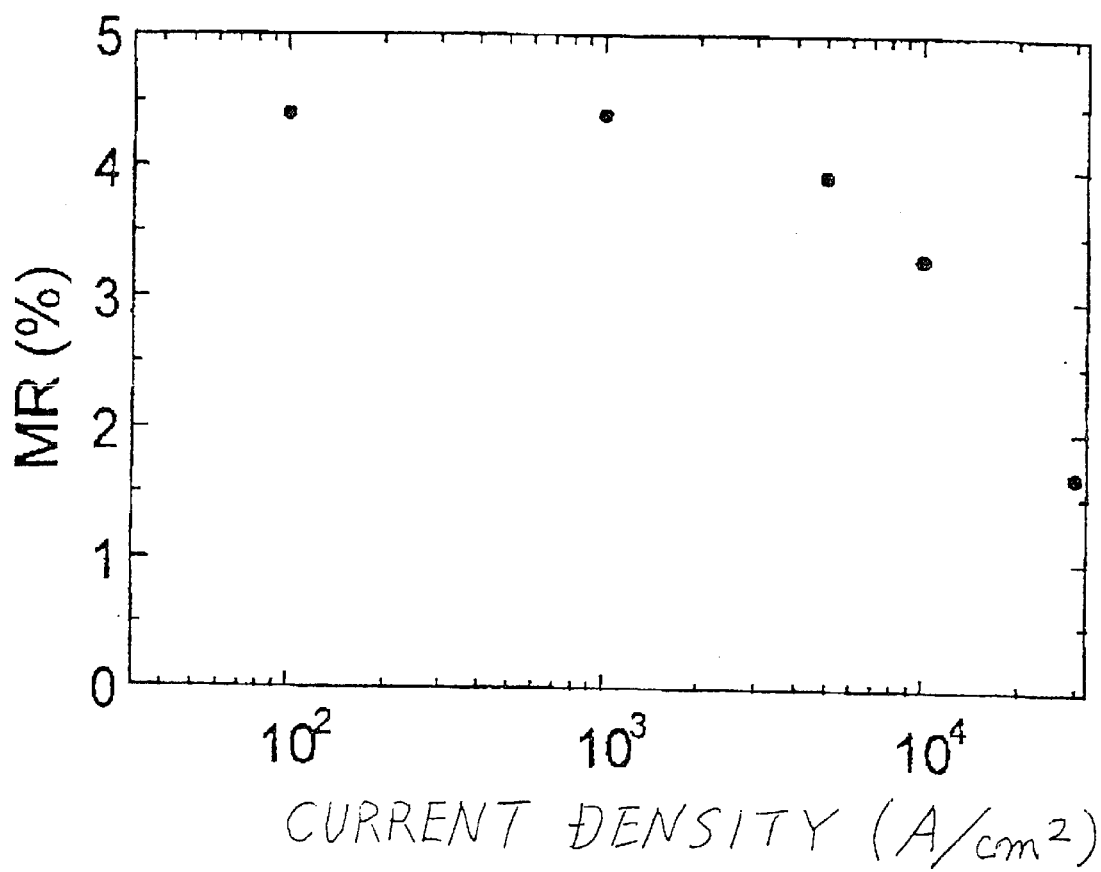
FIG. 22 is a diagram illustrative of variations in magnetoresistance variation rate over current density of the novel ferromagnetic tunnel junction device in a junction area of $10\times10$ $\mu m^2$ in the first embodiment in accordance with the present invention.

FIG. 22 is a diagram illustrative of variations in magnetoresistance variation rate over current density of the novel ferromagnetic tunnel junction device in a junction area of 10×10 $\mu m^2$ in the first embodiment in accordance with the present invention. In the extent of the current density of not higher than $1 \times 10^3$ A/m$^2$, the rate of variation of the magnetoresistance remains unchanged at about 4.4%. If the current density is increased to $5 \times 10^3$ A/m$^2$, then the rate of variation of the magnetoresistance is slightly decreased to about 4.0% or shows about 10%-reduction. If the current density is further increased to $1 \times 10^4$ A/m$^2$, then the rate of variation of the magnetoresistance is further slightly decreased to about 3.3%. If the current density is decreased to $5 \times 10^3$ A/m$^2$, then the rate of variation of the magnetoresistance is increased and returned to about 4.0%. If further the current density is increased to $1 \times 10^3$ A/m$^2$, then the rate of variation of the magnetoresistance is also increased and returned to about 4.4%.

Figure 23:
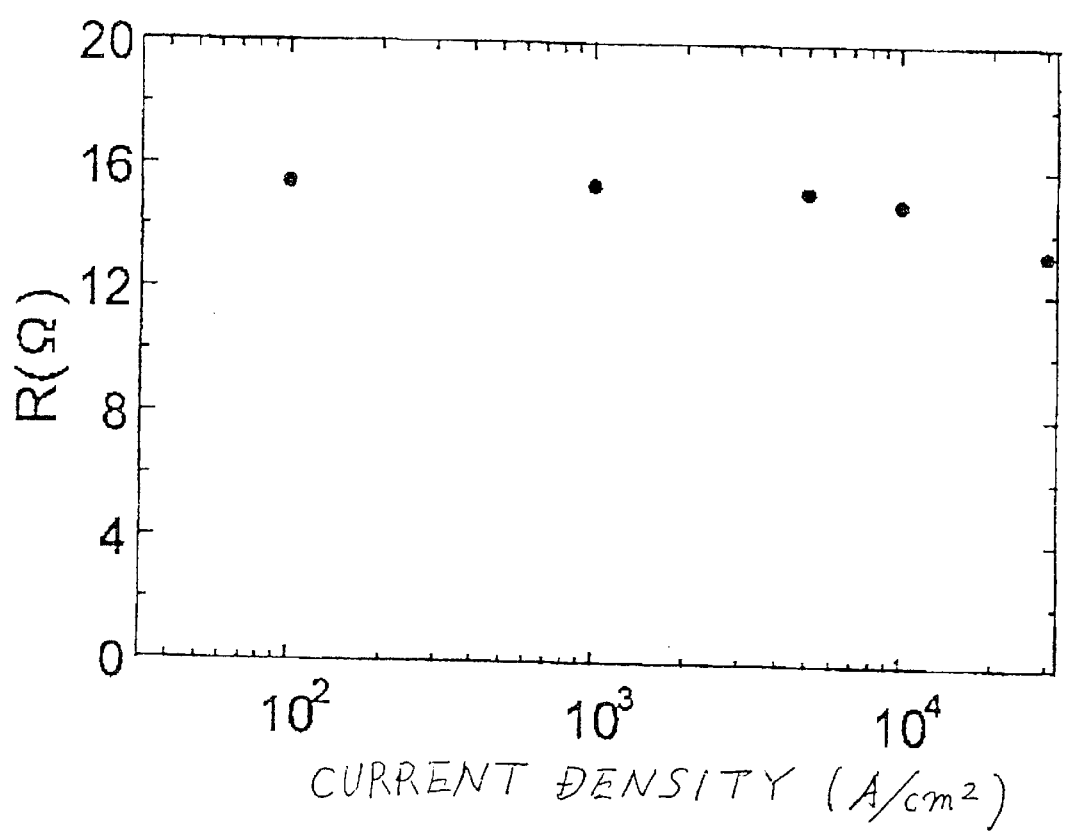
FIG. 23 is a diagram illustrative of variations in resistance over current density of the novel ferromagnetic tunnel junction device in a junction area of $10\times10$ $\mu m^2$ in the first embodiment in accordance with the present invention.

FIG. 23 is a diagram illustrative of variations in resistance over current density of the novel ferromagnetic tunnel junction device in a junction area of lox 10×10 $\mu m^2$ in the first embodiment in accordance with the present invention. In the extent of the current density of not higher than $1 \times 10^4$ A/m$^2$, the rate of variation of the magnetoresistance remains unchanged over at about 15Ω.

From the results of FIGS. 22 and 23, a signal output voltage level of the novel ferromagnetic tunnel junction device is found. The signal output voltage level is estimated to be about 1 mV at the current density of $1 \times 10^3$ A/m$^2$ and about 3 mV at the current density of $5 \times 10^3$ A/m$^2$. If the above novel ferromagnetic tunnel junction device is applied to a magnetic head for reproducing, the signal output voltage level of about 3 mV at the current density of $5 \times 10^3$ A/m$^2$ may be considered to be responsible to a recording density of not lower than 10 Gb/in$^2$.

Second Embodiment

A second embodiment according to the present invention will be described in detail with reference to FIGS. 24A through 24F which are fragmentary cross sectional elevation views illustrative of novel ferromagnetic tunnel junction devices in sequential steps involved in a novel fabrication method in a second embodiment in accordance with the present invention.

Figure 24A:
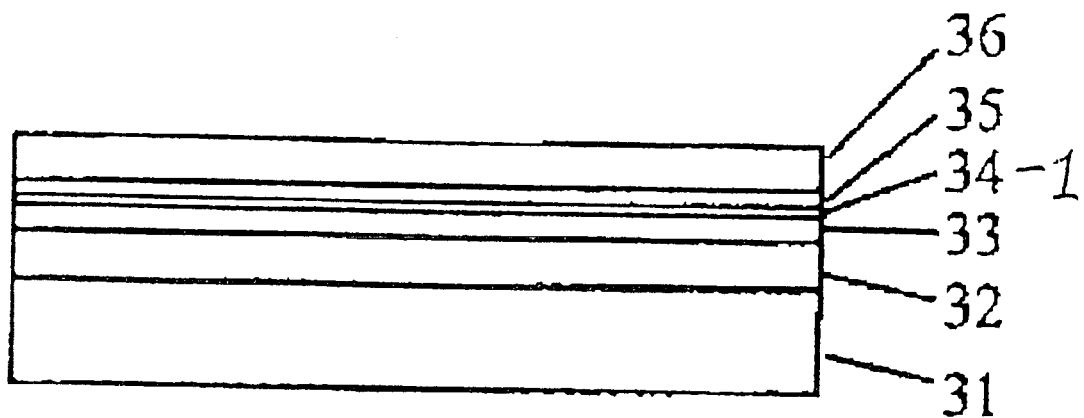
FIGS. 24A through 24F are fragmentary cross sectional elevation views illustrative of novel ferromagnetic tunnel junction devices in sequential steps involved in a novel fabrication method in a second embodiment in accordance with the present invention.

With reference to FIG. 24A, a silicon substrate 31 is prepared for forming a ferromagnetic tunnel junction device thereon. A surface of the silicon substrate 31 is subjected to a thermal oxidation to form an oxide surface which is not illustrated. A first Al interconnection layer 32 having a thickness of 50 nanometers is deposited by a sputtering method on the oxide surface of the silicon substrate 31. Subsequently, a first Fe ferromagnetic layer 33 having a thickness of 10 nanometers is further deposited by a sputtering method on the first Al interconnection layer 32. Further subsequently, a Mg conductive layer 34-1 having a thickness of 2 nanometers is deposited by a sputtering method on the first Fe ferromagnetic layer 33. Those sequential sputtering processes are conducted using a radio frequency magnetron sputtering system provided with four targets of 4 inches in diameter. Further, those sequential sputtering processes are conducted under the conditions of a background pressure of not higher than $1\times10^{-7}$ Torr, an Ar pressure of 10 mTorr, and a high frequency power of 200 W.

Thereafter, a pure oxygen is introduced into a sputter chamber of the radio frequency magnetron sputtering system so as to keep an oxygen pressure in the range of 20 mTorr to 200 Torr for 10 minutes whereby the surface of the Mg conductive layer 34-1 is subjected to the pure oxygen gas for causing a natural oxidation of the Mg conductive layer 34-1 except for a lower region thereof As a result, an oxide tunnel barrier layer 35 is formed over the remaining Mg conductive layer 34-1. The oxygen is discharged to reduce the pressure into the above background pressure before a second CoFe ferromagnetic layer 36 having a thickness of 20 nanometers is deposited by a sputtering method onto a surface of the oxide tunnel barrier layer 35 thereby to form a multi-layer structure over the silicon substrate 31, wherein the multi-layer structure comprises laminations of the first Al interconnection layer 32, the first Fe ferromagnetic layer 33, the Mg conductive layer 34-1, the oxide tunnel barrier layer 35 and the second CoFe ferromagnetic layer 36.

Figure 24B:
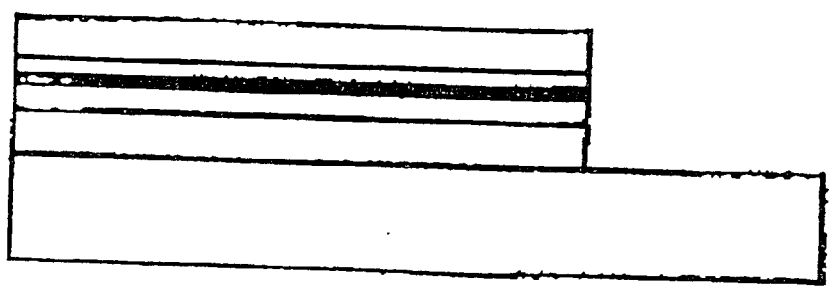

With reference to FIG. 24B, the multi-layer structure is patterned in the form of a bottom interconnection by the normal techniques of a photo-lithography and a subsequent ion-milling.

Figure 24C:
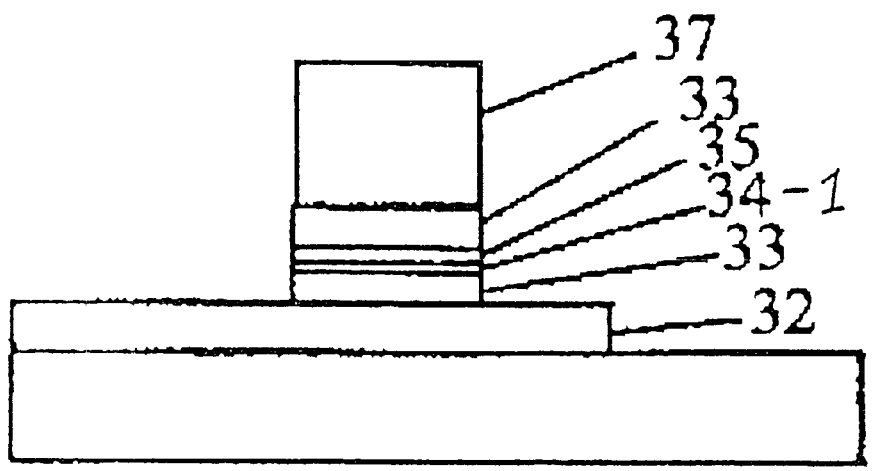

With reference to FIG. 24C, a resist pattern 37 for defining a junction dimension or size is formed on the patterned multi-layer structure so that an ion-milling is carried out using the resist pattern 37 as a mask to selectively remove the multi-layer structure except for the first Al interconnection layer 32.

Figure 24D:
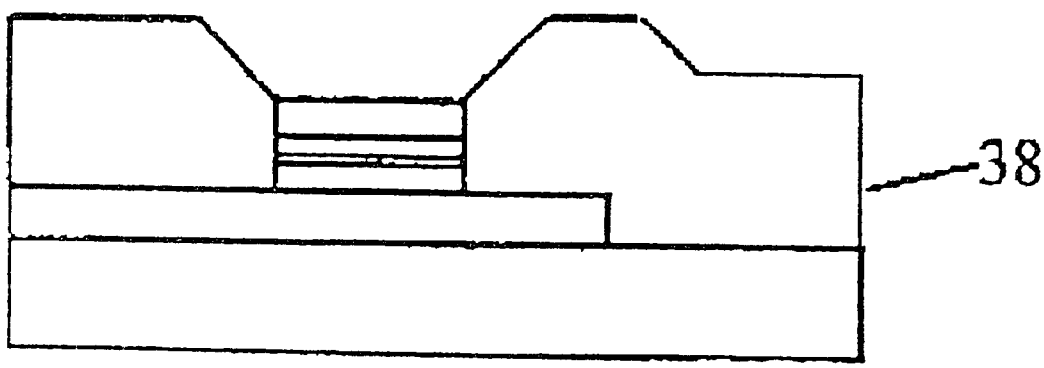

With reference to FIG. 24D, the resist pattern 37 remains on the remaining multi-layer structure whilst an alumina insulating film 38 is entirely deposited by an electron beam evaporation over the first Al interconnection layer 32, the resist pattern 37 and the silicon substrate 31. A lift-off process of the resist pattern 37 is carried out to remove not only the resist pattern 37 but also the alumina insulating film 38 but only over the resist pattern 37.

Figure 24E:
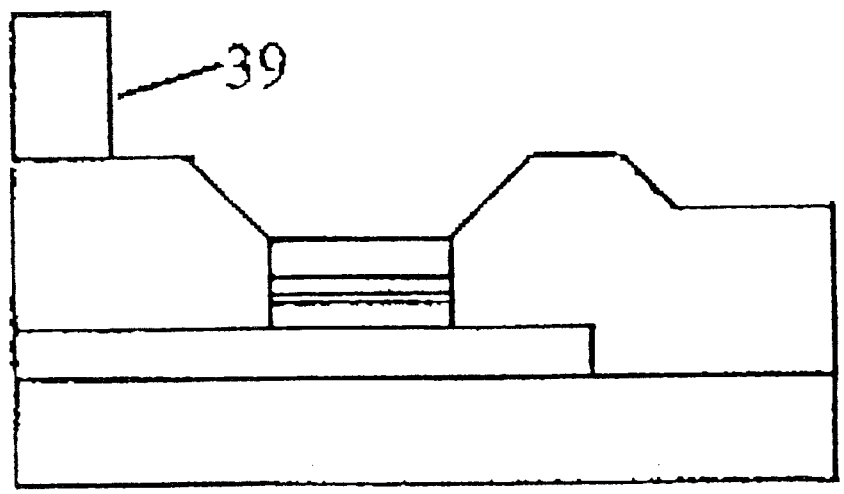

With reference to FIG. 24E, a resist pattern 39 is selectively formed on the remaining alumina insulating film 38.

Figure 24F:
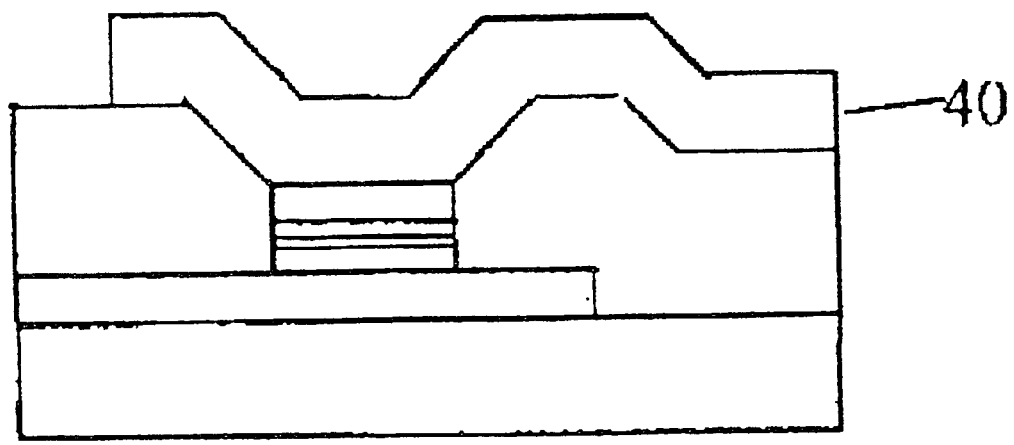

With reference to FIG. 24F, a surface of the second CoFe ferromagnetic layer 36 is subjected to a reverse sputter cleaning wherein the surface of the second CoFe ferromagnetic layer 36 is sputtered. Subsequently, a second Al interconnection layer 40 having a thickness of 200 nanometers is entirely deposited so that the second Al interconnection layer 40 extends over the resist pattern 39, the alumina insulating film 38 and the surface of the second CoFe ferromagnetic layer 36. A lift-off process of the resist pattern 39 is carried out to remove not only the resist pattern 39 but also the second Al interconnection layer 40 but only over the resist pattern 39, thereby to form a top Al interconnection 40 is formed. As a result, the ferromagnetic tunnel junction device is formed over the silicon substrate 31.

An obtained rate of variation in magnetoresistance of the novel ferromagnetic tunnel junction device is about 8%. If the junction area of the novel ferromagnetic tunnel junction device is varied in the range of from $2\times2$ $\mu m^2$ to $40\times40$ $\mu m^2$, then the rate of variation in magnetoresistance of the novel ferromagnetic tunnel junction device almost remains unchanged at about 8%.

The resistance normalized with the junction area was $1.6\times10^{-5}$ $\Omega cm^2$ if the oxygen pressure in oxidation of the Mg layer for forming the tunnel barrier layer is reduced to 20 Torr. If the oxygen pressure in oxidation of the Mg layer for forming the tunnel barrier layer is reduced to 20 mTorr, then the resistance of the ferromagnetic tunnel junction device is also dropped by at least one digit. The obtained minimum resistance of the ferromagnetic tunnel junction device is much smaller than the conventional ferromagnetic tunnel junction device by two or three digits.

In the extent of the current density of not higher than $1\times10^3$ $A/m^2$, both the rate of variation of the magnetoresistance and the resistance thereof remain unchanged. The signal output voltage level is estimated to be about 1.3 mV under the above conditions.

Third Embodiment

A third embodiment according to the present invention will be described in detail with reference to FIGS. 25A through 25F which are fragmentary cross sectional elevation views illustrative of novel ferromagnetic tunnel junction devices in sequential steps involved in a novel fabrication method in a third embodiment in accordance with the present invention.

Figure 25A:
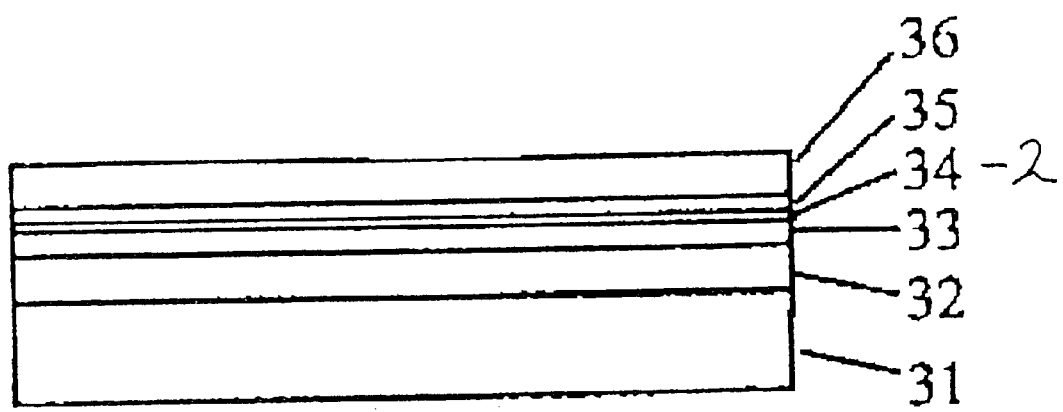
FIGS. 25A through 25F are fragmentary cross sectional elevation views illustrative of novel ferromagnetic tunnel junction devices in sequential steps involved in a novel fabrication method in a third embodiment in accordance with the present invention.

With reference to FIG. 25A, a silicon substrate 31 is prepared for forming a ferromagnetic tunnel junction device thereon. A surface of the silicon substrate 31 is subjected to a thermal oxidation to form an oxide surface which is not illustrated. A first Al interconnection layer 32 having a thickness of 50 nanometers is deposited by a sputtering method on the oxide surface of the silicon substrate 31. Subsequently, a first Fe ferromagnetic layer 33 having a thickness of 10 nanometers is further deposited by a sputtering method on the first Al interconnection layer 32. Further subsequently, a La conductive layer 34-2 having a thickness of 2 nanometers is deposited by a sputtering method on the first Fe ferromagnetic layer 33. Those sequential sputtering processes are conducted using a radio frequency magnetron sputtering system provided with four targets of 4 inches in diameter. Further, those sequential sputtering processes are conducted under the conditions of a background pressure of not higher than $1\times10^{-7}$ Torr, an Ar pressure of 10 mTorr, and a high frequency power of 200 W.

Thereafter, a pure oxygen is introduced into a sputter chamber of the radio frequency magnetron sputtering system so as to keep an oxygen pressure in the range of 20 mTorr to 200 Torr for 10 minutes whereby the surface of the La conductive layer 34-2 is subjected to the pure oxygen gas for causing a natural oxidation of the La conductive layer 34-2 except for a lower region thereof. As a result, an oxide tunnel barrier layer 35 is formed over the remaining La conductive layer 34-2. The oxygen is discharged to reduce the pressure into the above background pressure before a second CoFe ferromagnetic layer 36 having a thickness of 20 nanometers is deposited by a sputtering method onto a surface of the oxide tunnel barrier layer 35 thereby to form a multi-layer structure over the silicon substrate 31, wherein the multi-layer structure comprises laminations of the first Al interconnection layer 32, the first Fe ferromagnetic layer 33, the La conductive layer 34-2, the oxide tunnel barrier layer 35 and the second CoFe ferromagnetic layer 36.

Figure 25B:
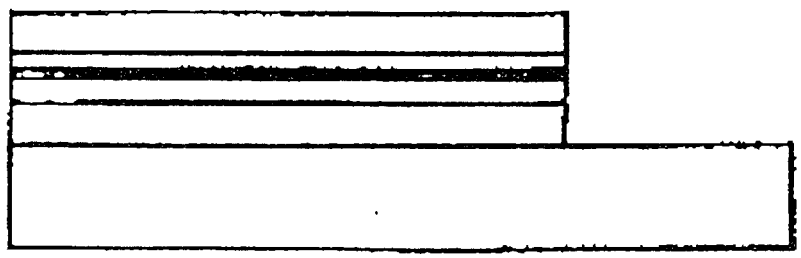

With reference to FIG. 25B, the multi-layer structure is patterned in the form of a bottom interconnection by the normal techniques of a photo-lithography and a subsequent ion-milling.

Figure 25C:
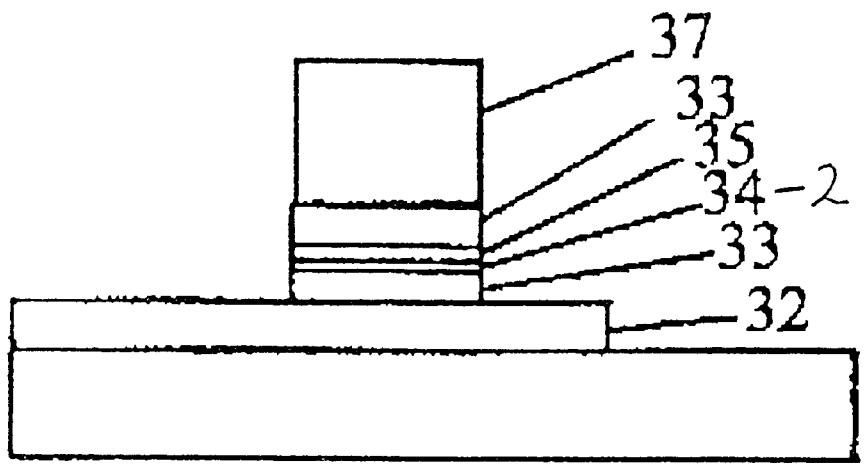

With reference to FIG. 25C, a resist pattern 37 for defining a junction dimension or size is formed on the patterned multi-layer structure so that an ion-milling is carried out using the resist pattern 37 as a mask to selectively remove the multi-layer structure except for the first Al interconnection layer 32.

Figure 25D:
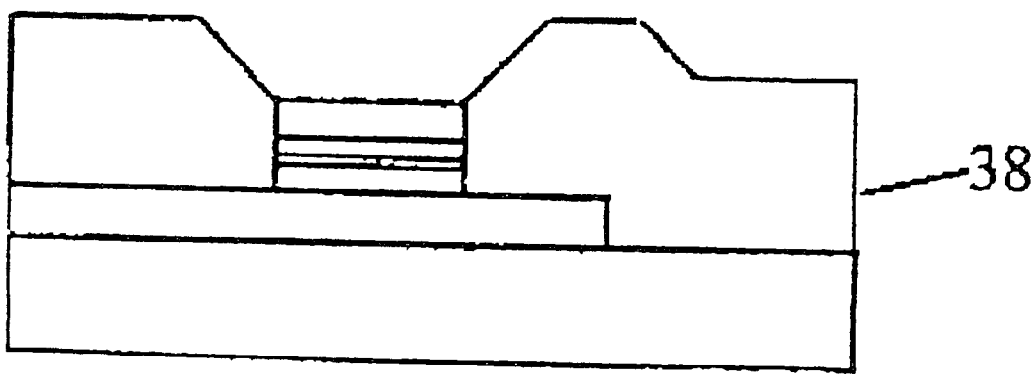

With reference to FIG. 25D, the resist pattern 37 remains on the remaining multi-layer structure whilst an alumina insulating film 38 is entirely deposited by an electron beam evaporation over the first Al interconnection layer 32, the resist pattern 37 and the silicon substrate 31. A lift-off process of the resist pattern 37 is carried out to remove not only the resist pattern 37 but also the alumina insulating film 38 but only over the resist pattern 37.

Figure 25E:
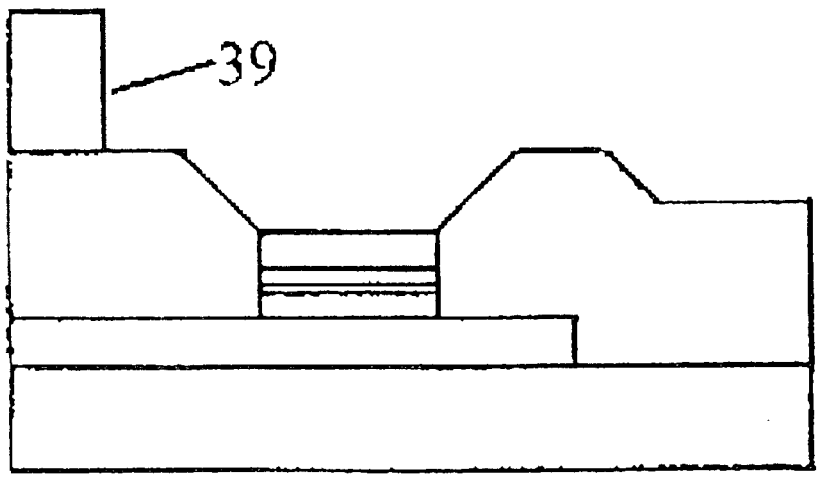

With reference to FIG. 25E, a resist pattern 39 is selectively formed on the remaining alumina insulating film 38.

Figure 25F:
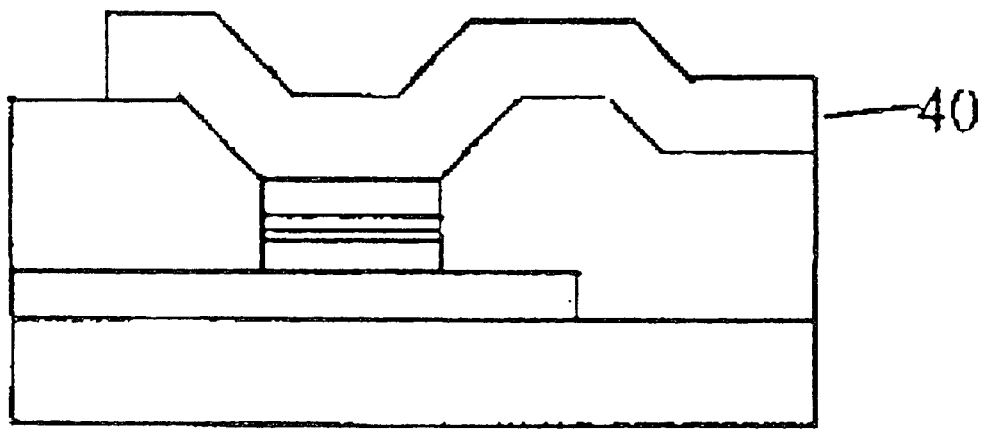

With reference to FIG. 25F, a surface of the second CoFe ferromagnetic layer 36 is subjected to a reverse sputter cleaning wherein the surface of the second CoFe ferromagnetic layer 36 is sputtered. Subsequently, a second Al interconnection layer 40 having a thickness of 200 nanometers is entirely deposited so that the second Al interconnection layer 40 extends over the resist pattern 39, the alumina insulating film 38 and the surface of the second CoFe ferromagnetic layer 36. A lift-off process of the resist pattern 39 is carried out to remove not only the resist pattern 39 but also the second Al interconnection layer 40 but only over the resist pattern 39, thereby to form a top Al interconnection 40 is formed. As a result, the ferromagnetic tunnel junction device is formed over the silicon substrate 31.

An obtained rate of variation in magnetoresistance of the novel ferromagnetic tunnel junction device is about 6%. If the junction area of the novel ferromagnetic tunnel junction device is varied in the range of from $2\times2$ $\mu m^2$ to $40\times40$ $\mu m^2$, then the rate of variation in magnetoresistance of the novel ferromagnetic tunnel junction device almost remains unchanged at about 6%.

The resistance normalized with the junction area was $2.7\times10^{-5}$ $\Omega cm^2$ if the oxygen pressure in oxidation of the La layer for forming the tunnel barrier layer is reduced to 20 Torr. If the oxygen pressure in oxidation of the La layer for forming the tunnel barrier layer is reduced to 20 mTorr, then the resistance of the ferromagnetic tunnel junction device is also dropped by at least one digit. The obtained minimum resistance of the ferromagnetic tunnel junction device is much smaller than the conventional ferromagnetic tunnel junction device by two or three digits.

In the extent of the current density of not higher than $1\times10^3$ $A/m^2$, both the rate of variation of the magnetoresistance and the resistance thereof remain unchanged. The signal output voltage level is estimated to be about 1.6 mV under the above conditions.

As a modification to the above third embodiment, other lanthanoids such as Nd, Sm and Lu are also available for the electrically conductive layer sandwiched between the first and second ferromagnetic layers.

Fourth Embodiment

A fourth embodiment according to the present invention will be described in detail with reference to FIGS. 26A through 26H which are fragmentary cross sectional elevation views illustrative of novel ferromagnetic tunnel junction devices in sequential steps involved in a novel fabrication method in a fourth embodiment in accordance with the present invention.

Figure 26A:
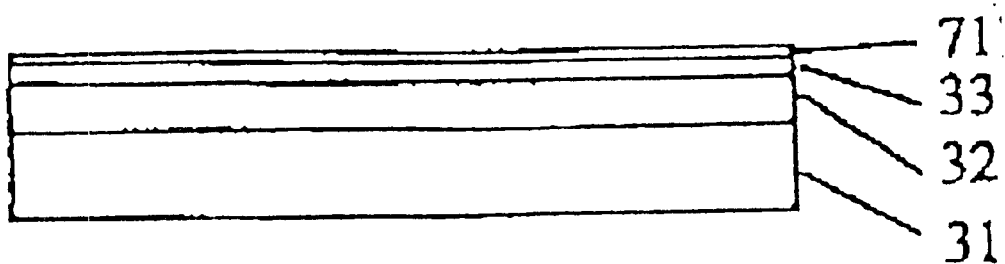
FIGS. 26A through 26H are fragmentary cross sectional elevation views illustrative of novel ferromagnetic tunnel junction devices in sequential steps involved in a novel fabrication method in a fourth embodiment in accordance with the present invention.

With reference to FIG. 26A, a silicon substrate 31 is prepared for forming a ferromagnetic tunnel junction device thereon. A surface of the silicon substrate 31 is subjected to a thermal oxidation to form an oxide surface which is not illustrated. A first Al interconnection layer 32 having a thickness of 50 nanometers is deposited by a sputtering method on the oxide surface of the silicon substrate 31. Subsequently, a first Fe ferromagnetic layer 33 having a thickness of 10 nanometers is further deposited by a sputtering method on the first Al interconnection layer 32. Those sequential sputtering processes are conducted using a radio frequency magnetron sputtering system provided with four targets of 4 inches in diameter. Further, those sequential sputtering processes are conducted under the conditions of a background pressure of not higher than $1\times10^{-7}$ Torr, an Ar pressure of 10 mTorr, and a high frequency power of 200 W.

Thereafter, a pure oxygen is introduced into a sputter chamber of the radio frequency magnetron sputtering system so as to keep an oxygen pressure in the range of 200 Torr for 10 minutes whereby the surface of the first Fe ferromagnetic layer 33 is subjected to the pure oxygen gas for causing a natural oxidation of the first Fe ferromagnetic layer 33 except for a lower region thereof. As a result, an FeOx layer 71 is formed over the remaining first Fe ferromagnetic layer 33.

Figure 26B:
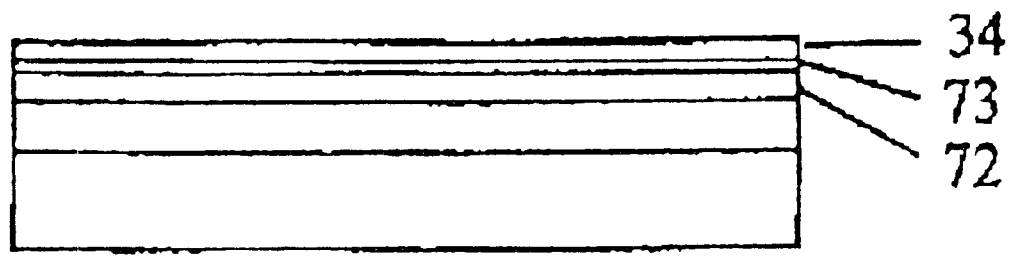
Figure 26C:
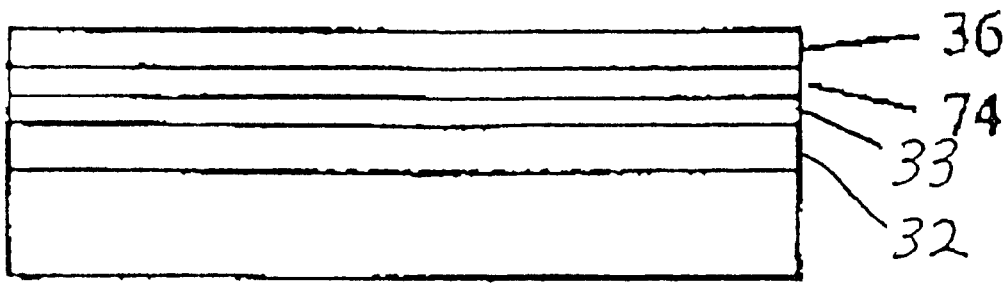

With reference to FIG. 26B, the oxygen is discharged to reduce the pressure into the above background pressure before an Al conductive layer 34 having a thickness of 2 nanometers is deposited on the FeOx layer 71 by a sputtering method, whereby oxygen atoms are naturally diffused from the FeOx layer 71 to a lower region of the Al conductive layer 34. As a result, the FeOx layer 71 is exactly reduced into a reduction upper region 72 of the first Fe ferromagnetic layer 33, whilst a lower region of the Al conductive layer 34 is oxidized by the natural diffusion of oxygen atoms and made into an alumina layer 73 under the Al conductive layer 34.

With reference to FIG. 26C, a pure oxygen is again introduced into the sputter chamber of the radio frequency magnetron sputtering system so as to keep an oxygen pressure in the range of 200 Torr for 10 minutes for 10 minutes whereby the surface of the Al conductive layer 34 is subjected to the pure oxygen gas for causing a natural oxidation of an entire region of the remaining Al conductive layer 34. As a result, an alumina tunnel barrier layer 74 is formed over the reduction upper region 72 of the first Fe ferromagnetic layer 33. The oxygen gas is again discharged before a second CoFe ferromagnetic layer 36 having a thickness of 20 nanometers is deposited by a sputtering method onto a surface of the alumina tunnel barrier layer 74 thereby to form a multi-layer structure over the silicon substrate 31, wherein the multi-layer structure comprises laminations of the first Al interconnection layer 32, the first Fe ferromagnetic layer 33, the alumina tunnel barrier layer 74 and the second CoFe ferromagnetic layer 36.

Figure 26D:
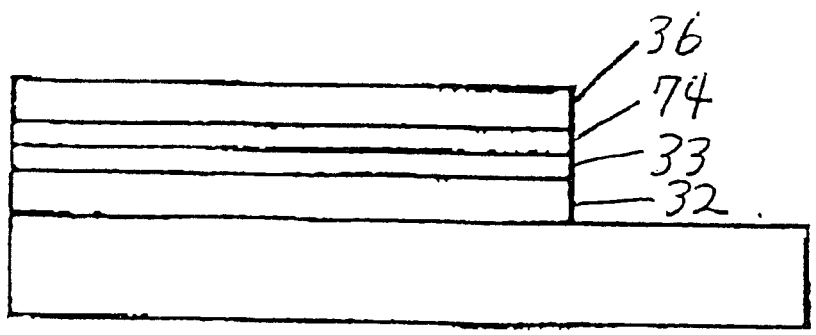

With reference to FIG. 26D, the multi-layer structure is patterned in the form of a bottom interconnection by the normal techniques of a photo-lithography and a subsequent ion-milling.

Figure 26E:
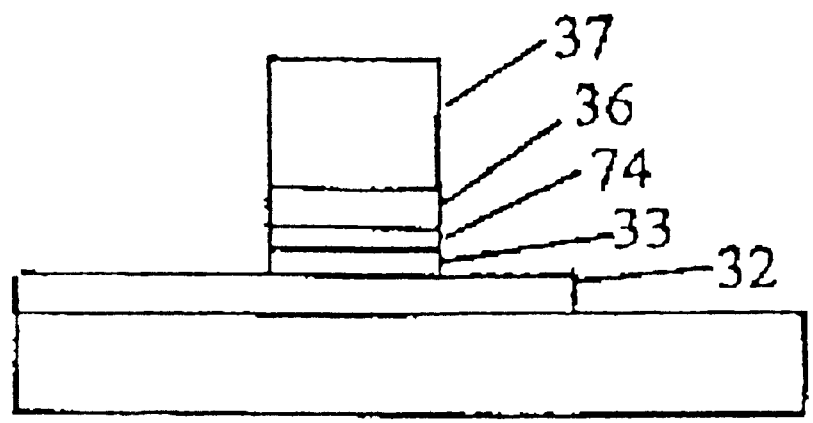

With reference to FIG. 26E, a resist pattern 37 for defining a junction dimension or size is formed on the patterned multi-layer structure so that an ion-milling is carried out using the resist pattern 37 as a mask to selectively remove the multi-layer structure except for the first Al interconnection layer 32.

Figure 26F:
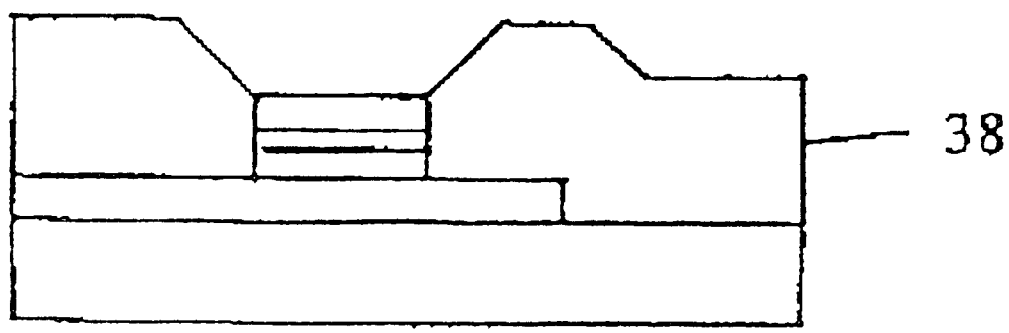

With reference to FIG. 26F, the resist pattern 37 remains on the remaining multi-layer structure whilst an alumina insulating film 38 is entirely deposited by an electron beam evaporation over the first Al interconnection layer 32, the resist pattern 37 and the silicon substrate 31. A lift-off process of the resist pattern 37 is carried out to remove not only the resist pattern 37 but also the alumina insulating film 38 but only over the resist pattern 37.

Figure 26G:
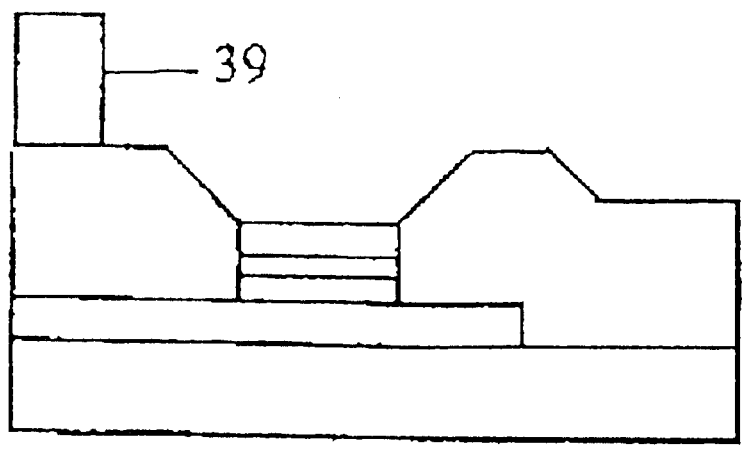

With reference to FIG. 26G, a resist pattern 39 is selectively formed on the remaining alumina insulating film 38.

Figure 26H:
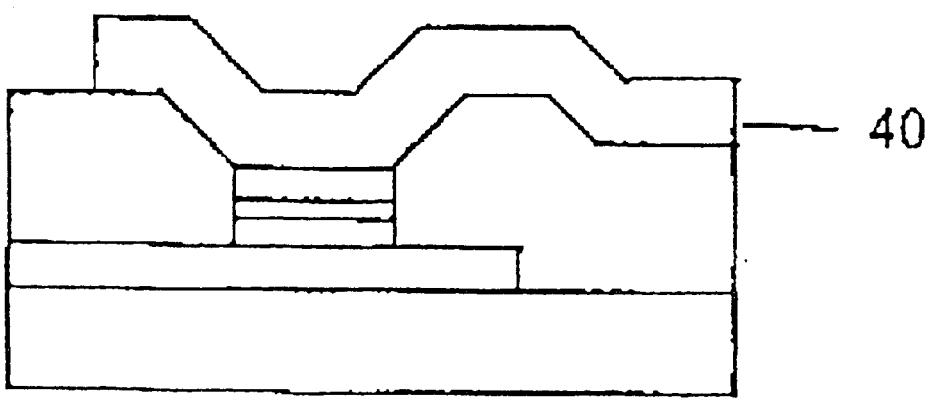

With reference to FIG. 26H, a surface of the second CoFe ferromagnetic layer 36 is subjected to a reverse sputter cleaning wherein the surface of the second CoFe ferromagnetic layer 36 is sputtered. Subsequently, a second Al interconnection layer 40 having a thickness of 200 nanometers is entirely deposited so that the second Al interconnection layer 40 extends over the resist pattern 39, the alumina insulating film 38 and the surface of the second CoFe ferromagnetic layer 36. A lift-off process of the resist pattern 39 is carried out to remove not only the resist pattern 39 but also the second Al interconnection layer 40 but only over the resist pattern 39, thereby to form a top Al interconnection 40 is formed. As a result, the ferromagnetic tunnel junction device is formed over the silicon substrate 31.

An obtained rate of variation in magnetoresistance of the novel ferromagnetic tunnel junction device is about 10%. If the junction area of the novel ferromagnetic tunnel junction device is varied in the range of from $2 \times 2$ $\mu m^2$ to $40 \times 40$ $\mu m^2$, then the rate of variation in magnetoresistance of the novel ferromagnetic tunnel junction device almost remains unchanged at about 10%.

The resistance normalized with the junction area was $5 \times 10^{-5}$ $\Omega cm^2$ if the oxygen pressure in oxidation of the La layer forming the tunnel barrier layer is reduced to 20 Torr. If the oxygen pressure in oxidation of the Al layer for forming the tunnel barrier layer is reduced to 20 mTorr, then the resistance of the ferromagnetic tunnel junction device is also dropped by at least one digit. The obtained minimum resistance of the ferromagnetic tunnel junction device is much smaller than the conventional ferromagnetic tunnel junction device by two or three digits.

In the extent of the current density of not higher than $1.5 \times 10^3$ $A/m^2$, both the rate of variation of the magnetoresistance and the resistance thereof remain unchanged. The signal output voltage level is estimated to be about 7.5 mV under the above conditions. If the above novel ferromagnetic tunnel junction device is applied to a magnetic head for reproducing, the signal output voltage level of about 7.5 mV at the current density of $1.5 \times 10^3$ $A/m^2$ may be considered to be responsible to a recording density of not lower than 20 $Gb/in^2$.

Fifth Embodiment

A fifth embodiment according to the present invention will be described in detail with reference to FIGS. 27A through 27H which are fragmentary cross sectional elevation views illustrative of novel ferromagnetic tunnel junction devices in sequential steps involved in a novel fabrication method in a fifth embodiment in accordance with the present invention.

Figure 27A:
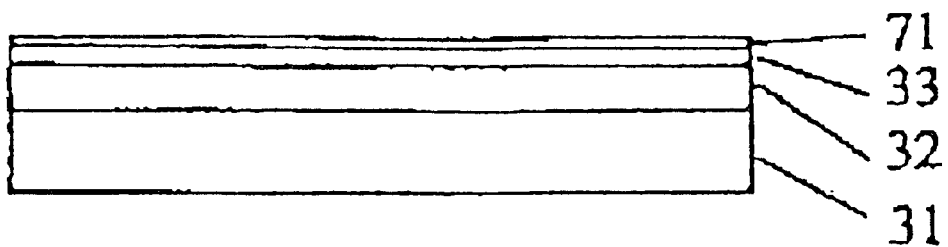
FIGS. 27A through 27H are fragmentary cross sectional elevation views illustrative of novel ferromagnetic tunnel junction devices in sequential steps involved in a novel fabrication method in a fifth embodiment in accordance with the present invention.

With reference to FIG. 27A, a silicon substrate 31 is prepared for forming a ferromagnetic tunnel junction device thereon. A surface of the silicon substrate 31 is subjected to a thermal oxidation to form an oxide surface which is not illustrated. A first Al interconnection layer 32 having a thickness of 50 nanometers is deposited by a sputtering method on the oxide surface of the silicon substrate 31. Subsequently, a first Fe ferromagnetic layer 33 having a thickness of 10 nanometers is further deposited by a sputtering method on the first Al interconnection layer 32. Those sequential sputtering processes are conducted using a radio frequency magnetron sputtering system provided with four targets of 4 inches in diameter. Further, those sequential sputtering processes are conducted under the conditions of a background pressure of not higher than $1 \times 10^{-7}$ Torr, an Ar pressure of 10 mTorr, and a high frequency power of 200 W.

Thereafter, a pure oxygen is introduced into a sputter chamber of the radio frequency magnetron sputtering system so as to keep an oxygen pressure in the range of 200 Torr for 10 minutes whereby the surface of the first Fe ferromagnetic layer 33 is subjected to the pure oxygen gas for causing a natural oxidation of the first Fe ferromagnetic layer 33 except for a lower region thereof. As a result, an FeOx layer 71 is formed over the remaining first Fe ferromagnetic layer 33.

Figure 27B:
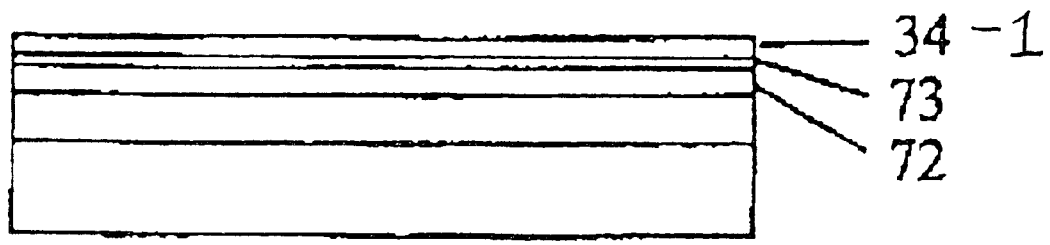
Figure 27C:
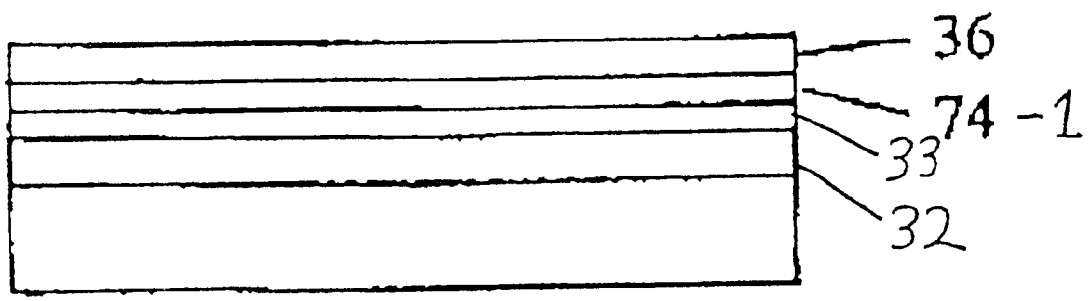

With reference to FIG. 27B, the oxygen is discharged to reduce the pressure into the above background pressure before a Mg conductive layer 34-1 having a thickness of 2 nanometers is deposited on the FeOx layer 71 by a sputtering method, whereby oxygen atoms are naturally diffused from the FeOx layer 71 to a lower region of the Mg conductive layer 34-1. As a result, the FeOx layer 71 is exactly reduced into a reduction upper region 72 of the first Fe ferromagnetic layer 33, whilst a lower region of the Mg conductive layer 34-1 is oxidized by the natural diffusion of oxygen atoms and made into an oxide layer 73 under the Mg conductive layer 34-1.

With reference to FIG. 27C, a pure oxygen is again introduced into the sputter chamber of the radio frequency magnetron sputtering system so as to keep an oxygen pressure in the range of 200 Torr for 10 minutes for 10 minutes whereby the surface of the Mg conductive layer 341 is subjected to the pure oxygen gas for causing a natural oxidation of an entire region of the remaining Mg conductive layer 34-1. As a result, an oxide tunnel barrier layer 74-1 is formed over the reduction upper region 72 of the first Fe ferromagnetic layer 33. The oxygen gas is again discharged before a second CoFe ferromagnetic layer 36 having a thickness of 20 nanometers is deposited by a sputtering method onto a surface of the oxide tunnel barrier layer 74-1 thereby to form a multi-layer structure over the silicon substrate 31, wherein the multi-layer structure comprises laminations of the first Al interconnection layer 32, the first Fe ferromagnetic layer 33, the oxide tunnel barrier layer 74-1 and the second CoFe ferromagnetic layer 36.

Figure 27D:
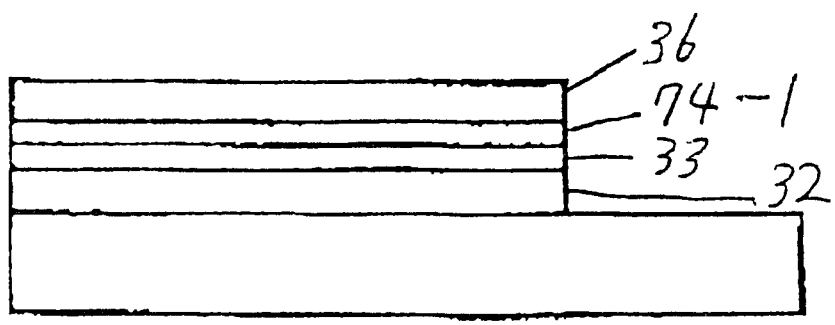

With reference to FIG. 27D, the multi-layer structure is patterned in the form of a bottom interconnection by the normal techniques of a photo-lithography and a subsequent ion-milling.

Figure 27E:
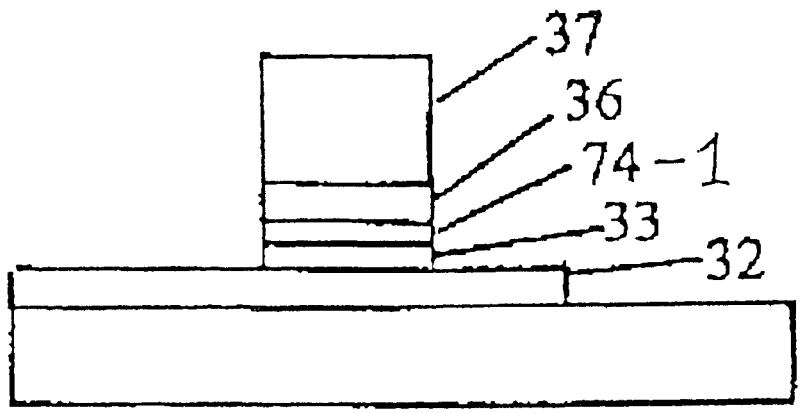

With reference to FIG. 27E, a resist pattern 37 for defining a junction dimension or size is formed on the patterned multi-layer structure so that an ion-milling is carried out using the resist pattern 37 as a mask to selectively remove the multi-layer structure except for the first Al interconnection layer 32.

Figure 27F:
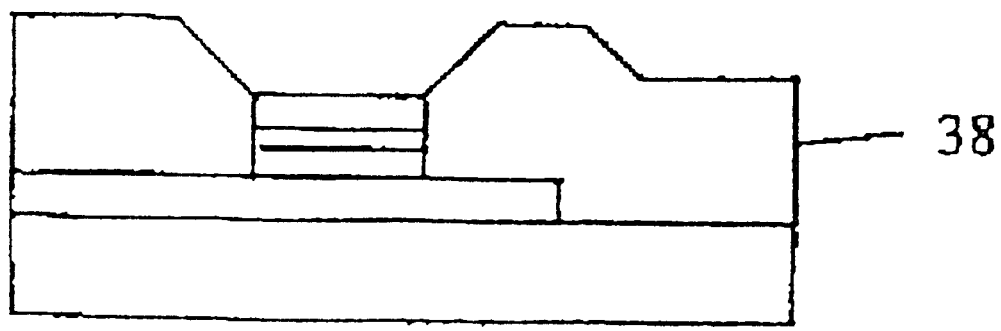

With reference to FIG. 27F, the resist pattern 37 remains on the remaining multi-layer structure whilst an alumina insulating film 38 is entirely deposited by an electron beam evaporation over the first Al interconnection layer 32, the resist pattern 37 and the silicon substrate 31. A lift-off process of the resist pattern 37 is carried out to remove not only the resist pattern 37 but also the alumina insulating film 38 but only over the resist pattern 37.

Figure 27G:
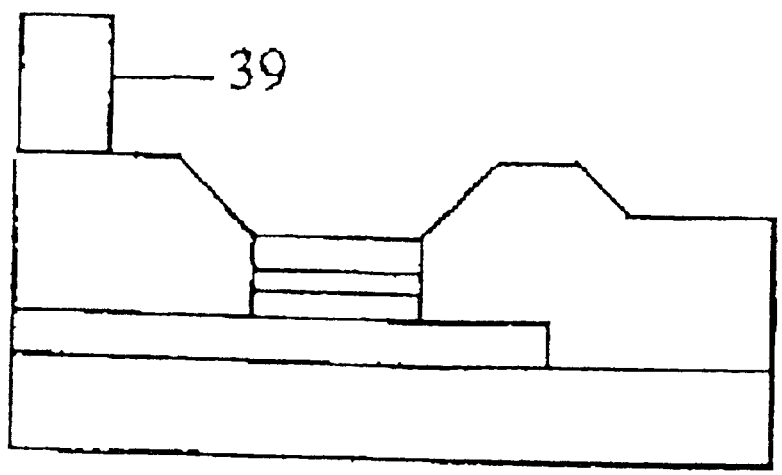

With reference to FIG. 27G, a resist pattern 39 is selectively formed on the remaining alumina insulating film 38.

Figure 27H:
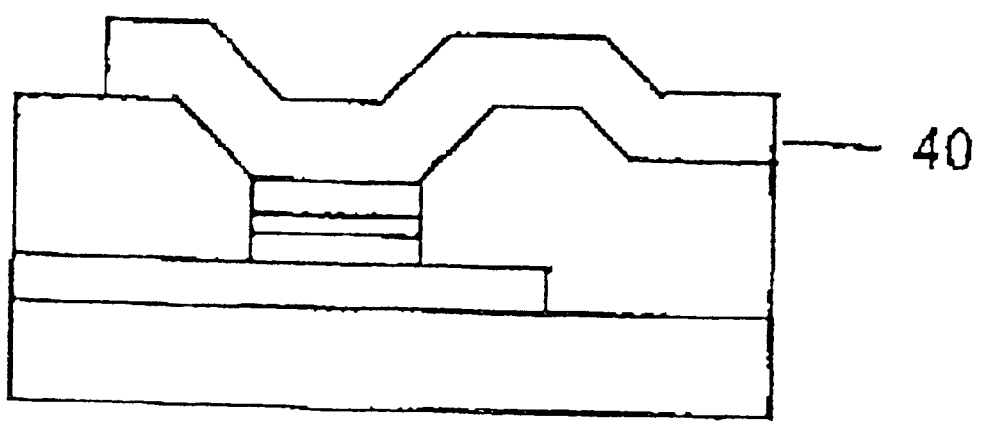

With reference to FIG. 27H, a surface of the second CoFe ferromagnetic layer 36 is subjected to a reverse sputter cleaning wherein the surface of the second CoFe ferromagnetic layer 36 is sputtered. Subsequently, a second Al interconnection layer 40 having a thickness of 200 nanometers is entirely deposited so that the second Al interconnection layer 40 extends over the resist pattern 39, the alumina insulating film 38 and the surface of the second CoFe ferromagnetic layer 36. A lift-off process of the resist pattern 39 is carried out to remove not only the resist pattern 39 but also the second Al interconnection layer 40 but only over the resist pattern 39, thereby to form a top Al interconnection 40 is formed. As a result, the ferromagnetic tunnel junction device is formed over the silicon substrate 31.

An obtained rate of variation in magnetoresistance of the novel ferromagnetic tunnel junction device is about 9%. If the junction area of the novel ferromagnetic tunnel junction device is varied in the range of from $2\times2\,\mu m^2$ to $40\times40\,\mu m^2$, then the rate of variation in magnetoresistance of the novel ferromagnetic tunnel junction device almost remains unchanged at about 9%.

The resistance normalized with the junction area was $6\times10^{-5}$ $\Omega cm^2$ if the oxygen pressure in oxidation of the Mg layer for forming the tunnel barrier layer is reduced to 20 Torr. If the oxygen pressure in oxidation of the Mg layer for forming the tunnel barrier layer is reduced to 20 mtorr, then the resistance of the ferromagnetic tunnel junction device is also dropped by at least one digit. The obtained minimum resistance of the ferromagnetic tunnel junction device is much smaller than the conventional ferromagnetic tunnel junction device by two or three digits.

In the extent of the current density of not higher than $1.5\times10^3$ $A/m^2$, both the rate of variation of the magnetoresistance and the resistance thereof remain unchanged. The signal output voltage level is estimated to be about 8.1 mV under the above conditions.

Sixth Embodiment

A sixth embodiment according to the present invention will be described in detail with reference to FIGS. 28A through 28H which are fragmentary cross sectional elevation views illustrative of novel ferromagnetic tunnel junction devices in sequential steps involved in a novel fabrication method in a sixth embodiment in accordance with the present invention.

Figure 28A:
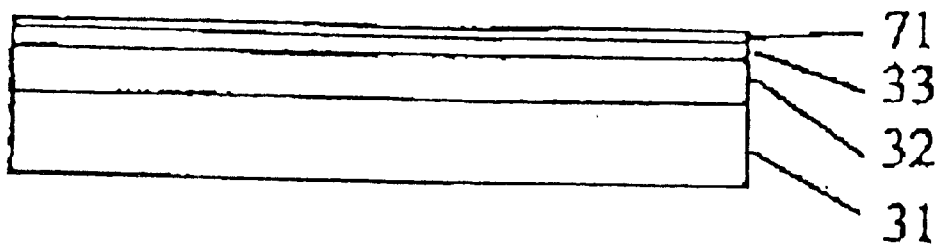
FIGS. 28A through 28H are fragmentary cross sectional elevation views illustrative of novel ferromagnetic tunnel junction devices in sequential steps involved in a novel fabrication method in a sixth embodiment in accordance with the present invention.

With reference to FIG. 28A, a silicon substrate 31 is prepared for forming a ferromagnetic tunnel junction device thereon. A surface of the silicon substrate 31 is subjected to a thermal oxidation to form an oxide surface which is not illustrated. A first Al interconnection layer 32 having a thickness of 50 nanometers is deposited by a sputtering method on the oxide surface of the silicon substrate 31. Subsequently, a first Fe ferromagnetic layer 33 having a thickness of 10 nanometers is further deposited by a sputtering method on the first Al interconnection layer 32. Those sequential sputtering processes are conducted using a radio frequency magnetron sputtering system provided with four targets of 4 inches in diameter. Further, those sequential sputtering processes are conducted under the conditions of a background pressure of not higher than $1\times10^{-7}$ Torr, an Ar pressure of 10 mTorr, and a high frequency power of 200 W.

Thereafter, a pure oxygen is introduced into a sputter chamber of the radio frequency magnetron sputtering system so as to keep an oxygen pressure in the range of 200 Torr for 10 minutes whereby the surface of the first Fe ferromagnetic layer 33 is subjected to the pure oxygen gas for causing a natural oxidation of the first Fe ferromagnetic layer 33 except for a lower region thereof. As a result, an FeOx layer 71 is formed over the remaining first Fe ferromagnetic layer 33.

Figure 28B:
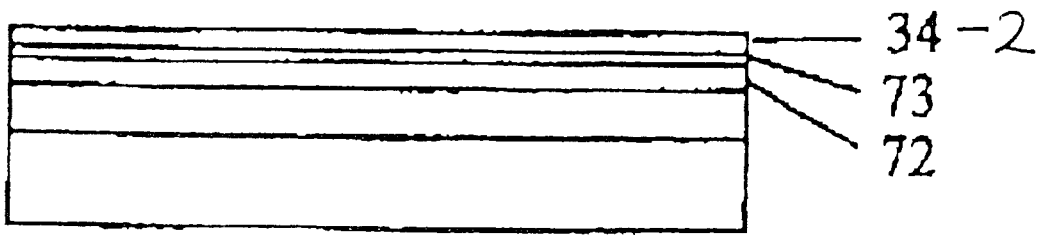
Figure 28C:
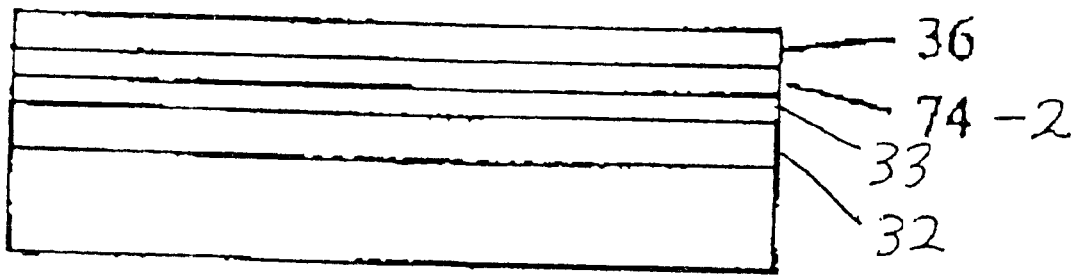

With reference to FIG. 28B, the oxygen is discharged to reduce the pressure into the above background pressure before a La conductive layer 34-2 having a thickness of 2 nanometers is deposited on the FeOx layer 71 by a sputtering method, whereby oxygen atoms are naturally diffused from the FeOx layer 71 to a lower region of the La conductive layer 34-2. As a result, the FeOx layer 71 is exactly reduced into a reduction upper region 72 of the first Fe ferromagnetic layer 33, whilst a lower region of the La conductive layer 34-2 is oxidized by the natural diffusion of oxygen atoms and made into an oxide layer 73 under the La conductive layer 34-2.

With reference to FIG. 28C, a pure oxygen is again introduced into the sputter chamber of the radio frequency magnetron sputtering system so as to keep an oxygen pressure in the range of 200 Torr for 10 minutes for 10 minutes whereby the surface of the La conductive layer 342 is subjected to the pure oxygen gas for causing a natural oxidation of an entire region of the remaining La conductive layer 34-2. As a result, an oxide tunnel barrier layer 74-2 is formed over the reduction upper region 72 of the first Fe ferromagnetic layer 33. The oxygen gas is again discharged before a second CoFe ferromagnetic layer 36 having a thickness of 20 nanometers is deposited by a sputtering method onto a surface of the oxide tunnel barrier layer 74-2 thereby to form a multi-layer structure over the silicon substrate 31, wherein the multi-layer structure comprises laminations of the first Al interconnection layer 32, the first Fe ferromagnetic layer 33, the oxide tunnel barrier layer 74-2 and the second CoFe ferromagnetic layer 36.

Figure 28D:
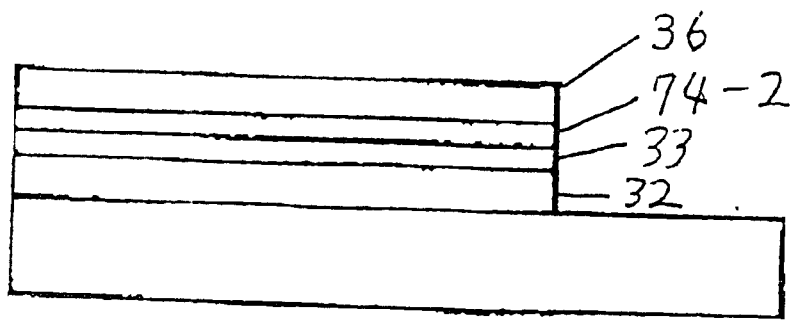

With reference to FIG. 28D, the multi-layer structure is patterned in the form of a bottom interconnection by the normal techniques of a photo-lithography and a subsequent ion-milling.

Figure 28E:
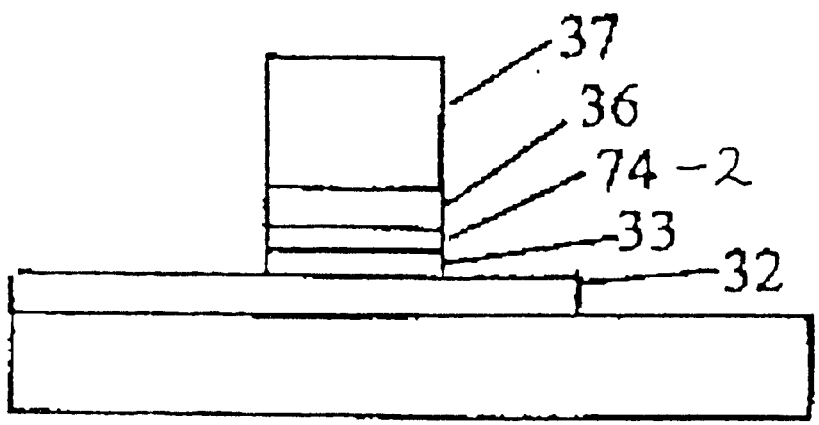

With reference to FIG. 28E, a resist pattern 37 for defining a junction dimension or size is formed on the patterned multi-layer structure so that an ion-milling is carried out using the resist pattern 37 as a mask to selectively remove the multi-layer structure except for the first Al interconnection layer 32.

Figure 28F:
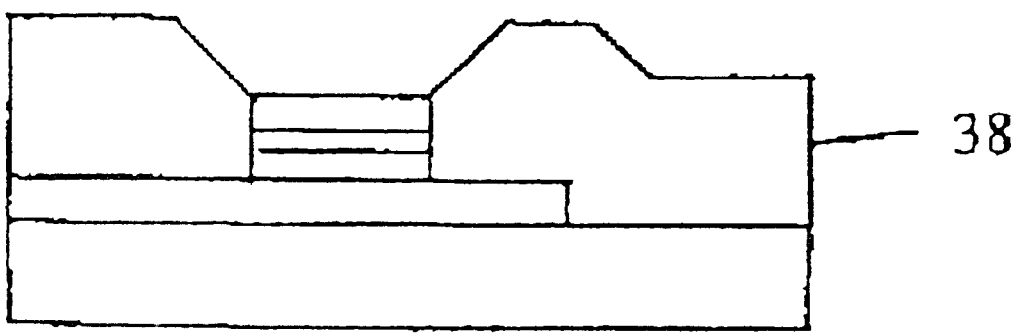

With reference to FIG. 28F, the resist pattern 37 remains on the remaining multi-layer structure whilst an alumina insulating film 38 is entirely deposited by an electron beam evaporation over the first Al interconnection layer 32, the resist pattern 37 and the silicon substrate 31. A lift-off process of the resist pattern 37 is carried out to remove not only the resist pattern 37 but also the alumina insulating film 38 but only over the resist pattern 37.

Figure 28G:
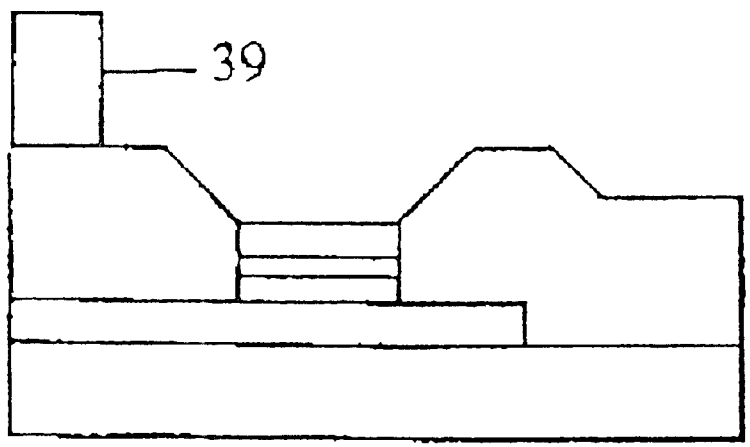

With reference to FIG. 28G, a resist pattern 39 is selectively formed on the remaining alumina insulating film 38.

Figure 28H:
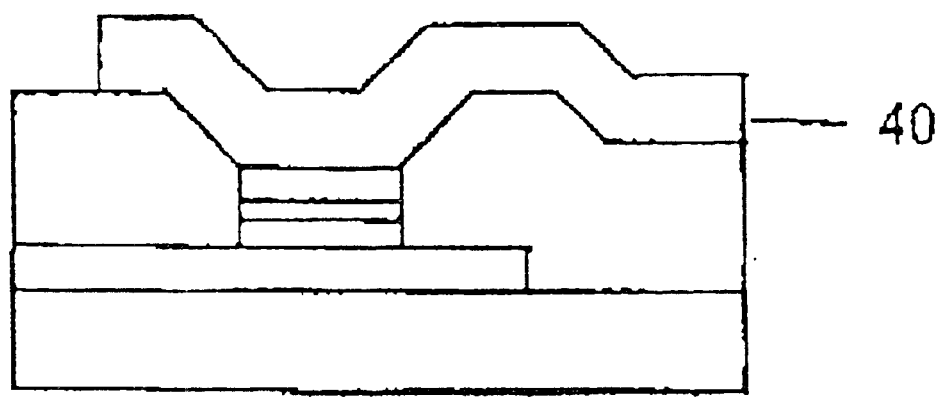

With reference to FIG. 28H, a surface of the second CoFe ferromagnetic layer 36 is subjected to a reverse sputter cleaning wherein the surface of the second CoFe ferromagnetic layer 36 is sputtered. Subsequently, a second Al interconnection layer 40 having a thickness of 200 nanometers is entirely deposited so that the second Al interconnection layer 40 extends over the resist pattern 39, the alumina insulating film 38 and the surface of the second CoFe ferromagnetic layer 36. A lift-off process of the resist pattern 39 is carried out to remove not only the resist pattern 39 but also the second Al interconnection layer 40 but only over the resist pattern 39, thereby to form a top Al interconnection 40 is formed. As a result, the ferromagnetic tunnel junction device is formed over the silicon substrate 31.

An obtained rate of variation in magnetoresistance of the novel ferromagnetic tunnel junction device is about 12%. If the junction area of the novel ferromagnetic tunnel junction device is varied in the range of from $2\times2\,\mu m^2$ to $40\times40\,\mu m^2$, then the rate of variation in magnetoresistance of the novel ferromagnetic tunnel junction device almost remains unchanged at about 12%.

The resistance normalized with the junction area was $4\times10^{-5}$ $\Omega cm^2$ if the oxygen pressure in oxidation of the La layer for forming the tunnel barrier layer is reduced to 20 Torr. If the oxygen pressure in oxidation of the La layer for forming the tunnel barrier layer is reduced to 20 mTorr, then the resistance of the ferromagnetic tunnel junction device is also dropped by at least one digit. The obtained minimum resistance of the ferromagnetic tunnel junction device is much smaller than the conventional ferromagnetic tunnel junction device by two or three digits.

In the extent of the current density of not higher than $1.5 \times 10^3$ A/m$^2$, both the rate of variation of the magnetoresistance and the resistance thereof remain unchanged. The signal output voltage level is estimated to be about 7.2 mV under the above conditions.

As a modification to the above sixth embodiment, other lanthanoids such as Nd, Sm and Lu are also available for the electrically conductive layer sandwiched between the first and second ferromagnetic layers.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. An intermediate layer sandwiched between first and second ferromagnetic layers, said intermediate layer having at least a single oxide layered region forming at least a single tunnel barrier, said at least single oxide layered region which has at least a first abrupt interface with said first ferromagnetic layer and a second abrupt interface with said second ferromagnetic layer,
   wherein each of said first and second interfaces has such an extremely high abruptness as a monoatomic layer level that a width of a boundary area between an oxygen atom containing region and an oxygen atom free region is substantially the same as a boundary between adjacent two monoatomic layers.

2. The intermediate layer as claimed in claim 1, wherein said intermediate layer is entirely occupied by a single oxide layered region which forms a single tunnel barrier having the same width as said intermediate layer.

3. The intermediate layer as claimed in claim 1, wherein said intermediate layer comprises:
   an electrically conductive layered region; and
   first and second oxide layered regions sandwiching said electrically conductive layered region so that said first and second oxide layered regions have said first and second abrupt interfaces with said first and second ferromagnetic layers respectively, thereby to form double tunnel barriers and a single potential well defined between said double tunnel barriers.

4. The intermediate layer as claimed in claim 3, wherein said double tunnel barriers and said single potential well have such widths and heights as to allow electrons to exhibit resonant tunneling.

5. The intermediate layer as claimed in claim 1, wherein said intermediate layer comprises:
   first and second oxide layered regions so that said first and second oxide layered regions have said first and second abrupt interfaces with said first and second ferromagnetic layers respectively;
   alternating laminations of at least a third oxide layered region and at least two electrically conductive layered regions separated from each other by said at least third oxide layered region and sandwiched between said first and second oxide layered regions, thereby to form multiple tunnel barriers and multiple potential well defined between said double tunnel barriers.

6. The intermediate layer as claimed in claim 5, wherein said multiple tunnel barriers and said multiple potential well have such widths and heights as to allow electrons to exhibit resonant tunneling.

7. The intermediate layer as claimed in claim 1, wherein said intermediate layer has a larger formation free-energy per a single oxygen atom than a formation free energy of each of said first and second ferromagnetic layers so that oxygen atoms are thermally more stable in said intermediate than in said first and second ferromagnetic layers.

8. The intermediate layer as claimed in claim 7, wherein said intermediate layer has a smaller surface free energy than a surface free energy of each of said first and second ferromagnetic layers.

9. The intermediate layer as claimed in claim 8, wherein said intermediate layer is free of any pin holes.

10. The intermediate layer as claimed in claim 8, wherein a base material of said intermediate layer comprises a semiconductor.

11. The intermediate layer as claimed in claim 8, wherein a base material of said intermediate layer comprises a metal.

12. The intermediate layer as claimed in claim 11, wherein said intermediate layer includes at least one of Al, Mg and lanthanoids and said first and second ferromagnetic layers include at least one of Fe, Co, Ni and alloys thereof.

13. A multi-layer structure in a ferromagnetic tunnel junction device, said multi-layer structure comprising:
   first and second ferromagnetic layers; and
   an intermediate layer sandwiched between said first and second ferromagnetic layers, said intermediate layer comprising an oxide layer which forms a single tunnel barrier, said oxide layer having a first abrupt interface with said first ferromagnetic layer and a second abrupt interface with said second ferromagnetic layer,
   wherein each of said first and second interfaces has such an extremely high abruptness as a monoatomic layer level that a width of a boundary area between an oxygen atom containing region and an oxygen atom free region is substantially the same as a boundary between adjacent two monoatomic layers.

14. The multi-layer structure as claimed in claim 13, wherein said intermediate layer has a larger formation free-energy per a single oxygen atom than a formation free energy of each of said first and second ferromagnetic layers so that oxygen atoms are thermally more stable in said intermediate layer than in said first and second ferromagnetic layers.

15. The multi-layer structure as claimed in claim 14, wherein said intermediate layer has a smaller surface free energy than a surface free energy of each of said first and second ferromagnetic layers.

16. The multi-layer structure as claimed in claim 15, wherein said intermediate layer is free of any pin holes.

17. The multi-layer structure as claimed in claim 15, wherein said intermediate layer comprises a semiconductor oxide layer.

18. The multi-layer structure as claimed in claim 15, wherein said intermediate layer comprises a metal oxide layer.

19. The multi-layer structure as claimed in claim 18, wherein said intermediate layer includes at least one of Al, Mg and lanthanoids and said first and second ferromagnetic layers include at least one of Fe, Co, Ni and alloys thereof.

20. A multi-layer structure in a ferromagnetic tunnel junction device, said multi-layer structure comprising:

first and second ferromagnetic layers; and an intermediate layer sandwiched between said first and second ferromagnetic layers, said intermediate layer comprising an electrically conductive intermediate layered region and first and second oxide layered regions sandwiching said electrically conductive intermediate layered region so that said first and second oxide layered regions form double tunnel barriers and said electrically conductive intermediate layered region forms a single potential well defined between said double tunnel barriers, said first oxide layered region having a first abrupt interface with said first ferromagnetic layer and said second oxide region having a second abrupt interface with said second ferromagnetic layer, wherein each of said first and second interfaces has such an extremely high abruptness as a monoatomic layer level that a width of a boundary area between an oxygen atom containing region and an oxygen atom free region is substantially the same as a boundary between adjacent two monoatomic layers.

21. The multi-layer structure as claimed in claim 20, wherein said intermediate layer has a larger formation free-energy per a single oxygen atom than a formation free energy of each of said first and second ferromagnetic layers so that oxygen atoms are thermally more stable in said intermediate layer than in said first and second ferromagnetic layers.

22. The multi-layer structure as claimed in claim 21, wherein said intermediate layer has a smaller surface free energy than a surface free energy of each of said first and second ferromagnetic layers.

23. The multi-layer structure as claimed in claim 22, wherein said intermediate layer is free of any pin holes.

24. The multi-layer structure as claimed in claim 22, wherein said intermediate layer comprises a semiconductor oxide layer.

25. The multi-layer structure as claimed in claim 22, wherein said intermediate layer comprises a metal oxide layer.

26. The intermediate layer as claimed in claim 25, wherein said intermediate layer includes at least one of Al, Mg and lanthanoids and said first and second ferromagnetic layers include at least one of Fe, Co, Ni and alloys thereof.

27. The intermediate layer as claimed in claim 20, further comprising at least a third oxide layered region which isolates said electrically conductive intermediate layered region into at least two subordinate electrically conductive layered regions.

* * * * *